(12) United States Patent
Sander et al.

(10) Patent No.: US 9,033,815 B2
(45) Date of Patent: May 19, 2015

(54) ADJUSTABLE GOLF CLUB AND SYSTEM AND ASSOCIATED GOLF CLUB HEADS AND SHAFTS

(71) Applicant: NIKE, Inc., Beaverton, OR (US)

(72) Inventors: Raymond J. Sander, Benbrook, TX (US); Joshua M. Boggs, Aledo, TX (US); Matthew P. Rubal, Columbus, OH (US)

(73) Assignee: Nike, Inc., Beaverton, OR (US)

( * ) Notice: Subject to any disclaimer, the term of this patent is extended or adjusted under 35 U.S.C. 154(b) by 2 days.

(21) Appl. No.: 13/665,813

(22) Filed: Oct. 31, 2012

(65) Prior Publication Data

US 2013/0324327 A1 Dec. 5, 2013

Related U.S. Application Data

(60) Provisional application No. 61/654,070, filed on May 31, 2012.

(51) Int. Cl.
*A63B 53/06* (2006.01)
*G06F 17/50* (2006.01)
(Continued)

(52) U.S. Cl.
CPC ........... *G06F 17/50* (2013.01); *Y10T 29/49826* (2015.01); *A63B 2053/022* (2013.01); *A63B 2053/026* (2013.01); *A63B 2053/025* (2013.01); *G06Q 30/02* (2013.01); *A63B 53/02* (2013.01); *A63B 53/06* (2013.01); *A63B 2053/023* (2013.01); *A63B 53/0466* (2013.01); *A63B 53/047* (2013.01)

(58) Field of Classification Search
CPC ................... A63B 2053/025; A63B 2053/026; A63B 2053/023; A63B 253/022; A63B 53/02; A63B 53/06
USPC .......... 473/305–310, 314, 316, 324, 333, 345
See application file for complete search history.

(56) References Cited

U.S. PATENT DOCUMENTS

| 569,438 A | 10/1896 | Urquhart |
| 648,256 A | 4/1900 | Hartley |

(Continued)

OTHER PUBLICATIONS

United States Golf Association; Procedure for Measuring the Flexibility of a Golf Clubhead, USGA-TPX3004; Revision 1.0.0; May 1, 2008; p. 1-11.

(Continued)

*Primary Examiner* — Benjamin Layno
(74) *Attorney, Agent, or Firm* — Banner & Witcoff, Ltd.

(57) ABSTRACT

In general, aspects of this invention relate to golf clubs or golf club components incorporating adjustment members that permit ready adjustability of golf club parameters and/or interchangeability of golf club components to change a golf club configuration, and methods for providing golf clubs. According to aspects of this invention, an adjustment member may be utilized to allow the adjustability of a golf club parameter to change a golf club configuration, while ensuring there is substantially no change to other club or club head variables, parameters or characteristics. According to another aspect of this invention, an adjustment member may be utilized to allow the adjustability of two golf club parameters independently to change a golf club configuration, while ensuring there is substantially no change to other club or club head variables, parameters or characteristics.

18 Claims, 73 Drawing Sheets

(51) Int. Cl.
*G06Q 30/02* (2012.01)
*A63B 53/04* (2006.01)
*A63B 53/02* (2006.01)

(56) References Cited

U.S. PATENT DOCUMENTS

| | | | |
|---|---|---|---|
| 651,920 | A | 6/1900 | Cushing, Jr. |
| 670,522 | A | 3/1901 | Thompson |
| 727,086 | A | 5/1903 | Burnam |
| 1,058,463 | A | 4/1913 | Pringle |
| 1,083,434 | A | 1/1914 | Curry |
| 1,135,621 | A | 4/1915 | Roberts |
| 1,137,457 | A | 4/1915 | Breitenbaugh |
| 1,165,559 | A | 12/1915 | Vories |
| 1,190,589 | A | 7/1916 | Rolfe |
| 1,206,104 | A | 11/1916 | Goodrich |
| 1,206,105 | A | 11/1916 | Goodrich |
| 1,219,417 | A | 3/1917 | Vories |
| 1,235,922 | A | 8/1917 | Pittar |
| 1,250,301 | A | 12/1917 | Goodrich |
| 1,258,212 | A | 3/1918 | Goodrich |
| 1,429,569 | A | 9/1922 | Craig |
| 1,529,959 | A | 3/1925 | Martin |
| 1,549,265 | A | 8/1925 | Kaden |
| 1,556,928 | A | 10/1925 | Ganders |
| 1,568,485 | A | 1/1926 | Turney |
| 1,594,850 | A | 8/1926 | Perkins |
| 1,605,140 | A | 11/1926 | Perkins |
| 1,620,588 | A | 3/1927 | Wilson |
| 1,644,177 | A | 10/1927 | Collins |
| 1,676,518 | A | 7/1928 | Boles |
| 1,697,846 | A | 1/1929 | Anderson |
| 1,697,998 | A | 1/1929 | Novak et al. |
| 1,818,359 | A | 8/1931 | Samaras et al. |
| 1,974,224 | A | 9/1934 | Van Der Linden |
| 1,993,928 | A | 3/1935 | Glover |
| 2,179,034 | A | 11/1939 | Duncan, Jr. |
| 2,217,338 | A | 10/1940 | Fuller |
| 2,242,670 | A | 5/1941 | Fuller |
| 2,305,270 | A | 12/1942 | Nilson |
| 2,329,313 | A | 9/1943 | Winter |
| 2,381,636 | A | 8/1945 | Bancroft |
| 2,384,333 | A | 9/1945 | Nilson |
| 2,451,262 | A | 10/1948 | Watkins |
| 2,455,150 | A | 11/1948 | Verderber |
| 2,475,926 | A | 7/1949 | Verderber |
| 2,477,438 | A | 7/1949 | Brouwer |
| 2,495,444 | A | 1/1950 | Chamberlain et al. |
| 2,520,701 | A | 8/1950 | Verderber |
| 2,520,702 | A | 8/1950 | Verderber |
| 2,571,970 | A | 10/1951 | Verderber |
| 2,576,866 | A | 11/1951 | Verderber |
| 2,593,368 | A | 4/1952 | Verderber |
| 2,691,525 | A | 10/1954 | Callaghan, Sr. |
| 2,705,147 | A | 3/1955 | Winter |
| 2,777,694 | A | 1/1957 | Winter |
| 2,847,219 | A | 8/1958 | Shoemaker et al. |
| 2,962,286 | A | 11/1960 | Brouwer |
| 3,305,235 | A | 2/1967 | Williams, Jr. |
| 3,477,720 | A | 11/1969 | Saba |
| 3,601,399 | A | 8/1971 | Agens et al. |
| 3,791,647 | A | 2/1974 | Verderber |
| 3,840,231 | A | 10/1974 | Moore |
| 4,165,874 | A * | 8/1979 | Lezatte et al. ............ 473/291 |
| 4,856,782 | A | 8/1989 | Cannan |
| 4,878,666 | A | 11/1989 | Hosoda |
| 5,133,553 | A | 7/1992 | Divnick |
| 5,228,689 | A | 7/1993 | Donofrio, Sr. |
| 5,385,346 | A | 1/1995 | Carroll et al. |
| 5,393,056 | A | 2/1995 | Richardson |
| 5,413,337 | A | 5/1995 | Goodman et al. |
| 5,538,245 | A | 7/1996 | Moore |
| 5,626,528 | A | 5/1997 | Toulon |
| 5,928,087 | A | 7/1999 | Emberton et al. |
| 6,120,384 | A | 9/2000 | Drake |
| 6,149,533 | A | 11/2000 | Finn |
| 6,206,788 | B1 | 3/2001 | Krenzler |
| 6,348,009 | B1 | 2/2002 | Dischler |
| 6,506,126 | B1 | 1/2003 | Goodman |
| 6,514,154 | B1 | 2/2003 | Finn |
| 6,676,533 | B1 | 1/2004 | Hsien |
| 6,837,800 | B2 | 1/2005 | Rollinson et al. |
| 8,177,661 | B2 | 5/2012 | Beach et al. |
| 2001/0041628 | A1 | 11/2001 | Thorne et al. |
| 2006/0183564 | A1 | 8/2006 | Park |
| 2008/0009360 | A1 | 1/2008 | Purtill |
| 2009/0286611 | A1 * | 11/2009 | Beach et al. ............ 473/246 |
| 2010/0035701 | A1 | 2/2010 | Kusumoto |
| 2010/0197423 | A1 | 8/2010 | Thomas |
| 2011/0098127 | A1 | 4/2011 | Yamamoto |
| 2011/0195798 | A1 | 8/2011 | Sander |
| 2011/0256954 | A1 * | 10/2011 | Soracco ............ 473/328 |
| 2012/0071258 | A1 | 3/2012 | Yamaguchi et al. |
| 2012/0122601 | A1 | 5/2012 | Beach |
| 2012/0165110 | A1 | 6/2012 | Cheng |
| 2012/0165111 | A1 | 6/2012 | Cheng |
| 2012/0302366 | A1 | 11/2012 | Murphy |

OTHER PUBLICATIONS

Notice of Allowance for corresponding U.S. Appl. No. 13/755,274, dated Apr. 15, 2013.
ISR, PCT/US2013/043700, dated Jul. 31, 2013.
Jul. 4, 2014—(WO) ISR—PCT/US2014/025775.

* cited by examiner

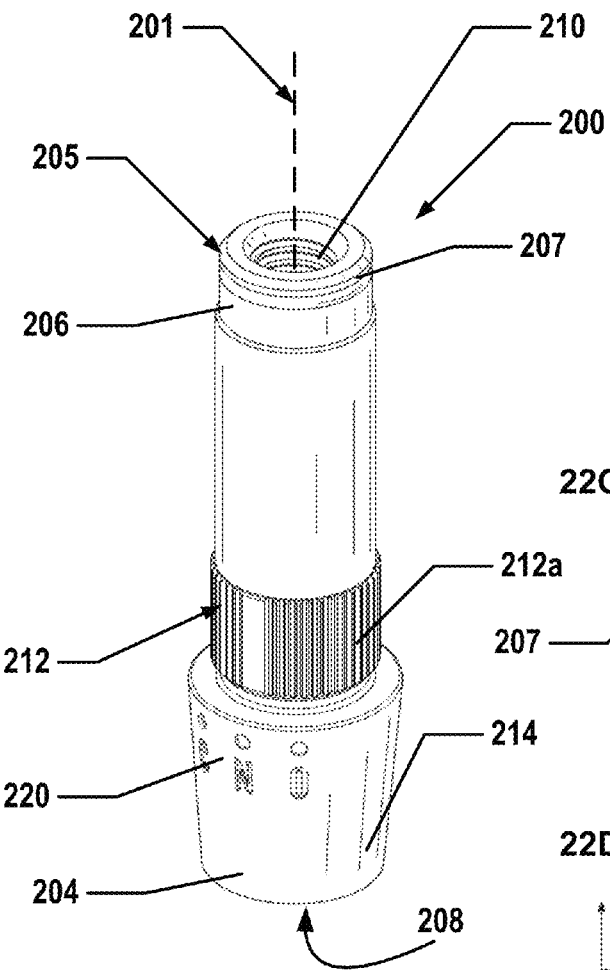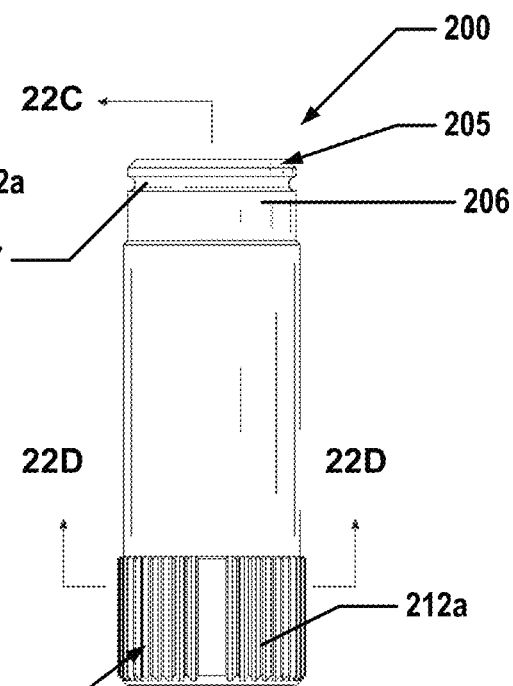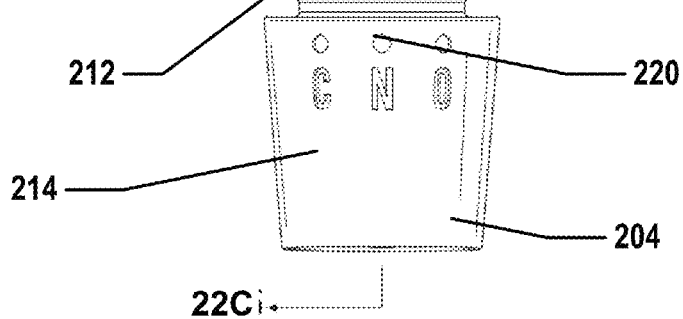
Fig. 22A
Fig. 22B

| Club | Data Type | Club Speed | Attack Angle | Club Path | Vert Swing Plane | Horiz Swing Plane | Dyn Loft | Face Angle |
|---|---|---|---|---|---|---|---|---|
| Neutral Face Angle 8.5 degree Loft Angle | Average | 104.2 | 2.5 | -1.5 | 56.1 | 0.1 | 10.7 | -1.1 |
| | Std. Dev | 0.5 | 1.5 | 1.1 | 0.5 | 0.1 | 0.4 | 0.5 |
| Neutral Face Angle 9.5 degree Loft Angle | Average | 103.9 | 1.1 | -0.3 | 56.1 | -0.1 | 11.0 | -1.1 |
| | Std. Dev | 0.5 | 0.5 | 0.1 | 0.5 | 0.1 | 0.3 | 0.5 |
| Neutral Face Angle 10.5 degree Loft Angle | Average | 104.0 | 0.3 | -0.5 | 56.8 | -0.3 | 12.3 | -1.3 |
| | Std. Dev | 0.5 | 1.2 | 0.5 | 0.7 | 0.1 | 0.3 | 0.5 |
| Neutral Face Angle 11.5 degree Loft Angle | Average | 104.4 | 0.4 | -0.5 | 56.4 | -0.3 | 13.1 | -0.3 |
| | Std. Dev | 0.4 | 1.0 | 0.7 | 0.5 | 0.1 | 0.2 | 0.7 |
| Neutral Face Angle 12.5 degree Loft Angle | Average | 103.4 | -0.8 | 0.8 | 54.1 | -0.6 | 13.6 | -0.3 |
| | Std. Dev | 0.3 | 0.9 | 0.7 | 0.3 | 0.1 | 0.3 | 0.7 |

| Club | Data Type | Ball Speed | Smash Factor | Launch Angle | Horiz Angle | Spin Rate | Spin Axis | Max Height |
|---|---|---|---|---|---|---|---|---|
| Neutral Face Angle 8.5 degree Loft Angle | Average | 155.0 | 1.49 | 9.1 | -1.3 | 2511 | -3.6 | 25.3 |
| | Std. Dev | 0.5 | 0.0 | 0.5 | 0.5 | 130.0 | 3.6 | 1.0 |
| Neutral Face Angle 9.5 degree Loft Angle | Average | 154.5 | 1.49 | 9.8 | -1.3 | 2631 | 1.5 | 28.1 |
| | Std. Dev | 0.4 | 0.0 | 0.4 | 0.4 | 153.3 | 3.5 | 1.5 |
| Neutral Face Angle 10.5 degree Loft Angle | Average | 154.1 | 1.48 | 10.5 | -1.2 | 2718 | 2.3 | 31.1 |
| | Std. Dev | 0.5 | 0.0 | 0.2 | 0.4 | 76.0 | 2.5 | 1.4 |
| Neutral Face Angle 11.5 degree Loft Angle | Average | 153.9 | 1.47 | 11.1 | -0.4 | 2834 | 4.0 | 34.1 |
| | Std. Dev | 0.4 | 0.0 | 0.2 | 0.5 | 107.4 | 1.2 | 2.0 |
| Neutral Face Angle 12.5 degree Loft Angle | Average | 152.8 | 1.48 | 11.5 | -0.3 | 3206 | 8.2 | 36.3 |
| | Std. Dev | 0.4 | 0.0 | 0.3 | 0.5 | 147.9 | 2.5 | 0.6 |

| Club | Data Type | Carry | Carry Side | Lnd Angle | Lnd Speed | Flight Time |
|---|---|---|---|---|---|---|
| Neutral Face Angle 8.5 degree Loft Angle | Average | 241.3 | -12.4 | -36.1 | 60.1 | 6.22 |
| | Std. Dev | 3.7 | 0.4 | 1.1 | 0.9 | 0.2 |
| Neutral Face Angle 9.5 degree Loft Angle | Average | 238.0 | -1.4 | -41.0 | 57.0 | 6.45 |
| | Std. Dev | 4.3 | 5.3 | 1.5 | 2.5 | 0.2 |
| Neutral Face Angle 10.5 degree Loft Angle | Average | 237.4 | -0.5 | -43.5 | 56.1 | 6.71 |
| | Std. Dev | 3.0 | 5.0 | 2.1 | 0.9 | 0.1 |
| Neutral Face Angle 11.5 degree Loft Angle | Average | 235.7 | 3.6 | -45.4 | 56.0 | 6.93 |
| | Std. Dev | 4.3 | 4.3 | 2.1 | 0.9 | 0.1 |
| Neutral Face Angle 12.5 degree Loft Angle | Average | 227.6 | 23.2 | -50.5 | 58.1 | 7.02 |
| | Std. Dev | 5.1 | 0.5 | 3.5 | 3.0 | 0.1 |

C1 Driver

Fig. 35A

| Club | Data Type | Club Speed | Attack Angle | Club Path | Vert Swing Plane | Horiz Swing Plane | Dyn Loft | Face Angle |
|---|---|---|---|---|---|---|---|---|
| Closed Face Angle 8.5 degree Loft Angle | Average | 104.1 | 2.2 | -1.2 | 54.7 | 0.4 | 10.8 | -3.1 |
|  | Std. Dev | 0.6 | 1.2 | 0.5 | 0.9 | 0.2 | 0.2 | 0.6 |
| Closed Face Angle 9.5 degree Loft Angle | Average | 104.0 | 1.5 | -0.3 | 54.8 | 0.2 | 11.0 | -2.3 |
|  | Std. Dev | 0.3 | 0.5 | 0.5 | 0.6 | 0.1 | 0.1 | 0.7 |
| Closed Face Angle 10.5 degree Loft Angle | Average | 104.1 | 0.3 | -0.3 | 55.3 | 0.0 | 12.4 | -2.1 |
|  | Std. Dev | 0.4 | 1.7 | 0.6 | 1.0 | 0.0 | 0.2 | 0.5 |
| Closed Face Angle 11.5 degree Loft Angle | Average | 104.0 | -0.2 | -0.4 | 55.3 | -0.1 | 13.0 | -1.1 |
|  | Std. Dev | 0.1 | 1.1 | 0.5 | 0.5 | 0.1 | 0.2 | 0.3 |
| Closed Face Angle 12.5 degree Loft Angle | Average | 103.9 | 0.1 | -0.4 | 55.4 | -0.3 | 13.5 | -1.3 |
|  | Std. Dev | 0.4 | 0.6 | 0.5 | 0.9 | 0.1 | 0.3 | 0.5 |

| Club | Data Type | Ball Speed | Smash Factor | Launch Angle | Horz Angle | Spin Rate | Spin Axis | Max Height |
|---|---|---|---|---|---|---|---|---|
| Closed Face Angle 8.5 degree Loft Angle | Average | 154.2 | 1.48 | 9.2 | -2.7 | 2436 | -4.2 | 25.3 |
|  | Std. Dev | 0.5 | 0.0 | 0.2 | 0.7 | 59.5 | 3.8 | 0.6 |
| Closed Face Angle 9.5 degree Loft Angle | Average | 154.2 | 1.48 | 9.9 | -2.2 | 2657 | -2.6 | 28.1 |
|  | Std. Dev | 0.5 | 0.0 | 0.1 | 0.5 | 245.2 | 3.0 | 0.8 |
| Closed Face Angle 10.5 degree Loft Angle | Average | 153.8 | 1.48 | 10.3 | -1.9 | 2897 | -1.5 | 32.3 |
|  | Std. Dev | 0.5 | 0.0 | 0.5 | 0.5 | 107.9 | 2.2 | 0.9 |
| Closed Face Angle 11.5 degree Loft Angle | Average | 153.3 | 1.47 | 11.0 | -1.7 | 3601 | 0.2 | 33.3 |
|  | Std. Dev | 0.5 | 0.0 | 0.2 | 0.5 | 75.2 | 1.5 | 1.4 |
| Closed Face Angle 12.5 degree Loft Angle | Average | 152.8 | 1.47 | 11.4 | -1.7 | 3868 | 2.1 | 37.3 |
|  | Std. Dev | 0.6 | 0.0 | 0.3 | 0.5 | 142.0 | 2.3 | 1.2 |

| Club | Data Type | Carry | Carry Side | Lnd Angle | Lnd Speed | Flight Time |
|---|---|---|---|---|---|---|
| Closed Face Angle 8.5 degree Loft Angle | Average | 241.9 | -20.6 | -35.7 | 60.2 | 6.18 |
|  | Std. Dev | 2.5 | 5.5 | 1.1 | 2.1 | 0.1 |
| Closed Face Angle 9.5 degree Loft Angle | Average | 240.5 | -14.7 | -39.4 | 57.7 | 6.45 |
|  | Std. Dev | 4.3 | 5.4 | 1.4 | 2.6 | 0.1 |
| Closed Face Angle 10.5 degree Loft Angle | Average | 238.4 | -11.0 | -43.8 | 57.4 | 6.75 |
|  | Std. Dev | 4.7 | 5.1 | 2.2 | 2.4 | 0.1 |
| Closed Face Angle 11.5 degree Loft Angle | Average | 241.2 | -3.3 | -43.8 | 58.3 | 6.88 |
|  | Std. Dev | 3.1 | 4.5 | 1.5 | 1.9 | 0.1 |
| Closed Face Angle 12.5 degree Loft Angle | Average | 234.1 | -0.2 | -49.5 | 57.3 | 7.14 |
|  | Std. Dev | 2.3 | 4.0 | 2.3 | 1.9 | 0.1 |

C1 Driver

Fig. 35B

| Club | Data Type | Club Speed | Attack Angle | Club Path | Vert Swing Plane | Horiz Swing Plane | Dyn. Loft | Face Angle |
|---|---|---|---|---|---|---|---|---|
| Open Face Angle 8.5 degree Loft Angle | Average | 103.7 | 0.9 | -1.0 | 54.8 | -0.3 | 11.5 | -0.3 |
|  | Std. Dev | 0.5 | 1.2 | 0.5 | 0.5 | 0.1 | 0.1 | 0.7 |
| Open Face Angle 9.5 degree Loft Angle | Average | 103.7 | 1.0 | -1.1 | 54.5 | -0.4 | 11.9 | -0.7 |
|  | Std. Dev | 0.9 | 0.5 | 0.5 | 0.5 | 0.2 | 0.2 | 0.4 |
| Open Face Angle 10.5 degree Loft Angle | Average | 103.3 | 1.0 | -1.1 | 55.0 | -0.4 | 12.7 | -0.5 |
|  | Std. Dev | 0.3 | 0.7 | 0.5 | 0.2 | 0.2 | 0.2 | 0.5 |
| Open Face Angle 11.5 degree Loft Angle | Average | 102.9 | 0.6 | -1.1 | 54.3 | -0.6 | 13.0 | 0.1 |
|  | Std. Dev | 0.5 | 0.5 | 0.2 | 0.7 | 0.1 | 0.3 | 0.5 |
| Open Face Angle 12.5 degree Loft Angle | Average | 103.4 | 0.4 | -1.1 | 54.6 | -0.8 | 13.6 | 0.3 |
|  | Std. Dev | 0.9 | 0.3 | 0.1 | 0.5 | 0.2 | 0.3 | 0.4 |

| Club | Data Type | Ball Speed | Smash Factor | Launch Angle | Horz Angle | Spin Rate | Spin Axis | Max Height |
|---|---|---|---|---|---|---|---|---|
| Open Face Angle 8.5 degree Loft Angle | Average | 154.1 | 1.49 | 10.0 | -0.9 | 2349 | 4.7 | 24.5 |
|  | Std. Dev | 0.4 | 0.0 | 0.1 | 0.5 | 139.7 | 1.6 | 0.7 |
| Open Face Angle 9.5 degree Loft Angle | Average | 153.5 | 1.48 | 10.2 | -0.8 | 2641 | 7.1 | 27.3 |
|  | Std. Dev | 0.2 | 0.0 | 0.2 | 0.2 | 94.4 | 2.9 | 0.5 |
| Open Face Angle 10.5 degree Loft Angle | Average | 153.5 | 1.49 | 10.3 | -0.7 | 2899 | 7.3 | 29.3 |
|  | Std. Dev | 0.4 | 0.0 | 0.2 | 0.4 | 105.0 | 2.1 | 1.1 |
| Open Face Angle 11.5 degree Loft Angle | Average | 152.9 | 1.49 | 11.0 | -0.2 | 2977 | 7.5 | 31.5 |
|  | Std. Dev | 0.4 | 0.0 | 0.1 | 0.4 | 126.6 | 2.1 | 1.2 |
| Open Face Angle 12.5 degree Loft Angle | Average | 152.8 | 1.48 | 11.5 | 0.1 | 3249 | 7.5 | 35.3 |
|  | Std. Dev | 0.4 | 0.0 | 0.4 | 0.4 | 125.8 | 2.0 | 1.0 |

| Club | Data Type | Carry | Carry Side | Lnd. Angle | Lnd. Speed | Flight Time |
|---|---|---|---|---|---|---|
| Open Face Angle 8.5 degree Loft Angle | Average | 241.9 | 8.0 | -33.9 | 62.2 | 6.01 |
|  | Std. Dev | 1.5 | 4.3 | 0.5 | 0.5 | 0.1 |
| Open Face Angle 9.5 degree Loft Angle | Average | 241.8 | 17.8 | -37.8 | 60.7 | 6.35 |
|  | Std. Dev | 3.3 | 7.1 | 0.5 | 1.0 | 0.1 |
| Open Face Angle 10.5 degree Loft Angle | Average | 241.8 | 17.9 | -40.2 | 59.1 | 6.55 |
|  | Std. Dev | 2.0 | 5.1 | 1.5 | 1.4 | 0.2 |
| Open Face Angle 11.5 degree Loft Angle | Average | 244.1 | 21.1 | -41.1 | 59.1 | 6.86 |
|  | Std. Dev | 1.4 | 5.5 | 1.5 | 1.4 | 0.2 |
| Open Face Angle 12.5 degree Loft Angle | Average | 237.9 | 24.0 | -45.8 | 58.9 | 6.89 |
|  | Std. Dev | 3.0 | 6.2 | 0.9 | 1.5 | 0.0 |

<u>C1 Driver</u>

Fig. 35C

| Club | Data Type | Club Speed | Attack Angle | Club Path | Vert Swing Plane | Horiz Swing Plane | Dyn Loft | Face Angle |
|---|---|---|---|---|---|---|---|---|
| Neutral Face Angle 8.5 degree Loft Angle | Average | 89.0 | 1.4 | -0.3 | 58.0 | -0.1 | 12.5 | -1.3 |
| | Std. Dev | 0.2 | 0.4 | 0.5 | 1.0 | 0.3 | 0.3 | 0.6 |
| Neutral Face Angle 9.5 degree Loft Angle | Average | 88.5 | 1.1 | -0.3 | 58.0 | -0.1 | 13.1 | -1.4 |
| | Std. Dev | 0.3 | 0.3 | 0.5 | 1.4 | 0.4 | 0.4 | 0.4 |
| Neutral Face Angle 10.5 degree Loft Angle | Average | 88.4 | 0.7 | -0.5 | 58.0 | -0.1 | 14.0 | -1.2 |
| | Std. Dev | 0.1 | 0.3 | 0.2 | 0.4 | 0.2 | 0.3 | 0.3 |
| Neutral Face Angle 11.5 degree Loft Angle | Average | 88.5 | 0.6 | -0.4 | 57.4 | 0.1 | 14.7 | -0.3 |
| | Std. Dev | 0.4 | 0.4 | 0.2 | 0.5 | 0.2 | 0.3 | 0.4 |
| Neutral Face Angle 12.5 degree Loft Angle | Average | 88.0 | 0.2 | -0.2 | 56.7 | -0.1 | 15.3 | -0.2 |
| | Std. Dev | 0.5 | 0.2 | 0.3 | 1.0 | 0.4 | 0.3 | 0.5 |

| Club | Data Type | Ball Speed | Smash Factor | Launch Angle | Horz Angle | Spin Rate | Spin Axis | Max Height |
|---|---|---|---|---|---|---|---|---|
| Neutral Face Angle 8.5 degree Loft Angle | Average | 133.0 | 1.50 | 10.7 | -1.0 | 2480 | 0.3 | 16.2 |
| | Std. Dev | 0.3 | 0.0 | 0.4 | 0.5 | 101.9 | 2.0 | 1.2 |
| Neutral Face Angle 9.5 degree Loft Angle | Average | 132.1 | 1.50 | 11.0 | -1.2 | 2622 | 0.9 | 17.3 |
| | Std. Dev | 0.7 | 0.0 | 0.4 | 0.5 | 142.0 | 3.0 | 1.1 |
| Neutral Face Angle 10.5 degree Loft Angle | Average | 132.0 | 1.49 | 12.0 | -1.1 | 2669 | 4.1 | 19.3 |
| | Std. Dev | 0.2 | 0.0 | 0.4 | 0.6 | 125.8 | 2.0 | 0.6 |
| Neutral Face Angle 11.5 degree Loft Angle | Average | 131.3 | 1.49 | 12.5 | -0.6 | 2874 | 4.5 | 21.3 |
| | Std. Dev | 0.4 | 0.0 | 0.4 | 0.4 | 110.3 | 5.7 | 0.9 |
| Neutral Face Angle 12.5 degree Loft Angle | Average | 131.0 | 1.49 | 13.1 | -0.1 | 2939 | 5.5 | 23.0 |
| | Std. Dev | 0.5 | 0.0 | 0.3 | 0.4 | 85.2 | 1.7 | 0.7 |

| Club | Data Type | Carry | Carry Side | Lnd Angle | Lnd Speed | Fight Time |
|---|---|---|---|---|---|---|
| Neutral Face Angle 8.5 degree Loft Angle | Average | 200.2 | -3.4 | -24.4 | 69.2 | 4.72 |
| | Std. Dev | 3.1 | 1.7 | 1.0 | 2.3 | 0.2 |
| Neutral Face Angle 9.5 degree Loft Angle | Average | 202.4 | -3.6 | -26.4 | 67.7 | 4.91 |
| | Std. Dev | 2.1 | 3.0 | 1.5 | 2.1 | 0.1 |
| Neutral Face Angle 10.5 degree Loft Angle | Average | 206.4 | 2.8 | -28.2 | 66.3 | 5.09 |
| | Std. Dev | 3.4 | 3.9 | 0.7 | 1.2 | 0.1 |
| Neutral Face Angle 11.5 degree Loft Angle | Average | 206.9 | 6.1 | -30.9 | 65.2 | 5.32 |
| | Std. Dev | 4.0 | 4.0 | 1.5 | 1.3 | 0.1 |
| Neutral Face Angle 12.5 degree Loft Angle | Average | 207.7 | 9.3 | -32.3 | 65.1 | 5.44 |
| | Std. Dev | 3.5 | 2.4 | 1.4 | 1.2 | 0.1 |

C2 Driver

Fig. 36A

| Club | Data Type | Club Speed | Attack Angle | Club Path | Vert Swing Plane | Horiz Swing Plane | Dyn Loft | Face Angle |
|---|---|---|---|---|---|---|---|---|
| Closed Face Angle 8.5 degree Loft Angle | Average | 89.0 | 4.2 | -0.2 | 50.3 | 3.3 | 11.6 | -4.4 |
| | Std. Dev | 0.2 | 0.8 | 0.9 | 3.6 | 1.6 | 0.2 | 0.6 |
| Closed Face Angle 9.5 degree Loft Angle | Average | 89.3 | 2.9 | 0.1 | 54.3 | 2.9 | 12.9 | -3.3 |
| | Std. Dev | 0.1 | 0.3 | 0.3 | 0.8 | 0.3 | 0.4 | 0.4 |
| Closed Face Angle 10.5 degree Loft Angle | Average | 88.6 | 2.9 | -0.1 | 54.2 | 1.5 | 13.3 | -2.7 |
| | Std. Dev | 0.3 | 1.1 | 0.8 | 4.2 | 1.9 | 0.2 | 0.6 |
| Closed Face Angle 11.5 degree Loft Angle | Average | 88.5 | 1.8 | 0.1 | 54.4 | 1.3 | 14.2 | -2.5 |
| | Std. Dev | 0.3 | 0.3 | 0.3 | 3.2 | 1.0 | 0.3 | 0.4 |
| Closed Face Angle 12.5 degree Loft Angle | Average | 88.3 | 0.5 | -0.3 | 57.9 | -0.1 | 14.7 | -2.3 |
| | Std. Dev | 0.2 | 0.1 | 0.2 | 0.1 | 0.1 | 0.2 | 0.3 |

| Club | Data Type | Ball Speed | Smash Factor | Launch Angle | Horiz Angle | Spin Rate | Spin Axis | Max Height |
|---|---|---|---|---|---|---|---|---|
| Closed Face Angle 8.5 degree Loft Angle | Average | 132.9 | 1.49 | 10.1 | -3.5 | 2352 | -1.3 | 14.3 |
| | Std. Dev | 0.2 | 0.0 | 0.2 | 0.6 | 51.7 | 2.1 | 0.6 |
| Closed Face Angle 9.5 degree Loft Angle | Average | 132.8 | 1.49 | 11.1 | -3.0 | 2375 | -0.2 | 16.2 |
| | Std. Dev | 0.4 | 0.0 | 0.4 | 0.5 | 107.5 | 1.8 | 0.5 |
| Closed Face Angle 10.5 degree Loft Angle | Average | 132.3 | 1.49 | 11.7 | -2.3 | 2488 | -1.1 | 18.7 |
| | Std. Dev | 0.4 | 0.0 | 0.5 | 0.4 | 120.5 | 2.4 | 0.7 |
| Closed Face Angle 11.5 degree Loft Angle | Average | 131.8 | 1.49 | 12.1 | -2.2 | 2645 | 1.4 | 20.2 |
| | Std. Dev | 0.2 | 0.0 | 0.4 | 0.5 | 77.3 | 0.5 | 1.1 |
| Closed Face Angle 12.5 degree Loft Angle | Average | 131.1 | 1.49 | 12.5 | -1.9 | 2779 | 4.4 | 21.3 |
| | Std. Dev | 0.5 | 0.0 | 0.2 | 0.3 | 137.5 | 1.5 | 0.9 |

| Club | Data Type | Carry | Carry Side | Lnd Angle | Lnd Speed | Fltght Time |
|---|---|---|---|---|---|---|
| Closed Face Angle 8.5 degree Loft Angle | Average | 194.8 | -12.5 | -22.4 | 72.6 | 4.43 |
| | Std. Dev | 3.5 | 2.1 | 1.1 | 2.6 | 0.2 |
| Closed Face Angle 9.5 degree Loft Angle | Average | 201.7 | -10.1 | -24.3 | 69.9 | 4.74 |
| | Std. Dev | 3.7 | 2.1 | 0.2 | 1.9 | 0.1 |
| Closed Face Angle 10.5 degree Loft Angle | Average | 204.5 | -9.8 | -27.1 | 68.4 | 4.96 |
| | Std. Dev | 1.4 | 2.5 | 1.0 | 1.3 | 0.1 |
| Closed Face Angle 11.5 degree Loft Angle | Average | 206.4 | -5.4 | -28.5 | 68.1 | 5.07 |
| | Std. Dev | 1.6 | 2.7 | 1.4 | 1.8 | 0.1 |
| Closed Face Angle 12.5 degree Loft Angle | Average | 206.6 | -0.1 | -29.9 | 67.8 | 5.18 |
| | Std. Dev | 1.3 | 2.5 | 1.2 | 1.4 | 0.1 |

<u>C2 Driver</u>

Fig. 36B

| Club | Data Type | Club Speed | Attack Angle | Club Path | Vert Swing Plane | Horiz Swing Plane | Dyn Loft | Face Angle |
|---|---|---|---|---|---|---|---|---|
| Open Face Angle 8.5 degree Loft Angle | Average | 88.5 | 1.2 | -1.3 | 57.3 | -0.6 | 12.9 | -0.1 |
| | Std. Dev | 0.3 | 0.3 | 0.3 | 0.2 | 0.2 | 0.4 | 0.3 |
| Open Face Angle 9.5 degree Loft Angle | Average | 88.5 | 1.8 | -1.3 | 56.3 | -0.3 | 13.5 | 0.4 |
| | Std. Dev | 2.3 | 0.3 | 0.3 | 0.7 | 0.3 | 0.3 | 0.3 |
| Open Face Angle 10.5 degree Loft Angle | Average | 88.0 | 0.8 | -0.7 | 57.2 | -0.3 | 14.4 | 0.7 |
| | Std. Dev | 0.7 | 0.4 | 0.3 | 0.4 | 0.5 | 0.3 | 0.7 |
| Open Face Angle 11.5 degree Loft Angle | Average | 87.8 | 0.4 | -0.7 | 57.3 | -0.5 | 15.3 | 1.1 |
| | Std. Dev | 2.3 | 0.3 | 0.3 | 0.7 | 0.3 | 0.4 | 0.7 |
| Open Face Angle 12.5 degree Loft Angle | Average | 87.4 | 0.2 | -0.7 | 57.2 | -0.6 | 15.7 | 1.5 |
| | Std. Dev | 0.2 | 0.2 | 0.2 | 0.1 | 0.2 | 0.2 | 0.5 |

| Club | Data Type | Ball Speed | Smash Factor | Launch Angle | Horiz Angle | Spin Rate | Spin Axis | Max Height |
|---|---|---|---|---|---|---|---|---|
| Open Face Angle 8.5 degree Loft Angle | Average | 132.1 | 1.49 | 11.0 | -0.3 | 2571 | 7.1 | 16.2 |
| | Std. Dev | 0.3 | 0.0 | 0.4 | 0.3 | 101.3 | 3.3 | 0.4 |
| Open Face Angle 9.5 degree Loft Angle | Average | 131.3 | 1.49 | 11.4 | 0.3 | 2785 | 8.2 | 18.3 |
| | Std. Dev | 2.3 | 0.0 | 0.3 | 0.5 | 75.3 | 3.4 | 0.3 |
| Open Face Angle 10.5 degree Loft Angle | Average | 130.8 | 1.49 | 12.2 | 0.4 | 2921 | 9.7 | 20.3 |
| | Std. Dev | 0.7 | 0.0 | 0.3 | 0.5 | 74.1 | 2.1 | 0.5 |
| Open Face Angle 11.5 degree Loft Angle | Average | 130.7 | 1.49 | 12.3 | 0.3 | 3063 | 8.7 | 22.3 |
| | Std. Dev | 2.4 | 0.0 | 0.4 | 0.5 | 133.4 | 1.7 | 1.4 |
| Open Face Angle 12.5 degree Loft Angle | Average | 130.7 | 1.50 | 13.3 | 1.2 | 3169 | 11.4 | 24.3 |
| | Std. Dev | 0.5 | 0.0 | 0.3 | 0.4 | 78.5 | 1.6 | 0.5 |

| Club | Data Type | Carry | Carry Side | Lnd. Angle | Lnd. Speed | Flight Time |
|---|---|---|---|---|---|---|
| Open Face Angle 8.5 degree Loft Angle | Average | 208.5 | 18.5 | -25.3 | 68.6 | 4.80 |
| | Std. Dev | 2.7 | 3.8 | 0.4 | 2.1 | 0.1 |
| Open Face Angle 9.5 degree Loft Angle | Average | 207.7 | 18.9 | -26.8 | 68.4 | 4.93 |
| | Std. Dev | 2.4 | 3.7 | 1.1 | 1.5 | 0.1 |
| Open Face Angle 10.5 degree Loft Angle | Average | 202.7 | 18.1 | -29.6 | 67.4 | 5.10 |
| | Std. Dev | 3.5 | 2.3 | 0.7 | 1.1 | 0.1 |
| Open Face Angle 11.5 degree Loft Angle | Average | 205.6 | 18.9 | -31.7 | 66.5 | 5.32 |
| | Std. Dev | 2.3 | 2.3 | 1.3 | 1.2 | 0.1 |
| Open Face Angle 12.5 degree Loft Angle | Average | 205.2 | 27.0 | -35.0 | 63.6 | 5.60 |
| | Std. Dev | 2.5 | 3.0 | 0.8 | 1.2 | 0.1 |

C2 Driver

Fig. 36C

| Club | Data Type | Club Speed | Attack Angle | Club Path | Vert. Swing Plane | Horiz. Swing Plane | Dyn. Loft | Face Angle |
|---|---|---|---|---|---|---|---|---|
| Comparative Driver 8.5 degree Loft Angle | Average | 88.3 | 1.2 | -0.3 | 55.7 | -0.1 | 10.8 | 0.0 |
| | Std. Dev | 0.3 | 1.0 | 1.0 | 0.7 | 0.4 | 0.3 | 0.4 |
| Comparative Driver 9.5 degree Loft Angle | Average | 88.6 | -1.2 | 0.1 | 55.3 | 0.5 | 12.5 | 0.0 |
| | Std. Dev | 0.8 | 0.4 | 0.4 | 1.1 | 0.3 | 0.3 | 0.3 |
| Comparative Driver 10.5 degree Loft Angle | Average | 88.7 | 0.0 | -0.7 | 55.6 | -0.7 | 14.2 | 0.3 |
| | Std. Dev | 0.5 | 0.2 | 0.3 | 1.0 | 0.3 | 0.3 | 0.7 |
| Comparative Driver 11.5 degree Loft Angle | Average | 87.4 | -0.9 | -0.1 | 56.3 | -0.7 | 14.8 | 0.7 |
| | Std. Dev | 0.8 | 0.5 | 0.2 | 0.5 | 0.2 | 0.3 | 0.5 |
| Comparative Driver High Loft Angle | Average | 87.9 | -1.4 | 1.2 | 54.2 | 0.2 | 15.7 | -0.1 |
| | Std. Dev | 0.9 | 0.8 | 1.4 | 2.9 | 0.9 | 0.5 | 1.1 |

| Club | Data Type | Ball Speed | Smash Factor | Launch Angle | Horiz. Angle | Spin Rate | Spin Axis | Max Height |
|---|---|---|---|---|---|---|---|---|
| Comparative Driver 8.5 degree Loft Angle | Average | 131.9 | 1.49 | 9.4 | -0.1 | 1817 | -0.5 | 11.1 |
| | Std. Dev | 0.4 | 0.0 | 0.3 | 0.3 | 50.0 | 4.0 | 0.4 |
| Comparative Driver 9.5 degree Loft Angle | Average | 131.7 | 1.49 | 10.9 | 0.1 | 2114 | -1.3 | 14.3 |
| | Std. Dev | 2.2 | 0.0 | 0.4 | 0.1 | 128.0 | 1.7 | 0.5 |
| Comparative Driver 10.5 degree Loft Angle | Average | 131.4 | 1.48 | 12.2 | 0.2 | 2577 | -0.2 | 19.3 |
| | Std. Dev | 0.5 | 0.0 | 0.3 | 0.7 | 95.7 | 2.7 | 0.4 |
| Comparative Driver 11.5 degree Loft Angle | Average | 130.4 | 1.49 | 12.8 | 0.5 | 2674 | 0.1 | 20.1 |
| | Std. Dev | 0.5 | 0.0 | 0.3 | 0.4 | 114.9 | 1.7 | 0.5 |
| Comparative Driver High Loft Angle | Average | 129.7 | 1.48 | 13.5 | 0.0 | 2828 | -0.6 | 20.1 |
| | Std. Dev | 0.5 | 0.0 | 0.6 | 1.0 | 174.2 | 2.9 | 0.8 |

| Club | Data Type | Carry | Carry Side | Lnd. Angle | Lnd. Speed | Flight Time |
|---|---|---|---|---|---|---|
| Comparative Driver 8.5 degree Loft Angle | Average | 178.7 | -1.2 | -18.1 | 76.7 | 5.10 |
| | Std. Dev | 3.4 | 2.5 | 0.5 | 2.1 | 0.1 |
| Comparative Driver 9.5 degree Loft Angle | Average | 194.9 | -2.5 | -22.1 | 71.7 | 3.87 |
| | Std. Dev | 3.9 | 0.7 | 0.3 | 2.0 | 0.1 |
| Comparative Driver 10.5 degree Loft Angle | Average | 206.9 | -1.2 | -27.5 | 67.2 | 4.48 |
| | Std. Dev | 1.5 | 4.2 | 0.6 | 1.7 | 0.1 |
| Comparative Driver 11.5 degree Loft Angle | Average | 205.0 | 1.6 | -27.5 | 65.9 | 5.02 |
| | Std. Dev | 2.8 | 3.4 | 0.7 | 2.5 | 0.1 |
| Comparative Driver High Loft Angle | Average | 203.7 | -1.9 | -27.7 | 72.2 | 4.94 |
| | Std. Dev | 2.9 | 1.0 | 1.1 | 1.4 | 0.1 |

Comparative Driver Example
130 mph Ball Speed

Fig. 37

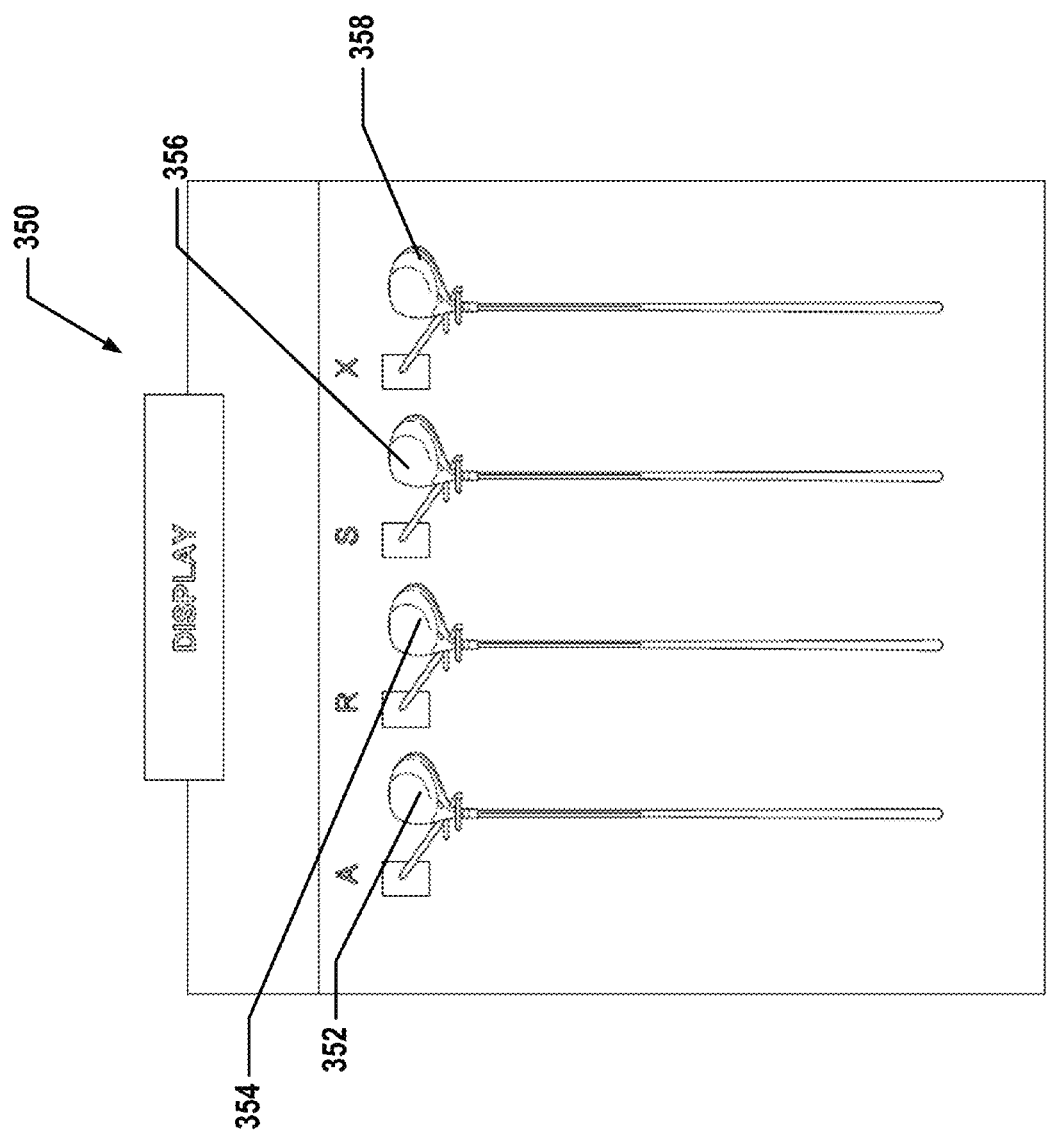

ADJUSTABLE GOLF CLUB AND SYSTEM AND ASSOCIATED GOLF CLUB HEADS AND SHAFTS

RELATED APPLICATIONS

This present application claims the benefit of U.S. Patent Application No. 61/654,070 filed on May 31, 2012, which application is incorporated by reference herein and made a part hereof.

FIELD OF THE INVENTION

This invention relates generally to golf clubs, golf club heads, golf club shafts and associated systems and methods. More particularly, aspects of this invention relate to golf club systems and methods that provide enhanced golf club structures and golf club supply management.

BACKGROUND

Golf clubs are well known in the art for use in the game of golf. Golf club assemblies typically include a golf club head, a shaft, and a grip. Significant research and development has been devoted to improving performance characteristics of golf clubs and providing additional enhanced features. Certain features include adjustments associated with various portions of the golf club assembly that allow golfers to modify the golf club to suit their individual preferences and performance needs. Golf clubs incorporating such features are generally referred to as adjustable golf clubs.

While known adjustable golf clubs may provide a number of advantages to golfers, they nevertheless have limitations and proffered advantages are often accompanied by performance compromises. Furthermore, the incorporation of adjustment mechanisms to the variety of different golf clubs types that golfers use has resulted in ever-expanding manufacturer and retail inventories while simultaneously generating supply issues exemplified by limited availability of certain golf club configurations, and excess supply of others. At the same time, the number of Stock Keeping Units (SKUs) that must be manufactured to supply a full line of club configurations for each golf club model and type has also become ever-expanding. Not only has this increased the cost and complexity of golf club manufacturing, but the overwhelming variety of options has made it more difficult for some golfers to select the correct club configuration for their individual performance needs. Additionally, the increased costs associated with adjustment mechanisms have limited accessibility to adjustable golf clubs for a substantial number of golfers. The present invention seeks to overcome these limitations and other drawbacks of known golf clubs and the current method of manufacturing and supplying golf clubs. In addition, the present invention provides new features heretofore unavailable to golfers, golf club fitters, and golf club providers.

SUMMARY

The following presents a general summary of aspects of the invention in order to provide a basic understanding of the invention and various features of it. This summary is not intended to limit the scope of the invention in any way, but it simply provides a general overview and context for the more detailed description that follows.

In general, aspects of this invention relate to golf clubs or golf club components incorporating adjustment members that permit ready adjustability of golf club parameters and/or interchangeability of golf club components to change a golf club configuration, and methods for providing golf clubs. Club configuration may be defined as one permutation of available options for each model, either adjustable or "designed-in" such as Loft+Face Angle+Lie Angle+Shaft Flex and Construction. According to aspects of this invention, an adjustment member may be utilized to allow the adjustability of a golf club parameter to change a golf club configuration, while ensuring there is substantially no change to other club or club head variables, parameters or characteristics. According to another aspect of this invention, an adjustment member may be utilized to allow the adjustability of two golf club parameters independently to change a golf club configuration, while ensuring there is substantially no change to other club or club head variables, parameters or characteristics.

According to aspects of this invention, a golf club may be provided with a base configuration. The golf club may include a shaft, a grip and a golf club head. When oriented in a reference position, the golf club may have a set of base parameters or characteristics, such as a base loft angle, a base lie angle, a base face angle, a base center of gravity location, a base moment of inertia, etc. The golf club may include an adjustment member that allows a user to change one or more parameters or characteristics independently of other parameters or characteristics. The golf club head may be incorporate design aspects that ensure there is substantially no change to certain club or club head performance variables, parameters or characteristics, and/or specified change of other performance variables, parameters or characteristics.

Additionally, another aspect of this invention may relate to methods of assembling golf clubs using adjustment members in accordance with examples of this invention. Such methods may include: (a) providing a golf club head with at least a first base parameter (e.g., by manufacturing it, from a third party supplier, etc.); (b) producing at least one adjustment member that permits substantially independent adjustment of the first base parameter from a first base parameter value to one or more alternate values; (c) engaging (e.g., via cements or adhesives, via other fusing or mechanical fastening techniques, or in a releasable manner, etc.) the adjustment member with the head, wherein the adjustment member is operably associated with the club head and may utilize cooperating surfaces to achieve adjustment; (d) engaging a shaft and grip with the golf club head and/or the adjustment member; wherein steps (a)-(d) produce a reconfigurable first golf club that eliminates the need to provide at least one other golf club head having a second base parameter value to produce a second golf club.

As additional example aspects of this invention, a purchaser of a golf club described herein may be provided with a comprehensive selection of options at retail, and the retailer providing the golf club may maintain a reduced amount of inventory for the proffered selection. The retailer may offer golf club heads for purchase and shaft assemblies for sale, as well as complete golf clubs. The shaft assemblies may, for example, be offered in four different flex ratings, e.g., senior (A) flex, regular (R) flex, stiff (S) flex, or extra stiff (X) flex and a single loft (e.g. a base loft of 10.5 degrees). Conventionally, a retailer would need to carry an inventory of multiple lofts, e.g., 8.5 degrees, 9.5 degrees, 10.5 degrees, 11.5 degrees and 12.5 degrees, for each shaft flex offered. For example, a retailer may wish to have on hand, at any given time, 25 units of each shaft flex and loft available for a particular golf club model to ensure adequate supply to purchasers and may be required to maintain an inventory of approximately 500 conventional golf clubs. By offering for sale golf clubs incorporating the principles taught herein, the retailer would only need to carry an inventory of approximately 100 assembled golf clubs, wherein an adjustment member would allow the golf clubs to be adjusted from the base loft to the remaining lofts desired (e.g., from 10.5 degrees to 8.5 degrees, 9.5 degrees, 11.5 degrees or 12.5 degrees) while other club or club head parameters remain substantially constant within a specified range. This reduction in inventory drastically reduces the number of golf clubs the retailer would be required to purchase to have sufficient inventory on hand at any given time, freeing up cash flow that can be invested elsewhere. Additionally, the reduced inventory would drastically reduce storage space requirements, significantly reducing overhead costs. Moreover, the reduced inventory reduces the likelihood of carrying unsaleable products or golf clubs at the end of the season which must then be sold at discount or even a loss.

Additional aspects of this invention relate to a golf club head comprising a body defining a ball striking surface, a crown, a sole, a heel, a toe and a back; and an adjustment member operably connected to the body. The body and adjustment member may be structured such that the adjustment member adjusts a first parameter associated with the body among a plurality of positions and wherein in response to the adjustment of the first parameter, a second parameter associated with the body remains constant within a predetermined tolerance.

BRIEF DESCRIPTION OF THE DRAWINGS

A more complete understanding of the present invention and certain advantages thereof may be acquired by referring to the following detailed description in consideration with the accompanying drawings, in which:

FIGS. 19A through 19E include tables that illustrate various configurations and measurements for an example golf club according to this invention;

FIGS. 35A through 36C illustrate tables of test data of example golf club heads according to this invention;

FIG. 37 illustrates a tables of test data of a golf club head as a comparative example;

FIGS. 41A through 42B illustrate an example retail display according to this invention;

The reader is advised that the attached drawings are not necessarily drawn to scale.

DETAILED DESCRIPTION

In the following description of various example structures in accordance with the invention, reference is made to the accompanying drawings, which form a part hereof, and in which are shown by way of illustration various example adjustment members, golf club heads, and golf club structures in accordance with the invention. Additionally, it is to be understood that other specific arrangements of parts and structures may be utilized, and structural and functional modifications may be made without departing from the scope of the present invention. Also, while the terms "top," "bottom," "front," "back," "rear," "side," "underside," "overhead," and the like may be used in this specification to describe various example features and elements of the invention, these terms are used herein as a matter of convenience, e.g., based on the example orientations shown in the figures and/or the orientations in typical use. Nothing in this specification should be construed as requiring a specific three dimensional or spatial orientation of structures in order to fall within the scope of this invention.

Figure 1:
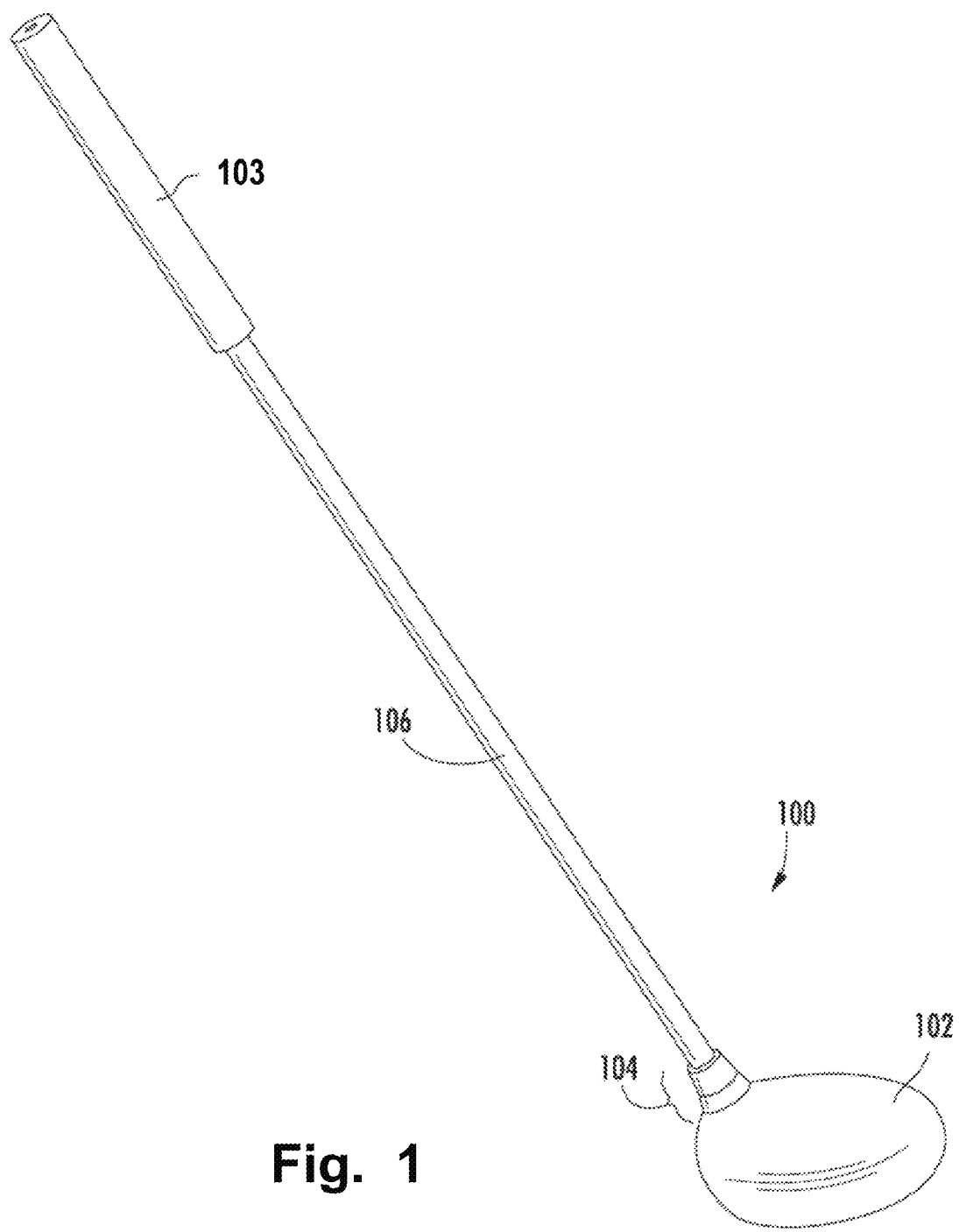
FIG. 1 generally illustrates a perspective view of an example golf club according to this invention.

FIG. 1 generally illustrates an example golf club 100 in accordance with at least some examples of this invention. This club 100 includes a club head 102, a shaft 106 (which will be described in more detail below), and a grip member 103 engaged with the shaft 106. While a driver/wood-type golf club head 102 is illustrated in these figures, aspects of this invention may be applied to any type of club head, including, for example: fairway wood club heads (e.g., 3-woods with loft angles ranging from 13-17 degrees, 5 woods with loft angles ranging from 15-19 degrees, and other possible wood club heads with other varying loft angles); wood or iron type hybrid golf club heads (of any desired loft, e.g., generally from 13-45 degrees); or iron type golf club heads (of any desired loft, e.g., from a 0-iron or 1-iron to a wedge); and the like. The club heads may be made from any desired materials, in any desired construction and/or in any desired manner, including from conventional materials, in conventional constructions, in conventional manners, as are known and/or used in the art, optionally modified (if necessary, e.g., in size, shape, inclusion of structures, etc.) as required for aspects of this invention as described in more detail below. As will be described in detail below, the club head 102 may include an adjustment member 104 which may provide for the adjustment of parameters of the club head 102.

Any desired materials also may be used for the shaft 106, including conventional materials that are known and/or used in the art, such as steel, graphite based materials, polymers, composite materials, combinations of these materials, etc. Optionally, if necessary or desired, the shaft 106 may be modified (e.g., in size, shape, etc.) to accommodate releasable club head/shaft connection parts. The grip member 103 may be engaged with the shaft 106 in any desired manner, including in conventional manners that are known and/or used in the art (e.g., via cements or adhesives, via mechanical connections, etc.). Any desired materials may be used for the grip member 103, including conventional materials that are known and/or used in the art, such as rubber, polymeric materials, cork, rubber or polymeric materials with cord or other fabric elements embedded therein, cloth or fabric, tape, etc.

For each of the different club types, such as drivers, fairway wood clubs, hybrid clubs, and iron clubs, a manufacturer of golf clubs may offer various or differing club lines and models. Each model may have different club head parameters as compared to a similar club type in the same line. As will be described in detail below, these club head parameters may have varying effects on the swing performance and ball-striking performance for a given user of the golf club. Therefore, each club model may have swing performance and/or ball-striking performance intended for a given golfer.

For example, a manufacturer may offer a metalwood club line that includes four different driver models, 4 different fairway wood models, and 4 different hybrid models. As was discussed above, the different models may have different club head parameters to provide varying effects on swing and ball-striking performance so that the golf club line includes models of each club type suitable to a wide range of golfers.

Figure 2:
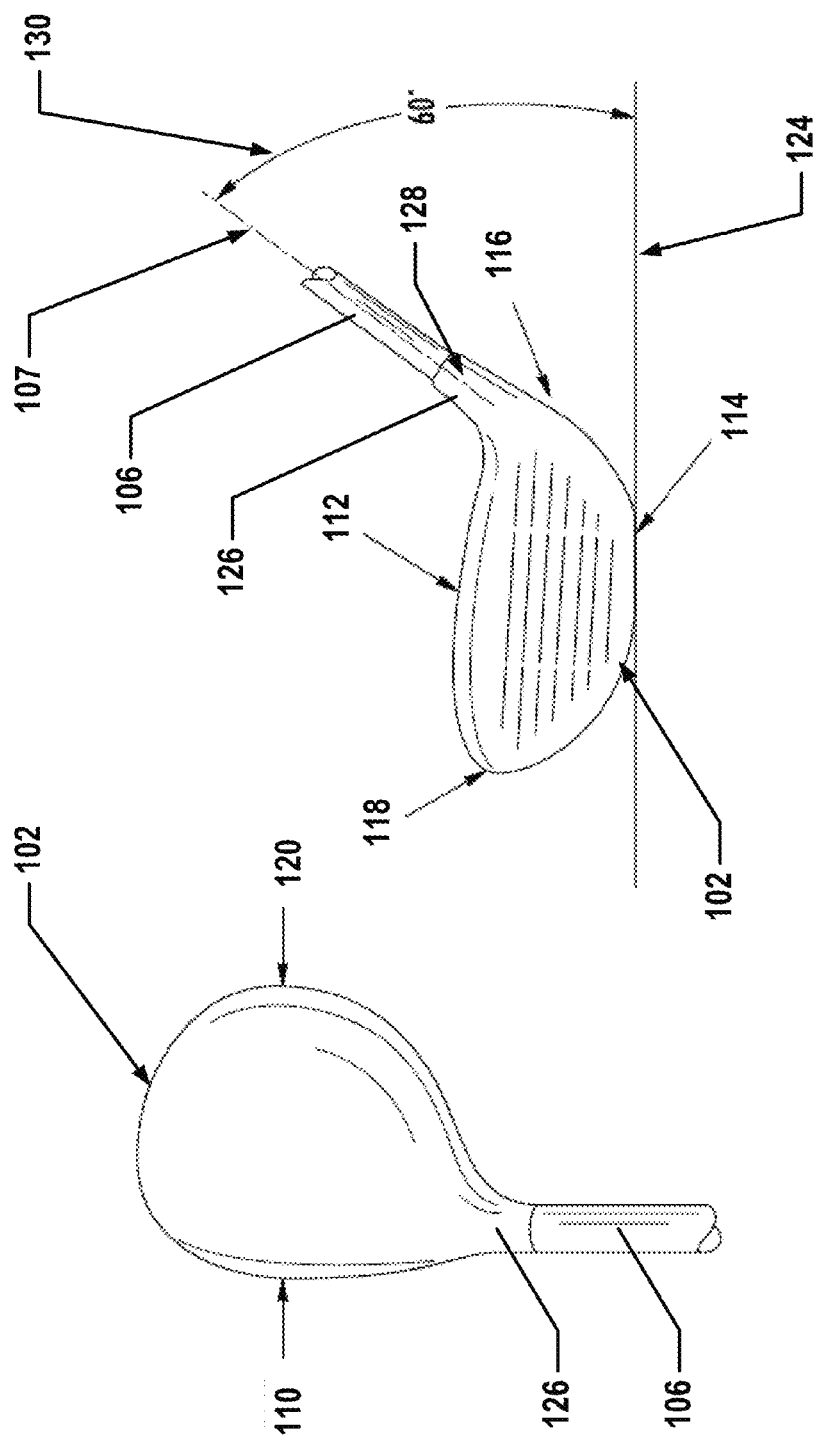
FIGS. 2 through 18 illustrate various views of an example golf club head and various performance parameters and characteristics according to this invention.

Generally, all club heads 102 include various parts. FIG. 2 illustrates various parts of the golf club head 102 as will be referenced throughout the remainder of this application (as referenced from USGA Rules of Golf). A club head 102 has a face or striking face 110, a crown 112, a sole 114, a heel 116, a toe 118, and a back 120. The crown 112 may be defined as the upper curved portion of the head 102 of a wood or metal wood. The sole 114 may be defined as the bottom or underside portion of any type of club, and is generally opposite the crown 112. The sole 114 may include an area on the club head 102 that rests on the ground when a golfer soles the golf club 100. The sole 114 may generally rest on a ground plane 124, wherein the ground plane 124 is a horizontal plane tangent with the bottom of the club head 102. The heel 116 may the part of the club head 102 nearer to and including the hosel 126. The toe 118 may be the area of the golf club 100 that is the farthest from the shaft 106. The back 120 of the club head 102 is generally opposite the face 110. The shaft 106 attaches to the head 102 at the heel 116 via a hosel 126. The shaft 106 has a center axis 107. The hosel 126 may have a bore 108 for receiving the shaft 106, or a shaft adapter 200 (see FIGS. 21A, 22A, and 22B). The hosel bore 108 has a center axis or a hosel axis 128. If the shaft 106 is inserted and attached directly to hosel bore 108, the hosel axis 128 may be substantially coincident with shaft axis 107. For club head embodiments including a shaft adapter 200, the shaft 106 may be received in a shaft adapter bore 208. The shaft adapter bore 208 may have a center axis or shaft adapter axis 201, which may be substantially coincident with shaft axis 107. The shaft adapter axis 201 may be offset angularly and/or linearly from the hosel axis 128 to permit adjustment of club parameters via rotation of the shaft adapter with respect to club head 102, as is known by persons skilled in the art.

According to aspects of this invention, a golf club 100 may be provided with a base configuration. The base configuration may be defined by a set of base parameters or characteristics of a golf club head 102 that oriented in a reference position. The golf club 100 and/or the golf club head 102 base parameters or characteristics may include, but are not limited to: a face center location, a base loft angle, a base face angle, a base lie angle, a base center of gravity location, a base moment of inertia, a bulge curvature, a roll curvature, a base sole contact location or sole contact point, and a virtual rotation point. Parameters or characteristics as well as methods and procedures for measuring them will be described and detailed below.

Figure 4:
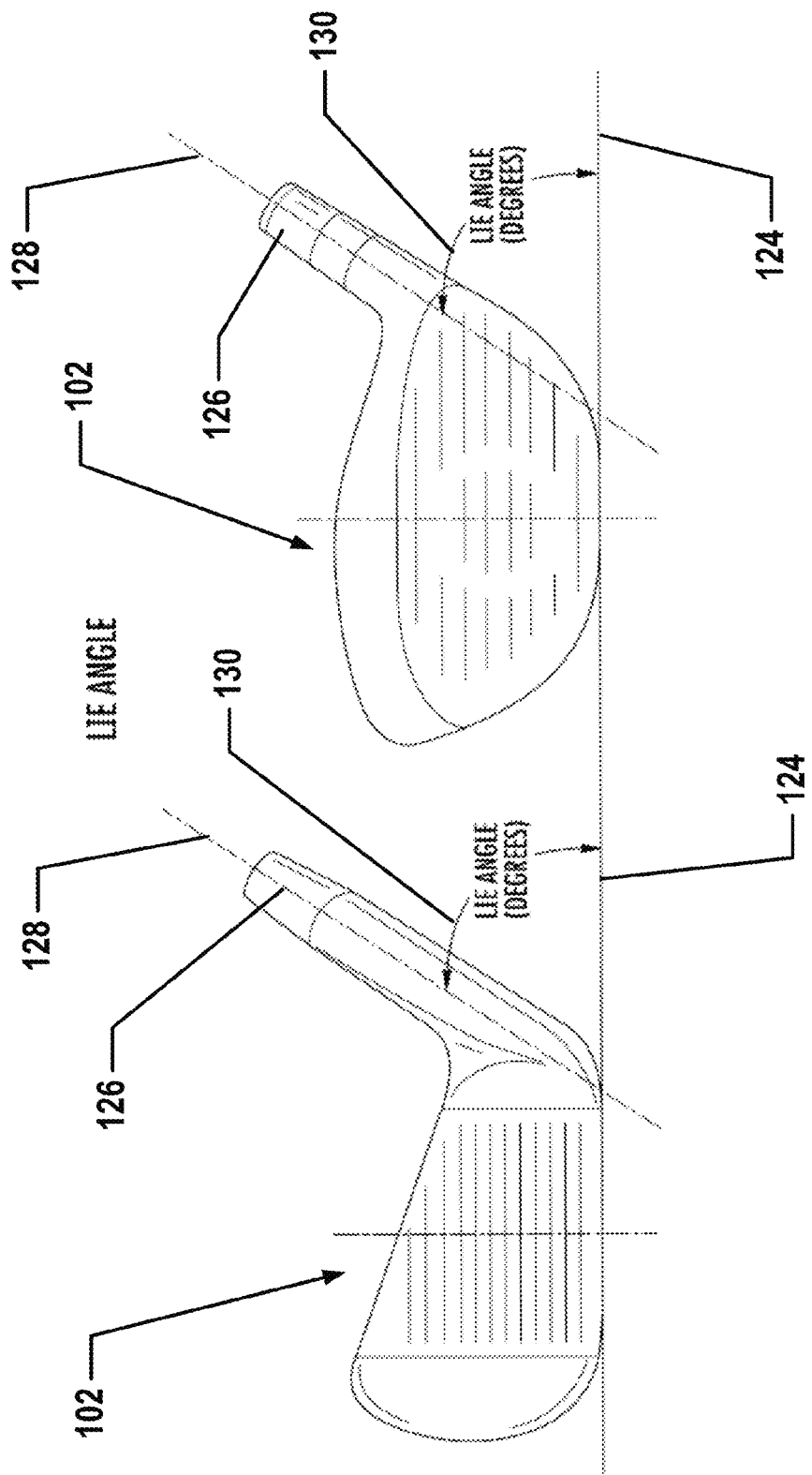

As illustrated in FIGS. 2 and 4, a lie angle 130 is defined as the angle formed between the shaft axis 107 and a horizontal plane contacting the sole 114, which may be the ground plane 124.

Figure 6:
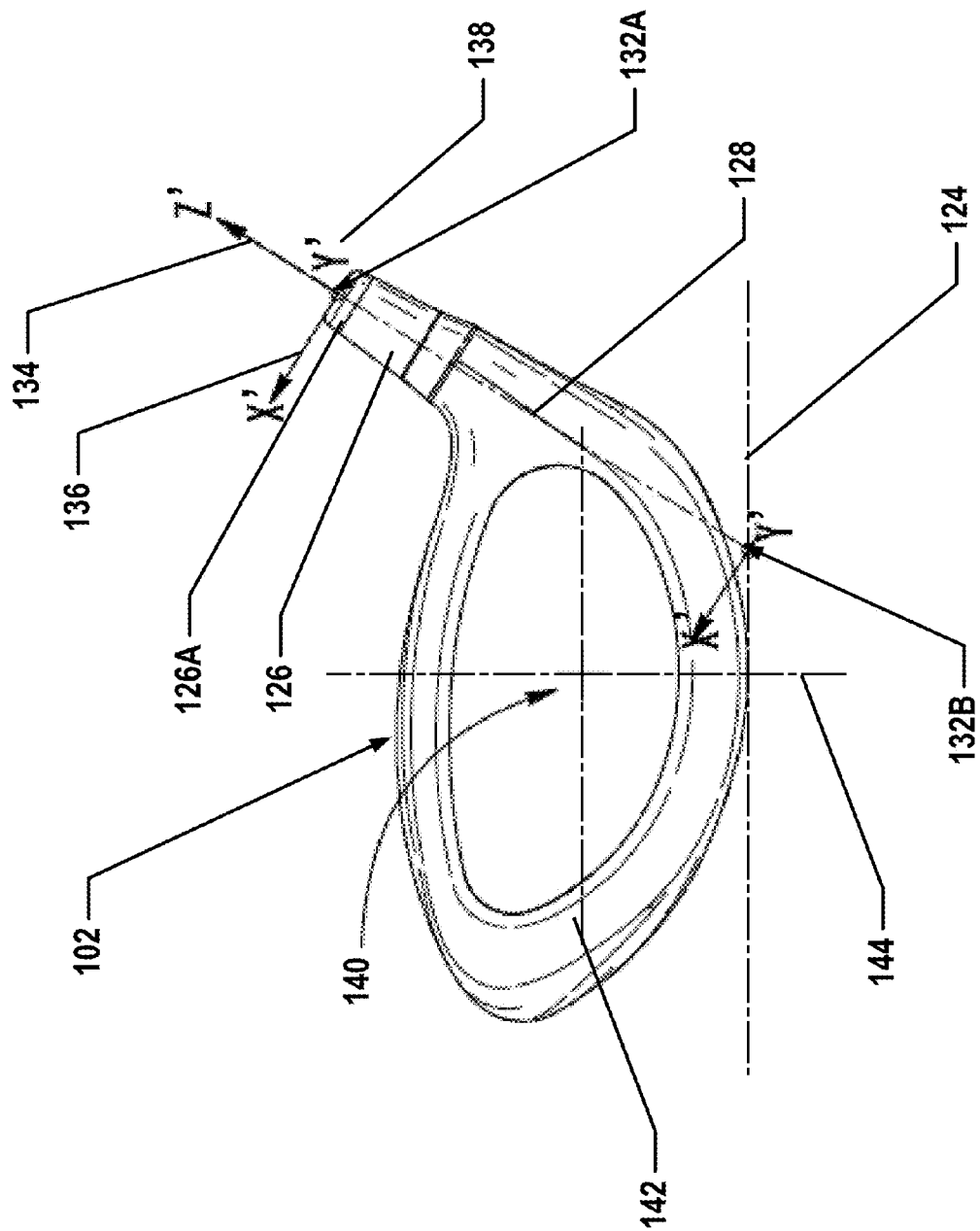

FIG. 6 illustrates the face center location 140 on a fixtured club head 102. The face center 140 is determined using Unites States Golf Association (USGA) standard measuring procedures and methods. For example, the current USGA procedure requires finding the center point along a horizontal line 142 along the club face 110 until the heel 116 and the toe 118 measurements at the edges of the face 110 of the club head 102 are equal. Then, finding the center point along a vertical line 144 along the club face 110 until the crown 112 and the sole 114 measurements at the edges of the face 110 of the club head 102 are also equal. When the heel 116 and the toe 118 measurements are equal and the crown 112 and the sole 114 measurements are equal, the intersecting point of these lines is defined as the face center location 140.

Figure 7:
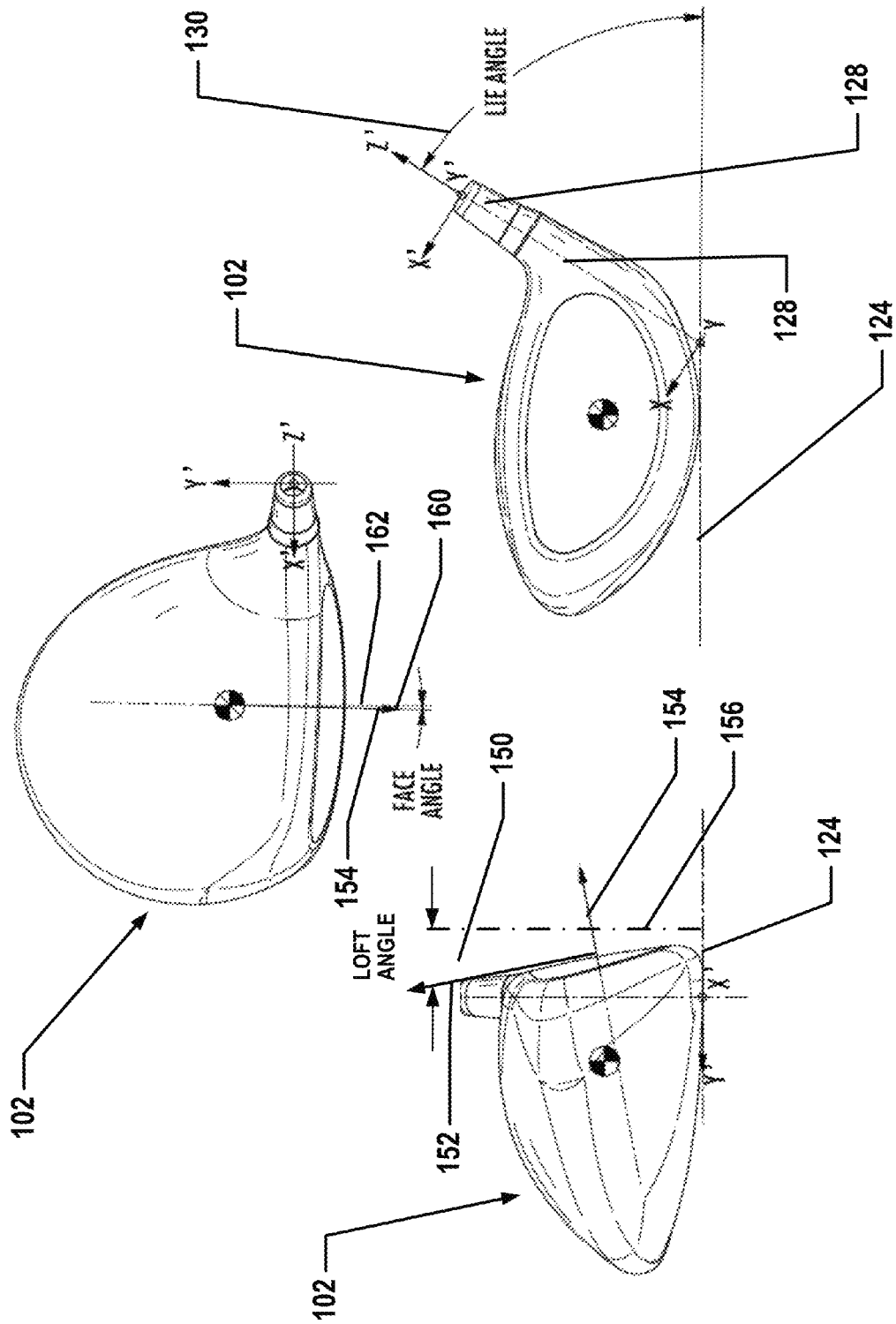
Figure 9A:
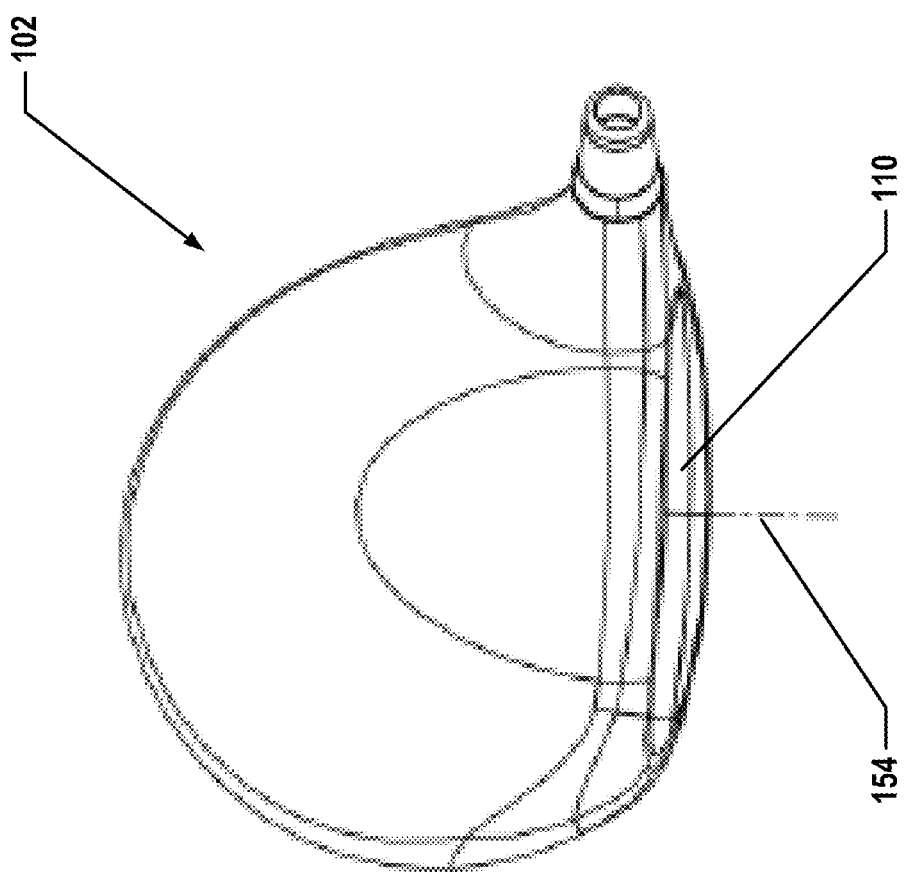
Figure 9B:
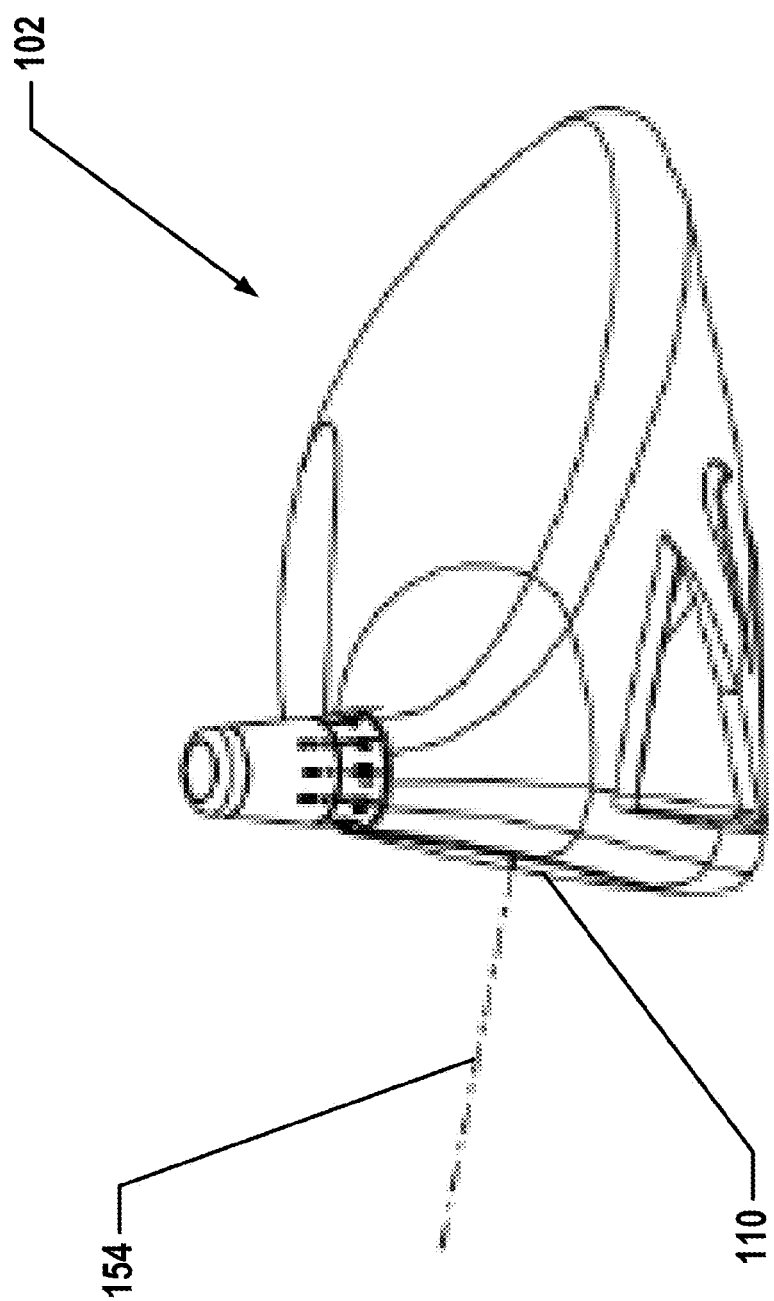

FIG. 7 illustrates an example of a loft angle 150 of the golf club head 102. As illustrated in FIG. 7, the loft angle 150 is defined as a measurement between an axis normal 152 or perpendicular to a face center axis 154 and an axis normal 156 or perpendicular to the ground plane 124. As illustrated in FIGS. 9A and 9B, the face center axis 154 is defined as the axis from the face center 140 and normal to the face.

Figure 8:
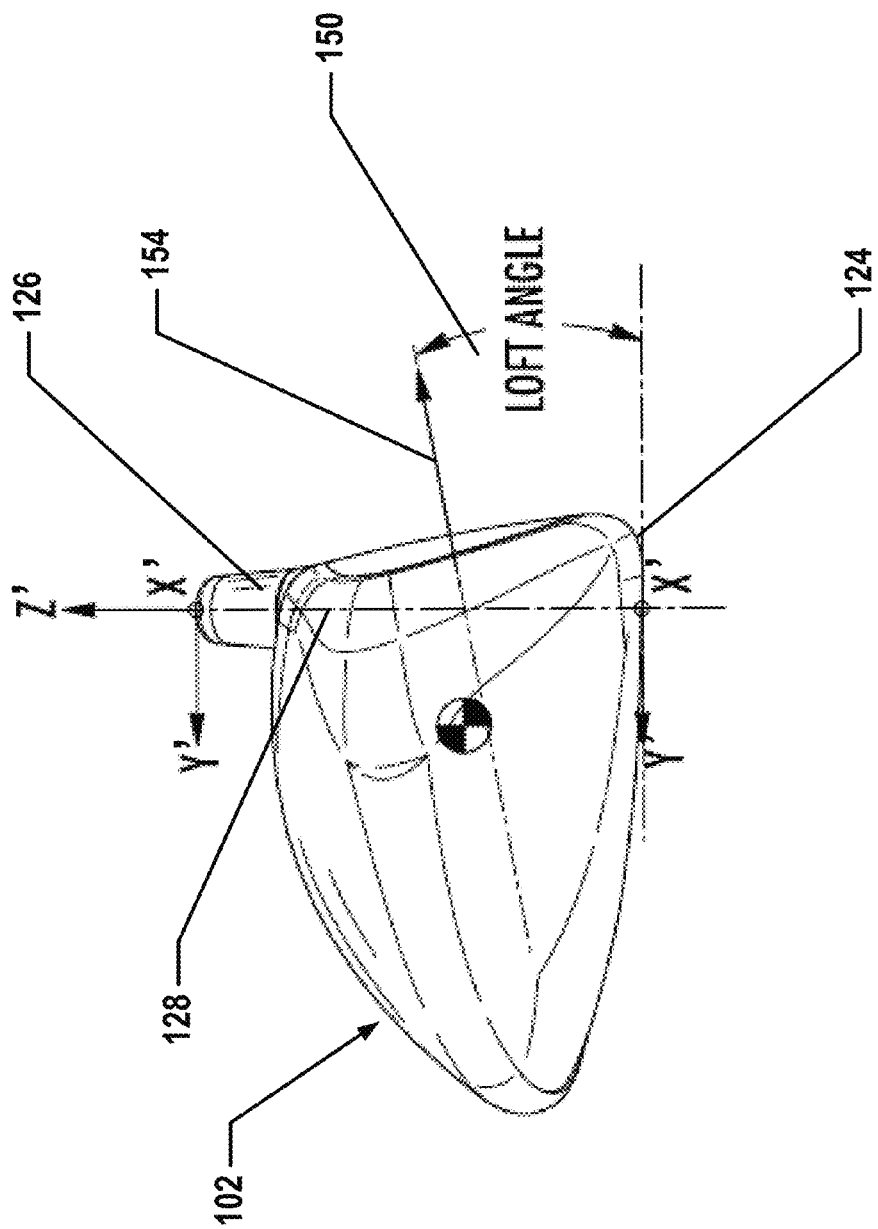

In another aspect and similar to the aspect as illustrated in FIG. 7, as illustrated in FIG. 8, the loft angle 150 is defined as a measurement between the face center axis 154 and the ground plane 124. It is recognized that each of these loft angle 150 definitions may yield a similar or exactly the same loft angle measurement.

FIG. 7 illustrates an example of a face angle 160 of a golf club head 102. As illustrated in FIG. 7, the face angle 160 is measured by utilizing the face center axis 154 and a right plane 162 (a plane perpendicular to the X axis).

Figure 5:
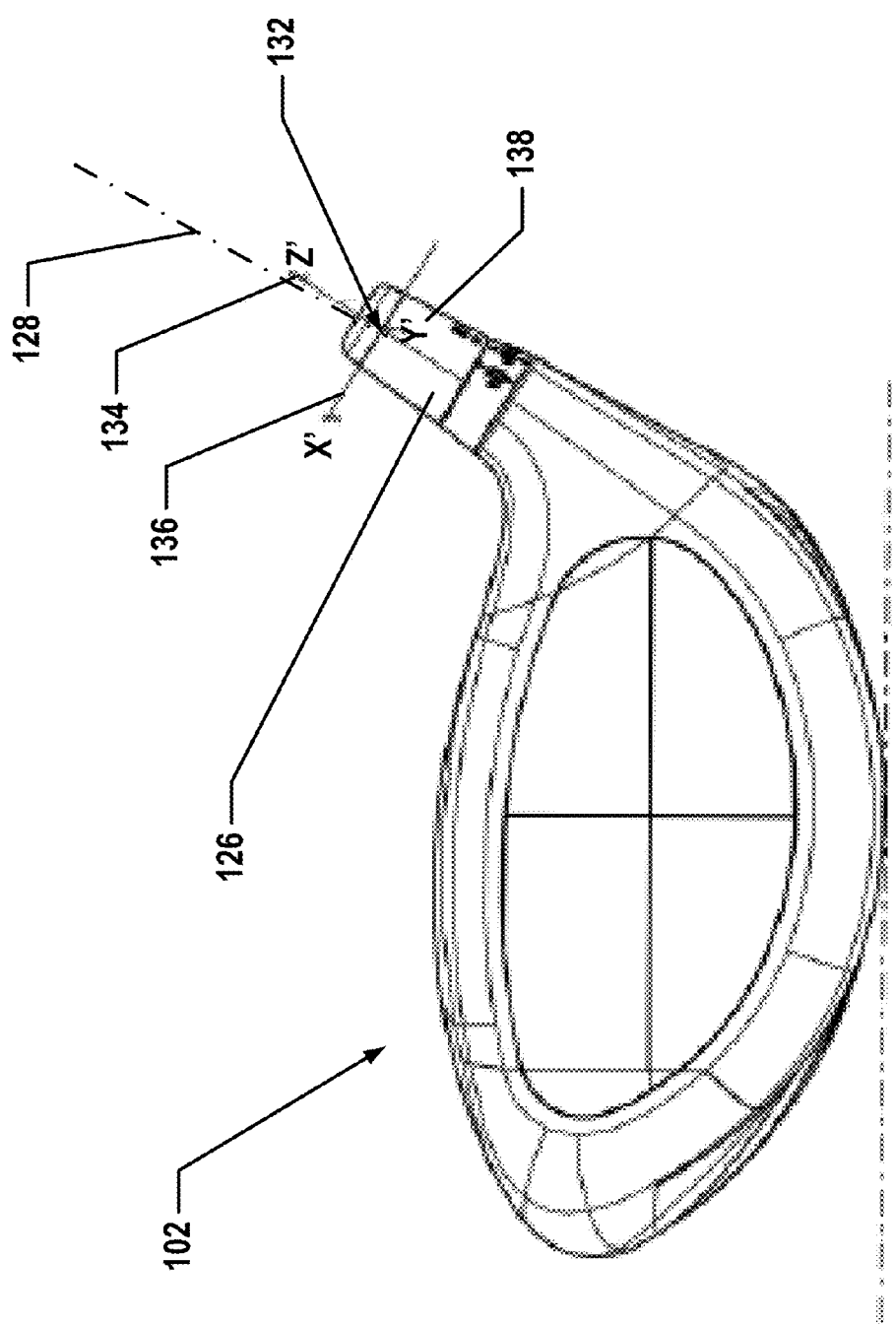

An origin point 132 may be defined on the golf club 100 or golf club head 102, or a point defined in relation to certain elements of the club or head. Various other points, such as the center of gravity, sole contact, and face center, may be described and/or measured in relation to the origin point 132. As illustrated in FIG. 5, a coordinate system may be defined on the origin point 132, e.g., with a Z' axis 134 extending along the direction of the shaft axis 107 (and/or the hosel axis 128 or shaft adapter axis 201), an X' axis 136 parallel with the vertical plane and normal to the Z' axis, and a Y' axis 138 normal to the X' and Z' axes.

FIG. 6 illustrates two different examples of where the origin point 132 may be located. The first location 132A, defined as the hosel origin point 132A, is generally located on the hosel 126. The hosel origin point 132A is located on the hosel axis 128, or if so provided, the shaft adapter axis 201, and coincident with the uppermost edge 126A of the hosel 126 or shaft adapter. A second location 132B, defined as a ground origin point 132B, is generally located at the ground plane 124. The ground origin point 132B is defined as the point at which the ground plane 124 and the hosel axis 128 intersect. Either location for the origin point 132 may be utilized without departing from this invention. Additionally, other locations for the origin point 132 may be utilized without departing from this invention. Throughout the remainder of this application, the hosel origin point 132A will be utilized for all reference locations, tolerances, and calculations.

Figure 10:
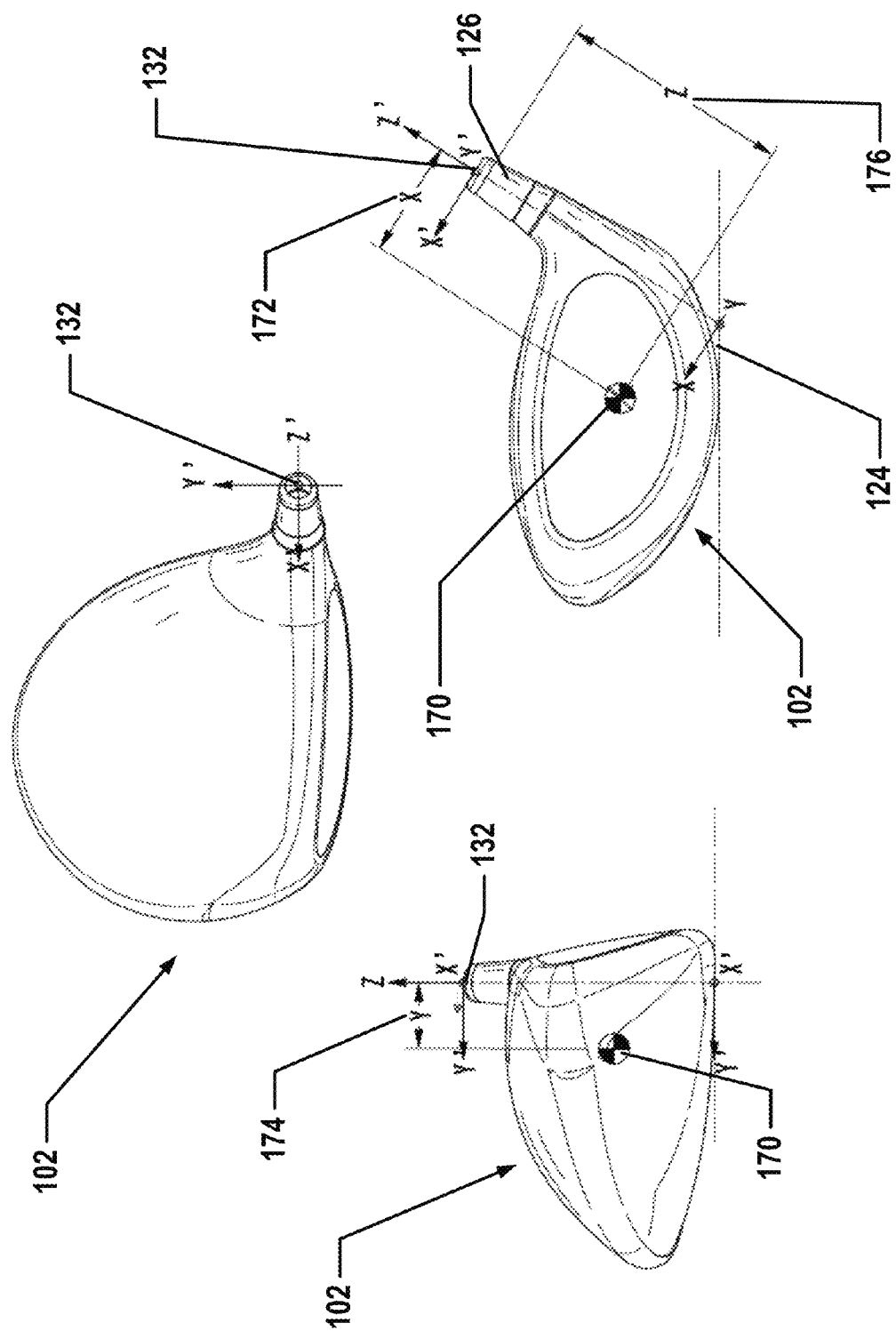

FIG. 10 illustrates an example of a center of gravity location 170 as a specified parameter of the golf club head 102. The golf club head 102 center of gravity location 170 is provided with reference to its position from the origin point 132. As illustrated in FIG. 10, the center of gravity location 170 is defined by a distance from the origin point 132 along the X' axis 172, Y' axis 174, and Z' axis 176.

Figure 11:
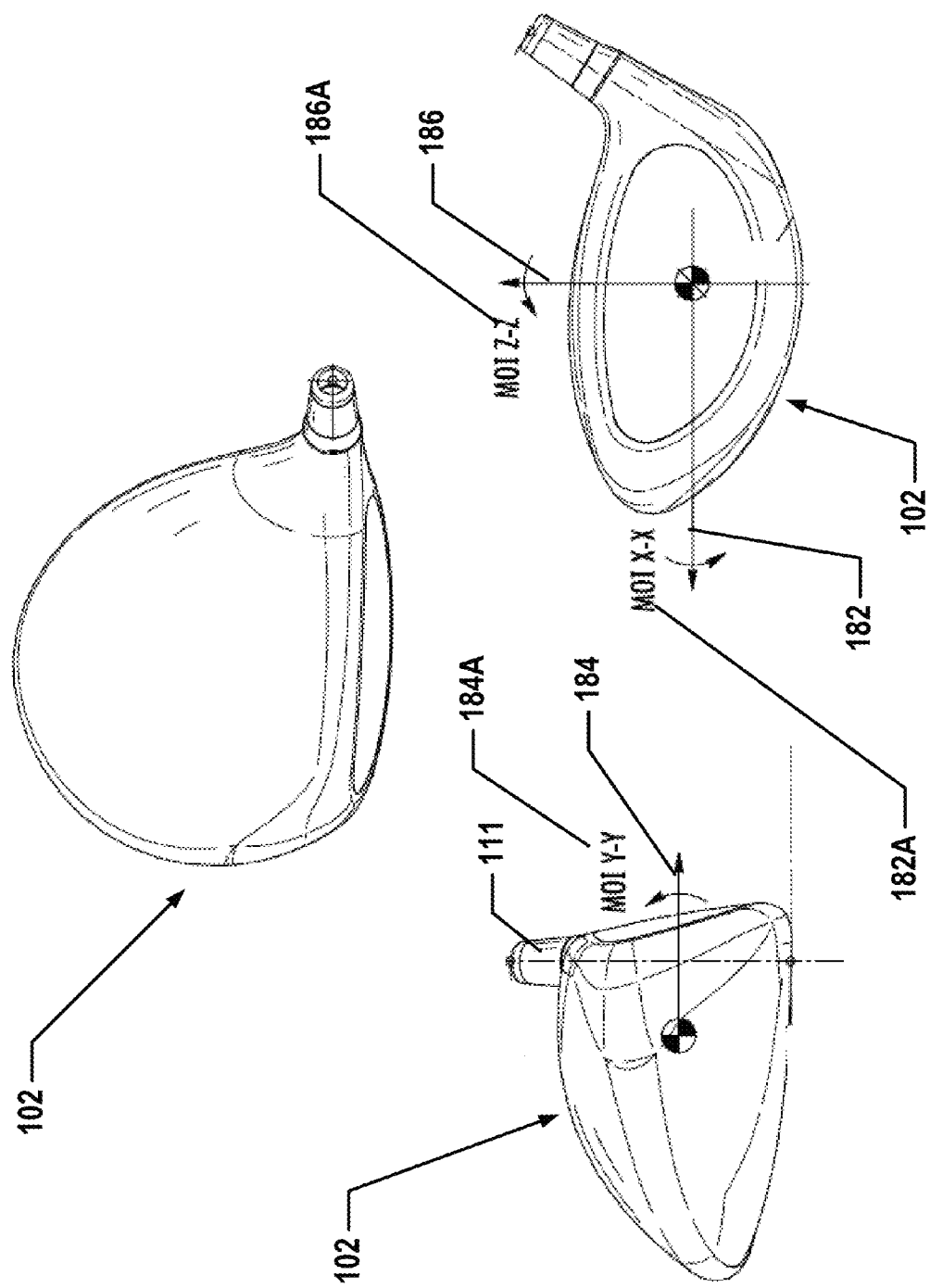

Referring to FIG. 11, another example of a specified parameter of the golf club head 102 is the moment of inertia 180 of the golf club head 102. Golf club head moments of inertia are defined about axes extending through the golf club head center of gravity 170, meaning that the moment of inertia is measured about a CG X-axis 182, a CG Y-axis 184, and a CG Z-axis 186, which is an axes coordinate system with an origin located at the center of gravity 170. As illustrated in FIG. 11, the moment of inertia 180 is defined about the center of gravity in the X, Y, and Z directions with the z axis being perpendicular to the ground plane 124, the X axis being in the heel-toe direction, and the Y axis extending in the face to back direction. MOI X-X 182A represents the moment of inertia about the X axis 182. MOI Y-Y 184A represents the moment of inertia about the Y axis 184. MOI Z-Z 186A represents the moment of inertia about the Z axis 186.

Figure 12:
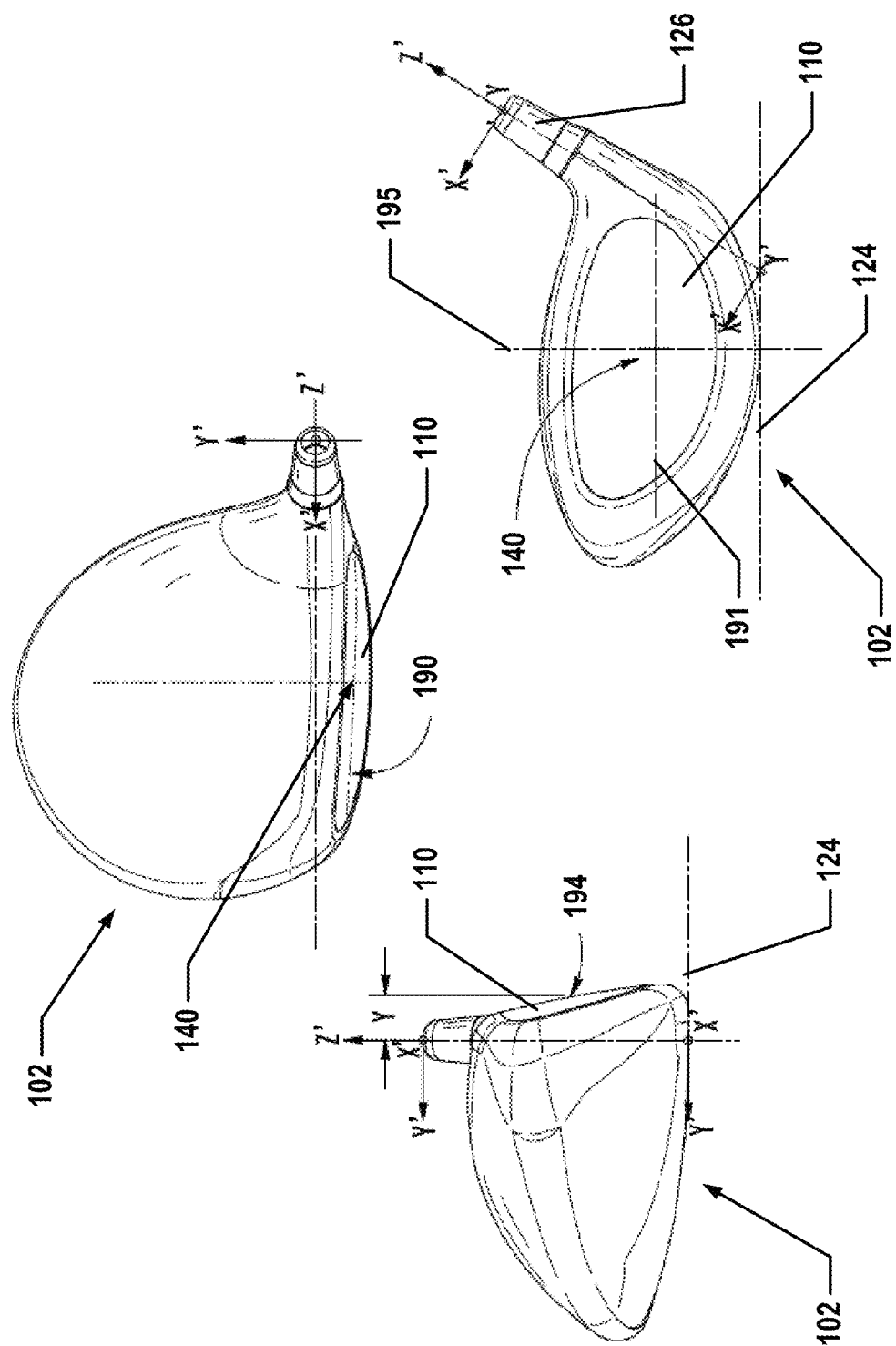
Figure 13A:
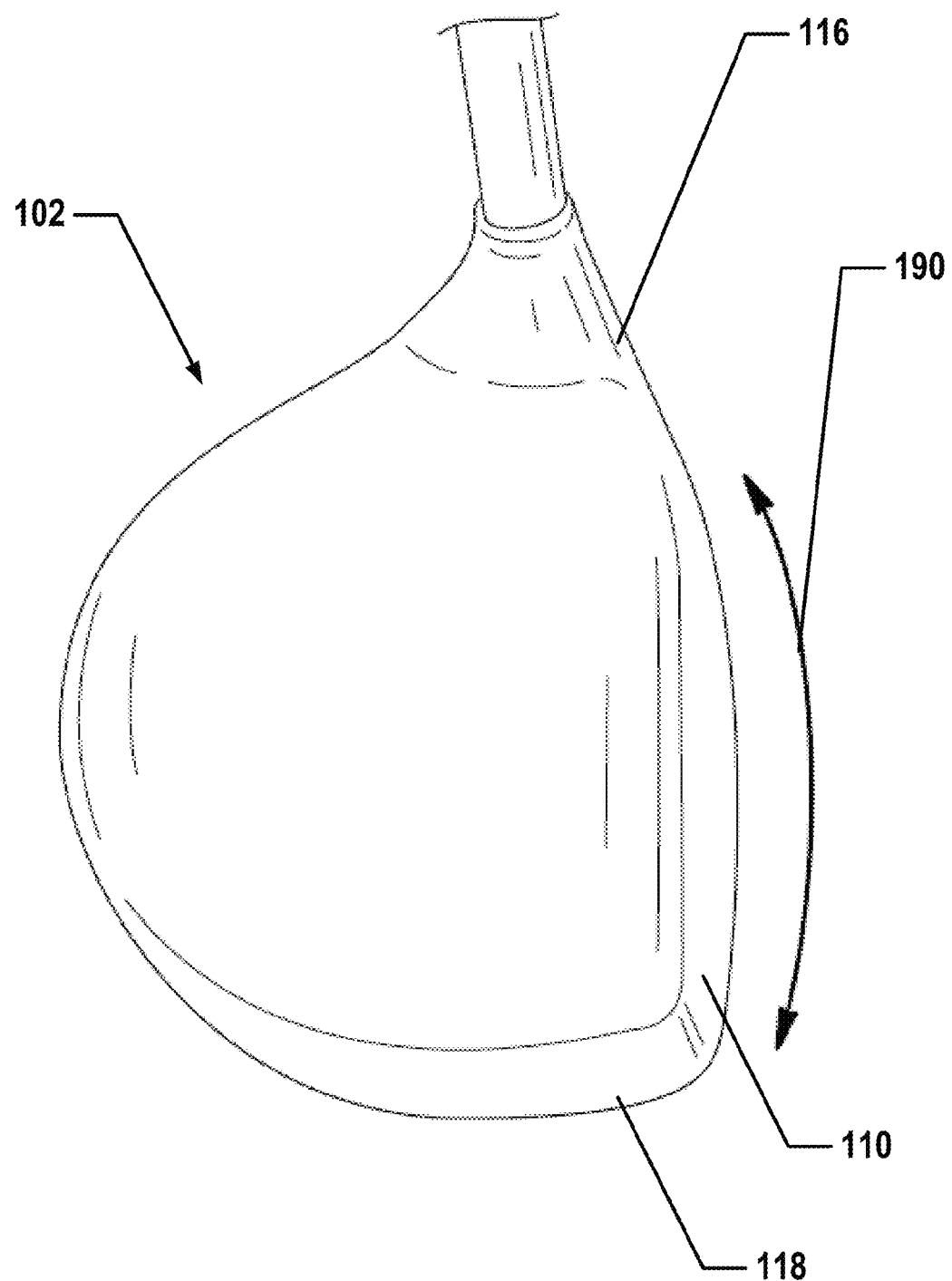
Figure 13B:
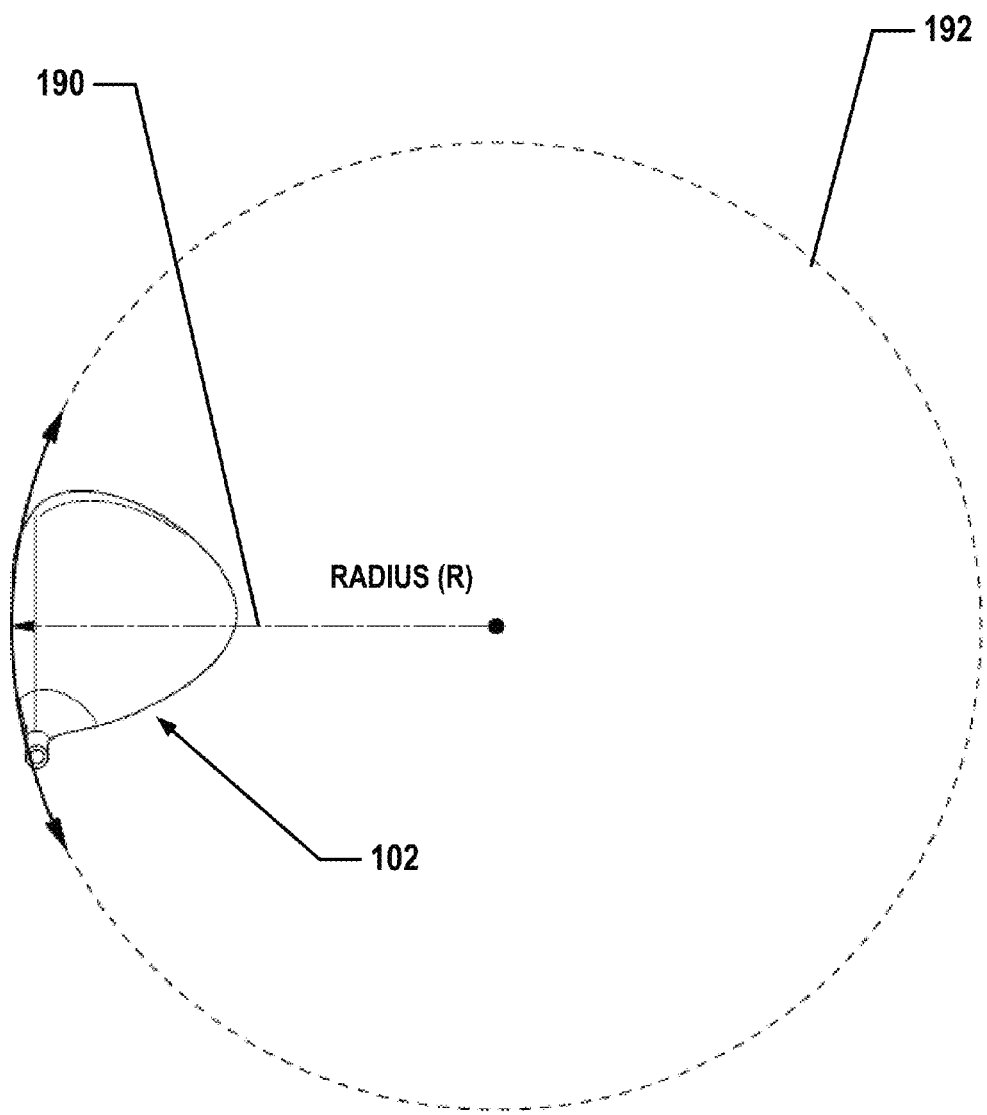

Another example of a specified parameter of a golf club head is a bulge radius or bulge curvature 190 of the golf club head 102. FIGS. 12, 13A, and 13B illustrate an example of a bulge curvature 190 as a specified parameter of a golf club head 102. The bulge curvature 190 is defined as the intersection of a bulge plane 191 and the face 110. The bulge plane 191 is defined as a plane parallel to the ground plane 124 through the face center 140. The bulge curvature 190 is the horizontal curvature of the face 110 of a wood or metal wood from the heel 116 to the toe 118. To provide an example, as illustrated in FIG. 13B, a circle 192 with a radius of R follows the bulge curvature 190 of the club head 102. The arc of that circle 192 is used to determine the measurement of the bulge curvature 190. Generally, the bulge curvature 190 may be determined by finding a best fit curve or utilizing a radius gauge to determine the bulge curvature 190 measurement. The bulge curvature 190 may be an approximate radius and not a radius per se. The bulge curvature 190 can be, for example, a compound curve, etc, that may be approximated as a radius utilizing mathematical techniques known and/or used in the art for approximating radius.

Figure 14A:
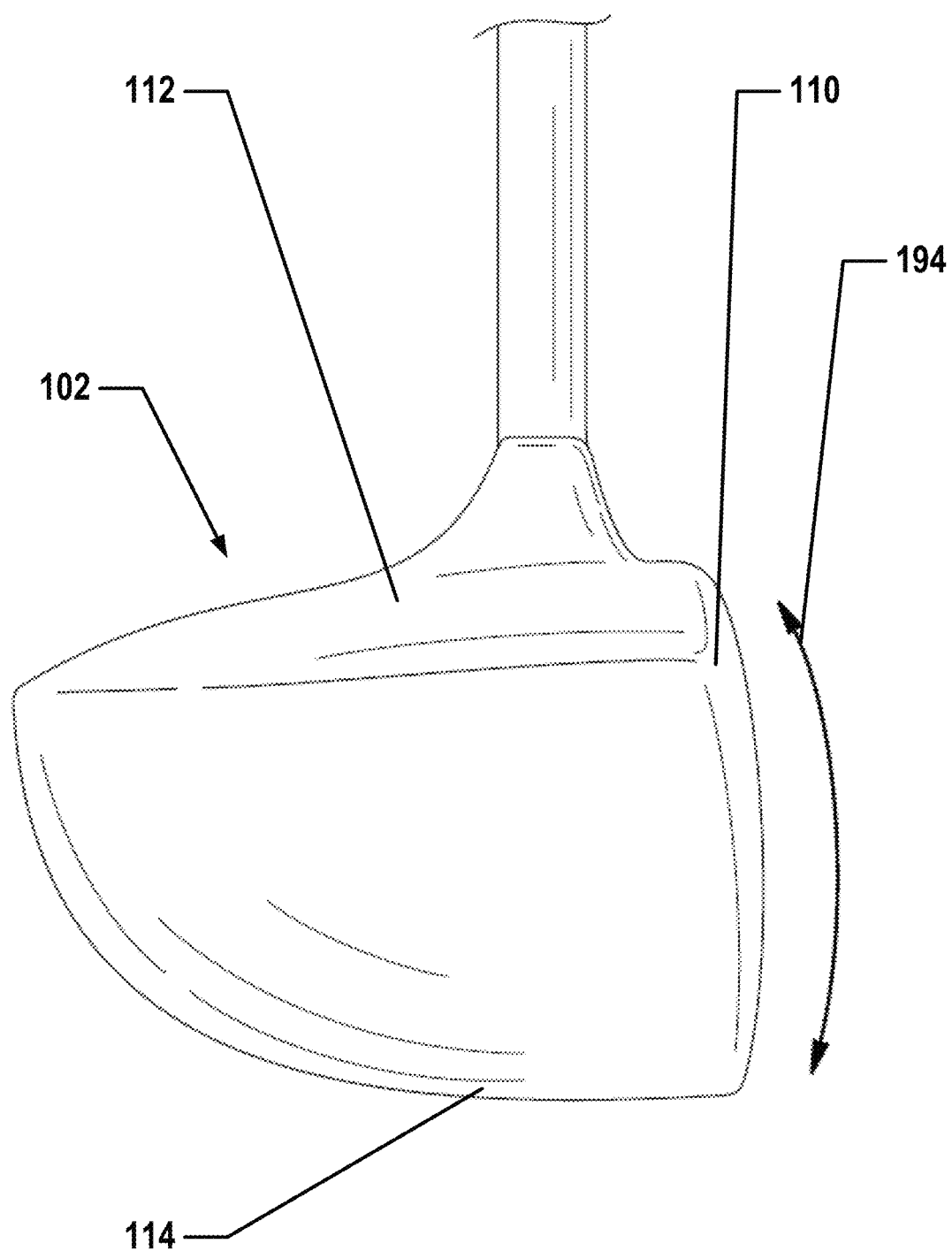
Figure 14B:
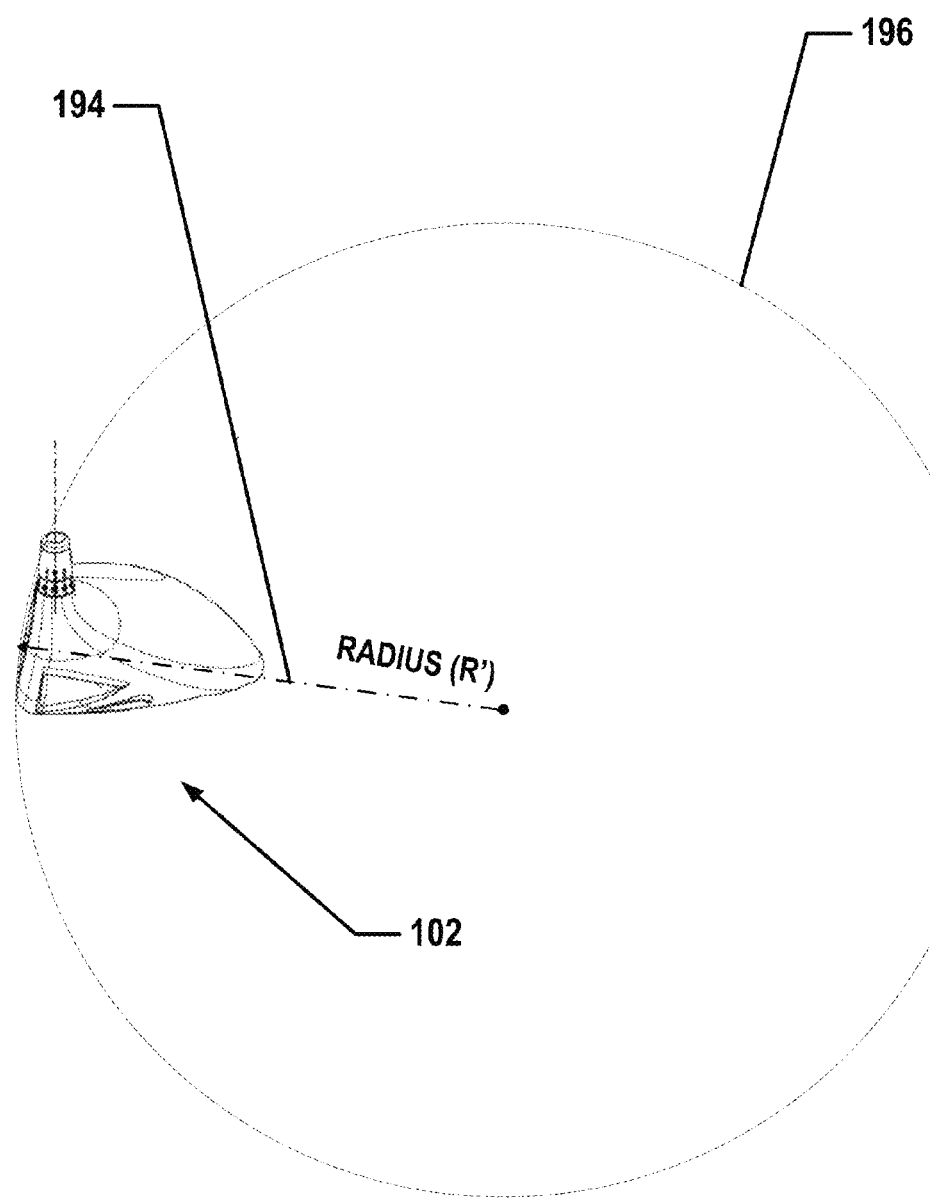

FIGS. 12 and 14 illustrate an example of a roll radius or a roll curvature 194 as a specified parameter of a golf club head 102. The roll curvature 194 is defined as the intersection of a roll plane 195 and the face 110. The roll plane 195 is defined as a plane normal to the ground plane 124 through the face center 140. The roll curvature 194 is the vertical curvature of the face 110 of a wood or metal wood from the crown 112 to the sole 114. To provide an example, as illustrated in FIG. 14B, a circle 196 with a radius R' follows the roll curvature 194 of the club head 102. The arc of that circle 196 is used to determine the measurement of the roll curvature 194. Generally, the roll curvature 194 may be determined by finding a best fit curve or utilizing a radius gauge to determine the roll curvature 194 measurement. The roll curvature 194 may be an approximate radius and not a radius per se. The roll curvature 194 can be, for example, a compound curve, etc, that may be approximated as a radius utilizing mathematical techniques known and/or used in the art for approximating radius.

Figure 15:
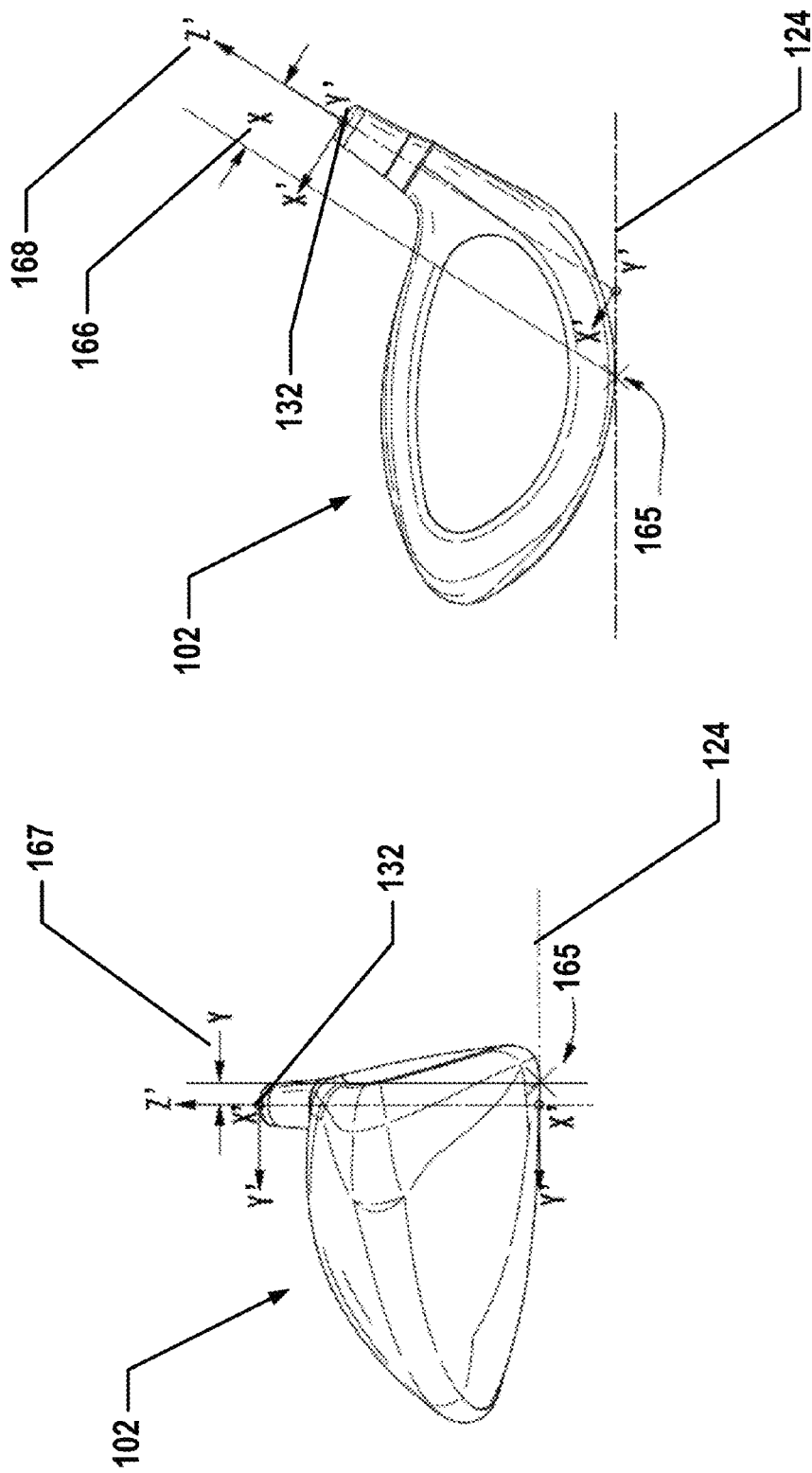

The sole contact point 165 is measured in relation to the reference position and results naturally from fixturing the golf club head 102 in the reference position. As illustrated in FIG. 15, the sole contact point 165 is that point wherein the sole of the club head 102 contacts the ground plane 124. To determine the sole contact point 165, a ground plane 124 is created by aligning a horizontal plane such that the horizontal plane intersects the lowest point on the bottom of the club head 102. As illustrated in FIG. 15, the sole contact point location 165 is defined by a distance from the origin point 132 in the X' axis 166, Y' axis 167, and Z' axis 168. Generally, the geometry of the sole 114 may yield the sole contact point 165. However, in some club models, the geometry of the sole may yield a line, wherein the sole contact point 165 may then be defined as the midpoint of that line. Additionally, in some club models, the geometry of the sole 114 may yield a 2-dimensional shape (i.e., rectangle, square, circle, oval, an irregular shape, etc.), wherein the sole contact point 165 may then be defined as the center of area of the 2-dimensional shape.

Figure 3:
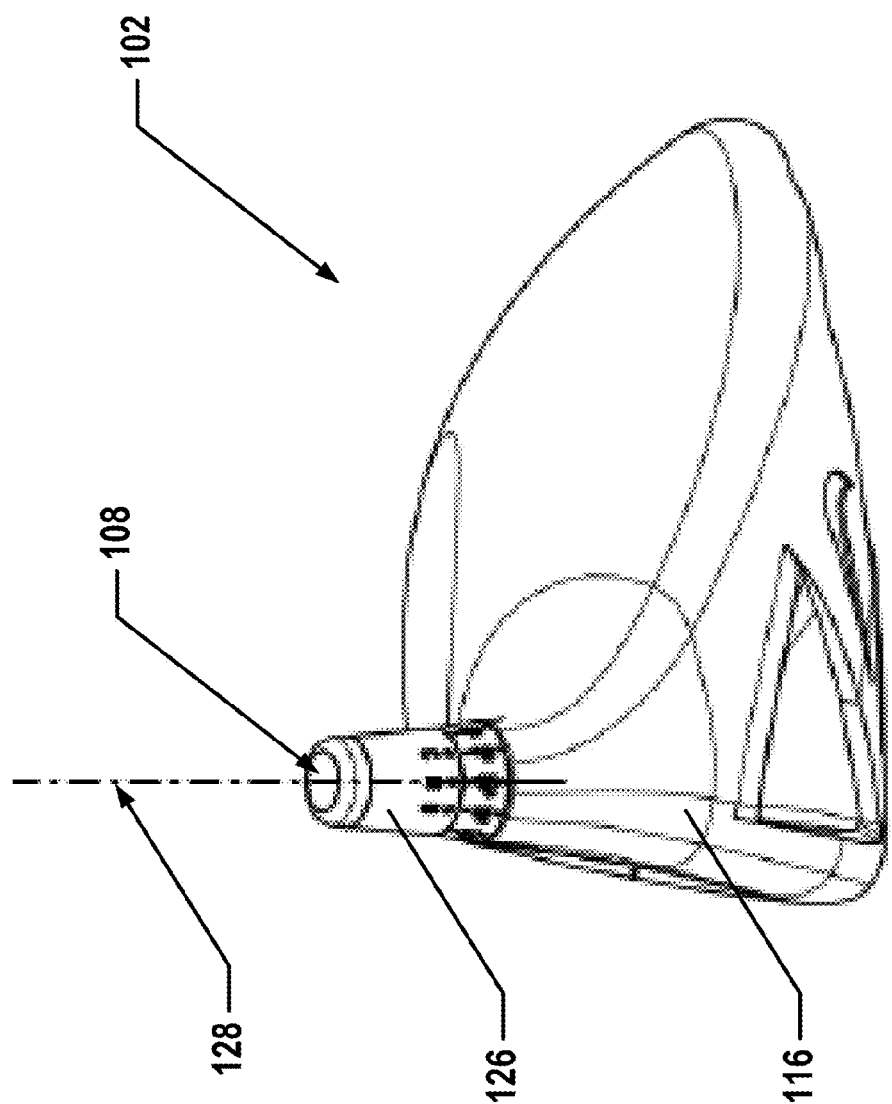

FIGS. 3-7 illustrate a golf club head 102 oriented in a reference position. In the reference position, the shaft axis 106 (and/or hosel axis 128 or shaft adapter axis 201, not shown) lies in a vertical plane as shown in FIG. 3.

As illustrated in FIGS. 2 and 4, the shaft axis 107 (and/or hosel axis 128 or shaft adapter axis 201) may be oriented at a base lie angle 130. The base lie angle selected for the reference position may be the golf club 100 manufacturer's specified lie angle. If a specified lie angle is not available from the manufacturer, a lie angle of 57-63 degrees may be used for metalwoods, depending on shaft length and/or club head geometry, as would be understood by one of ordinary skill in the art. For example, a contemporary driver-type metalwood club may be oriented at a lie angle of 60 about degrees.

As illustrated in FIGS. 7 and 8, the face may be oriented at the base loft angle 150 and base face angle 160. The base loft and face angles selected for the reference position may be the golf club manufacturer's specified loft and face angles.

Club head parameters or characteristics may be measured physically, or in a computer-aided-design (CAD) environment. Generally, if a 3 dimensional (3D) model of club head 102 is not readily available, one may be created by performing a 3D scan of the interior and exterior of a physical example of the club head 102 and creating a model file from the scan data and/or physical measurements, such that the model is substantially representative of the physical club head. In the CAD environment, the model of club head 102 may be set in the reference position with the face 110 oriented at the base face angle and/or the base loft angle within the CAD environment such that the model is fully constrained.

Figure 16A:
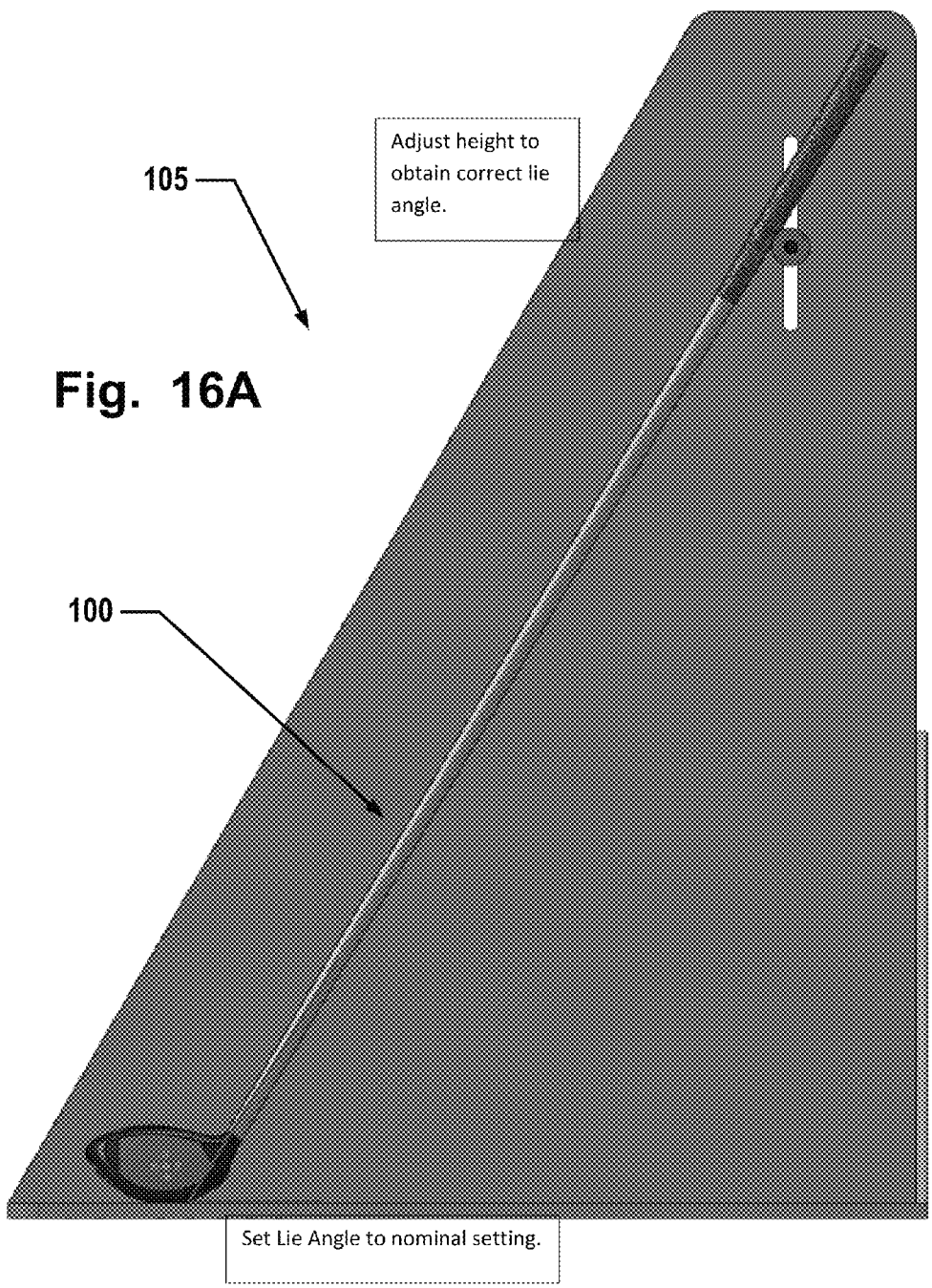
Figure 16B:
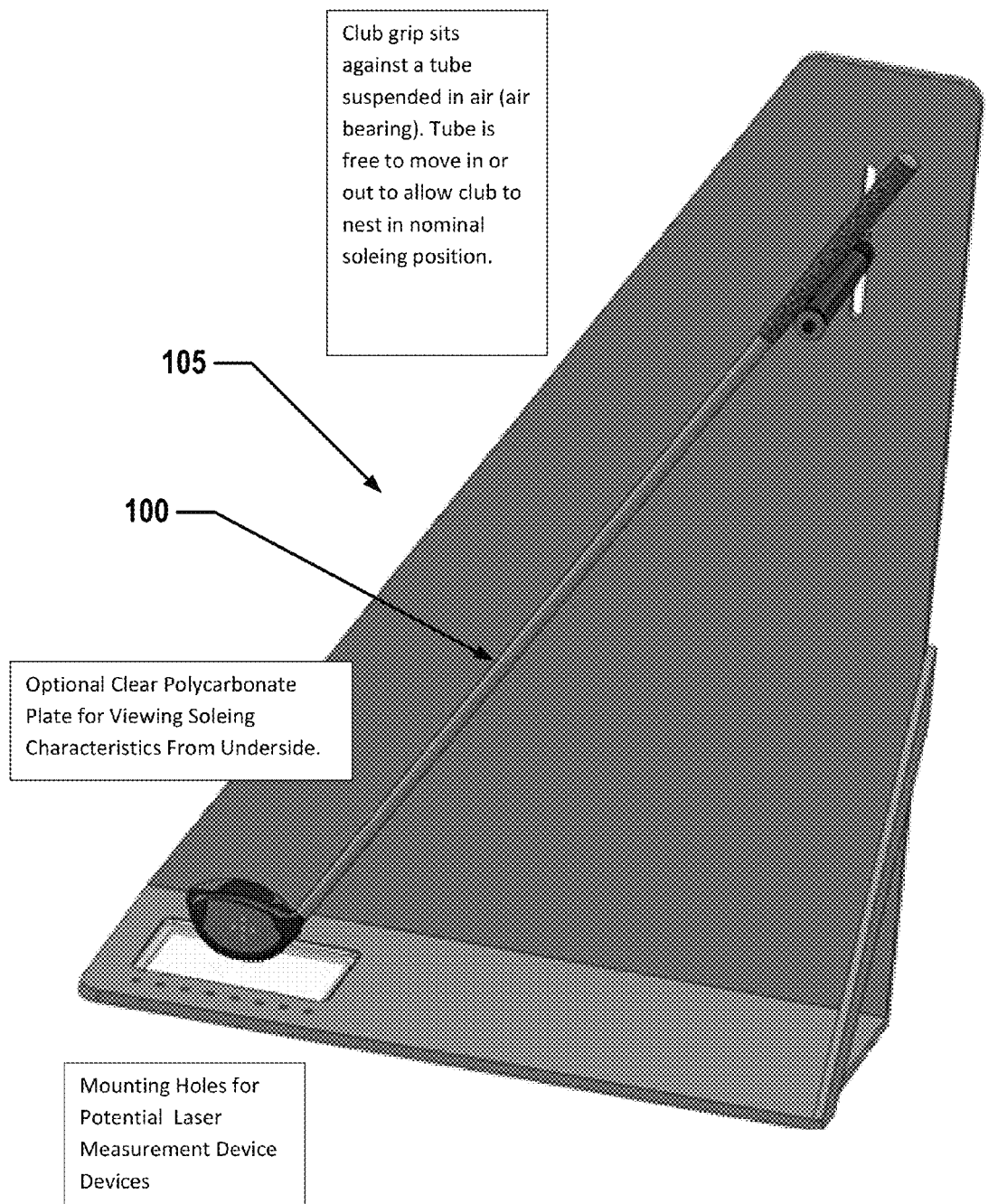

In another aspect of this invention, the golf club 100 may be physically oriented in the reference position using a fixturing system 105, for example such as shown in FIG. 16. As was described above, the shaft axis 107 (and/or hosel axis 128 and shaft adapter axis 201) may be aligned at a lie angle according to the golf club manufacturer's specification, or at an appropriate lie angle as determined by one of skill in the art. The golf club head 102 may rest with its sole 114 contacting a horizontal surface 124 with the club face 110 positioned at the base face angle and/or base loft angle using conventional loft and face angle measurement gauges known to one of skill in the art.

For adjustable club heads, which may permit adjustment of some or all club head parameters, the base position for each may be selected as a neutral position. For example, if club head 102 may be adjusted to any of 3 discrete face angles, the middle face angle may be selected (e.g., for options of −2 degrees, 0 degrees, and +2 degrees, 0 degrees may be selected). Similarly, if the face angle may be adjusted to any desired position over a finite range of positions, the middle value of the range may be selected (e.g., for a range of −2 to +2 degrees, 0 degrees may be selected). If the number of discrete position options provided for the base parameter or characteristic does not have a distinct middle (e.g., 2, 4, or 6 options), the neutral position may be one of the upper or lower value positions closest to a middle position (e.g.: the first or second position for a system with 2 discrete positions; the second or third position for a system with 4 discrete positions; etc.).

Once the base performance parameters or characteristics have been measured in the reference position, the club may be adjusted to any or all of the various available positions, and the performance parameters or characteristics may be measured in each position. To determine the position of the club head 102 at which the performance parameters may be measured in each of the various configurations available, it may be necessary to determine how the club head 102 is rotated or indexed to achieve each of the different configurations. Then, the club head 102 may be positioned within the CAD environment or fixturing system accordingly to reflect the adjustment and to perform any desired measurements.

B. Description of Adjustable Golf Club Systems and Methods

In general, aspects of this invention relate to golf clubs or golf club components incorporating adjustment members that permit ready adjustability of golf club parameters and/or interchangeability of golf club components to change a golf club configuration, and methods for providing golf clubs. Club configuration may be defined as one permutation of available options for each model, either adjustable or "designed-in" such as loft angle and/or face angle and/or lie angle and/or shaft flex and/or construction. According to aspects of this invention, an adjustment member may be utilized to allow the adjustability of a golf club parameter to change a golf club configuration, while ensuring there is substantially no change to other club or club head variables, parameters or characteristics. According to another aspect of this invention, an adjustment member may be utilized to allow the adjustability of two golf club parameters independently to change a golf club configuration, while ensuring there is substantially no change to other club or club head variables, parameters or characteristics.

As was described above, the golf club 100 may be provided with a base configuration and when oriented in the reference position, the golf club may have a set of base parameters or characteristics, such as a base loft angle, a base lie angle, a base face angle, a base center of gravity location, a base moment of inertia, etc. The adjustment member may allow a user to change one or more parameters or characteristics independently of other parameters or characteristics, while ensuring there is substantially no change to other club or club head variables, parameters or characteristics.

For example, a golf club may include a base loft angle (which could also be addressed as baseline loft angle or neutral loft angle). This base loft angle may include any loft angle appropriate for a particular golf club. For example, a driver type golf club may have a nominal base loft angle of 10.5 degrees. In another example, a fairway wood type golf club may have a nominal base loft angle of 16 degrees, while another fairway wood type golf club may have a nominal base loft angle of 20 degrees. In yet another example, a hybrid type golf club may have a nominal base loft angle of 18 degrees. Other base loft angles for various type golf clubs may be utilized without departing from this invention.

The adjustment member according to examples of this invention may allow a user to change the club loft angle from the base loft angle in discrete increments, for example 1 degree, plus a tolerance, e.g. +/−0.3 degree. For the example of the driver club with a nominal base loft angle of 10.5 degrees, the adjustment member may therefore allow the user to change the exemplary base club loft angle to 9.5 degrees or 11.5 degrees, effectively lowering or raising the loft angle by 1 degree. In another aspect, the adjustment member may allow the user to change the club loft angle from the base loft angle in discrete increments, for example up to +/−2 degrees, plus a tolerance, e.g. +−0.3 degree. The adjustment member may therefore allow the user to change the exemplary base club loft angle to 8.5 degrees, 9.5 degrees, 11.5 degrees, or 12.5 degrees, effectively lowering or raising the loft angle by 1 degree with each increment. Additionally, the adjustment member may allow the user to change the club loft angle by up to +/−4 degrees, plus a tolerance, e.g. 0.3 degree, from a reference loft angle. For example, the adjustment member may allow the user to change the nominal base loft angle to 6.5 degrees, 7.5 degrees, 8.5 degrees, 9.5 degrees, 11.5 degrees, 12.5 degrees, 13.5 degrees, or 14.5 degrees. When the loft angle is changed, there may be substantially no change (or a minimal change) [of e.g less than +/−0.3 degrees, +/−4 mm, or 15 KG/mm$^2$ when measured with respect to the reference position] to any other parameters, variables or characteristics of the golf club head or golf club, e.g., lie angle, face angle, bulge curvature, roll curvature, club head center of gravity height, moments of inertia of the club head about various axes passing through the center of gravity, etc. The adjustment member according to examples of this invention may enable a user to select from at least 3 different lofts on a single club head, while ensuring there is substantially no change to other club or club head variables, parameters or characteristics.

In another example, or in addition to the above example, a golf club may include a base face angle which may be a neutral face angle. This base face angle may include any face angle appropriate for a particular golf club. For example, a driver type golf club may have a nominal base face angle of approximately 1 degrees open or a neutral face angle, or 0 degrees. Other base face angles for various other club types may be utilized without departing from this invention.

A second adjustment member, according to examples of this invention may allow a user to change the club face angle from the base face angle in discrete increments, for example 2 degrees, plus a tolerance, e.g. +/−0.5 degree. The second adjustment member may be a separate adjustment member or integral to the first adjustment member without departing from this invention. The second adjustment member may therefore allow the user to change the exemplary base club face angle from the neutral face angle to +2 degrees open or −2 degrees closed, effectively lowering or raising the face angle by 2 degrees. Additionally, the second adjustment member may allow the user to change the club face angle by up to +/−4 degrees, plus a tolerance, e.g. 0.5 degree, from the base face angle. For example, the second adjustment member may allow the user to change the nominal base face angle from the neutral face angle to a +4 degree open face angle or a −4 degree closed face angle. When the face angle is changed, there may be substantially no change (or a minimal change) [of e.g less than +/−0.3 degrees, +/−4 mm, or 15 KG/mm$^2$ when measured with respect to the reference position] to any other parameters, variables or characteristics of the golf club head or golf club, e.g., lie angle, loft angle, bulge curvature, roll curvature, club head center of gravity height, moments of inertia of the club head about various axes passing through the center of gravity, etc. The second adjustment member according to examples of this invention may enable a user to select from at least 3 different face angles on a single club head, while ensuring there is substantially no change to other club or club head variables, parameters or characteristics.

As was discussed above, an adjustment member and/or a second adjustment member may be utilized to change one or two parameters or characteristics independently of other parameters or characteristics, while ensuring there is substantially no change to other club or club head variables, parameters, or characteristics, such as center of gravity location, face center location, sole contact point, moment of inertia, bulge curvature, and roll curvature. While each of these parameters may not substantially change, there may be a tolerance level or minimal change for these parameters when measured with respect to their reference position or value. This minimal change may be represented by various methods, such as percentage change, or value change.

For example, when one or two parameters are changed (such as loft angle and/or face angle), the moment of inertia may change minimally from the reference moment of inertia. This minimal change in the moment of inertia may be represented by a MOI tolerance value or an MOI tolerance percentage. In one aspect of the invention, the MOI tolerance value may be 10.0 KG-mm² or less about any of the axes when one or two parameters are changed. In another aspect of the invention, the MOI tolerance value may be 15.0 KG-mm² or less about any of the axes when one or two parameters are changed. In another aspect of the invention, the MOI tolerance percentage may be 2% or less about any of the axes when one or two parameters are changed. In another aspect of the invention, the MOI tolerance percentage may be 4% or less about any of the axes when one or two parameters are changed.

Additionally, as was discussed above, an adjustment member and/or a second adjustment member may be utilized to change one or two parameters or characteristics independently of other parameters or characteristics, while ensuring there is substantially no change or minimal change to other club or club head variables, parameters, or characteristics. For the specific location parameters (such as center of gravity location, face center location, and sole contact point location), the minimal change may be represented by a 3-dimensional tolerance sphere for these specific locations. The tolerance sphere may be in the form of an actual sphere equation as defined below:

$$(x-Xo)^2+(y-Yo)^2+(z-Zo)^2=r^2$$

Wherein: Xo, Yo, and Zo is the center of the sphere and r is the radius of the sphere.

For example, when one or two parameters are changed (such as loft angle and/or face angle), the location of the center of gravity may change minimally from the reference center of gravity location. This minimal change in the center of gravity location will be maintained within the area defined by the center of gravity tolerance sphere. In one aspect of the invention, the radius of the center of gravity tolerance sphere will be approximately 1 mm, wherein the minimal change of the center of gravity location when one or two parameters are changed will be no greater than 1 mm away in any direction from the center of the sphere or the reference center of gravity location. In another aspect of the invention, the radius of the center of gravity tolerance sphere will be approximately 2 mm, wherein the minimal change of the center of gravity location when one or two parameters are changed will be no greater than 2 mm away in any direction from the center of the sphere or the reference center of gravity location. In another aspect of the invention, the radius of the center of gravity tolerance sphere will be approximately 4 mm, wherein the minimal change of the center of gravity location when one or two parameters are changed will be no greater than 4 mm away in any direction from the center of the sphere or the reference center of gravity location.

Additionally, when one or two parameters are changed (such as loft angle or face angle), the location of the face center may change minimally from the reference face center location. This minimal change in the face center location will be maintained within the area defined by the face center tolerance sphere. In one aspect of the invention, the radius of the face center tolerance sphere will be approximately 1 mm, wherein the minimal change of the face center location when one or two parameters are changed will be no greater than 1 mm away in any direction from the center of the sphere or the reference face center location. In another aspect of the invention, the radius of the face center tolerance sphere will be approximately 2 mm, wherein the minimal change of the face center location when one or two parameters are changed will be no greater than 2 mm away in any direction from the center of the sphere or the reference face center location. In another aspect of the invention, the radius of the face center tolerance sphere will be approximately 4 mm, wherein the minimal change of the face center location when one or two parameters are changed will be no greater than 4 mm away in any direction from the center of the sphere or the reference face center location.

Additionally, when one or two parameters are changed (such as loft angle or face angle), the location of the sole contact point may change minimally from the reference sole contact point location. This minimal change in the sole contact point location will be maintained within the area defined by the sole contact point tolerance sphere. In one aspect of the invention, the radius of the sole contact point tolerance sphere will be approximately 1 mm, wherein the minimal change of the sole contact point location when one or two parameters are changed will be no greater than 1 mm away in any direction from the center of the sphere or the reference sole contact point location. In another aspect of the invention, the radius of the sole contact point tolerance sphere will be approximately 2 mm, wherein the minimal change of the sole contact point location when one or two parameters are changed will be no greater than 2 mm away in any direction from the center of the sphere or the reference sole contact point location. In another aspect of the invention, the radius of the sole contact point tolerance sphere will be approximately 4 mm, wherein the minimal change of the sole contact point location when one or two parameters are changed will be no greater than 4 mm away in any direction from the center of the sphere or the reference sole contact point location.

Figure 17:
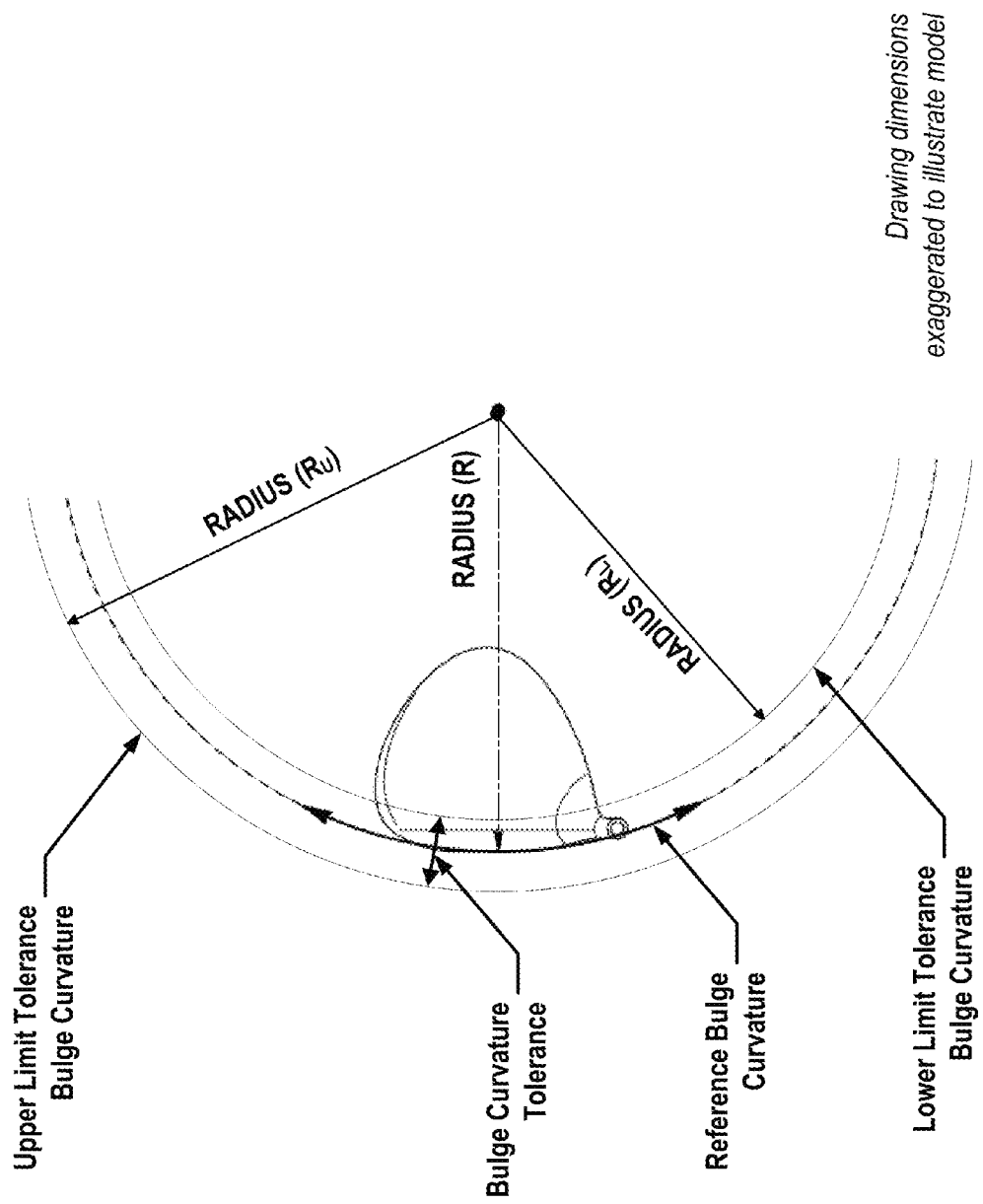
Figure 18:
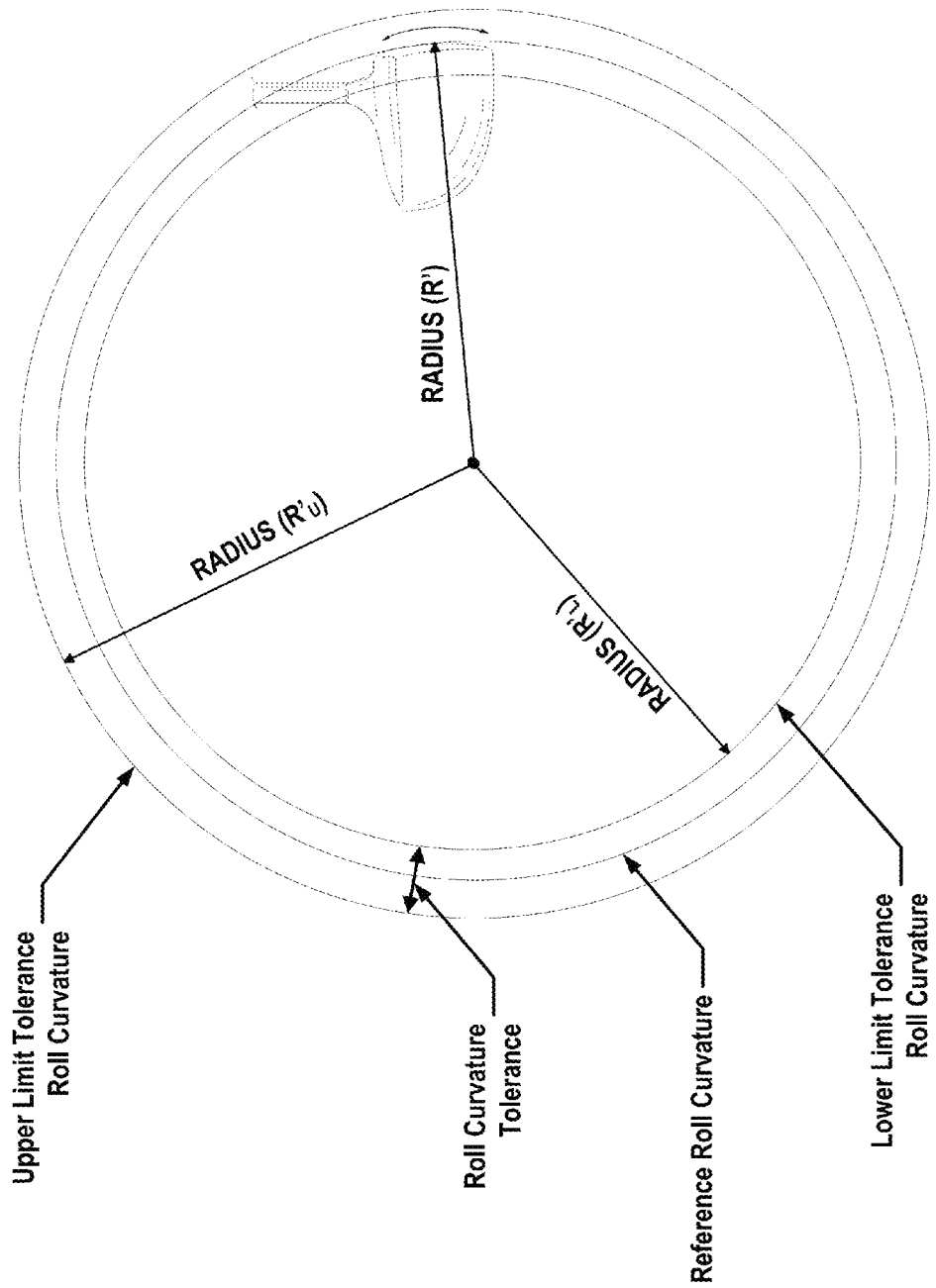

Furthermore, as was discussed above, an adjustment member and/or a second adjustment member may be utilized to change one or two parameters or characteristics independently of other parameters or characteristics, while ensuring there is substantially no change or minimal change to other club or club head variables, parameters, or characteristics. For bulge curvature and roll curvature, the minimal change may be represented by a 2-dimensional curvature tolerance. As illustrated in FIGS. 17 and 18, the curvature tolerance may be defined by the space created by the difference of two different circles. One circle may be defined as the lower limit tolerance radius circle and the other circle may be defined as the upper limit tolerance radius circle. Each of the two circles may be represented by an actual circle equation as defined below:

$$(x-Xo)^2+(y-Yo)^2=r^2$$

Wherein: Xo and Yo is the center of the circle and r is the radius of the circle (or the bulge curvature/roll curvature).

Therefore, the tolerance curvature may be calculated by subtracting the upper limit circle equation from the lower limit circle equation, wherein the upper limit circle is defined as:

$$(x_U-Xo)^2+(y_U-Yo)^2=r_U^2$$

Wherein: Xo and Yo is the center of the circle and $x_U$ and $y_U$ and $r_U$ are coordinates and the radius of the upper limit tolerance circle.

$$[(x_L-Xo)^2+(y_L-Yo)^2]=r_L^2$$

Wherein: Xo and Yo is the center of the circle and $x_L$ and $y_L$ and $r_L$ are coordinates and the radius of the lower limit tolerance circle.

The curvature tolerance may be defined as located between the upper limit tolerance radius and the lower limit tolerance radius. FIGS. 17 and 18 illustrate the bulge curvature tolerance and the roll curvature tolerance respectively. Generally, the minimal change in the bulge curvature and the roll curvature during various adjustments will be maintained within the area defined by the upper limit tolerance radius and the lower limit tolerance radius, or within the curvature tolerance.

For example, when one or two parameters are changed (such as loft angle and/or face angle), the bulge curvature may change minimally from the reference bulge curvature between the upper limit radius and the lower limit radius. This minimal change in the bulge curvature will be maintained within the area defined by the bulge curvature tolerance. In one aspect of the invention, the bulge curvature tolerance will be approximately 2.5 mm, wherein the minimal change of the bulge curvature when one or two parameters are changed will be within the 2.5 mm bulge curvature tolerance for the reference bulge curvature. In another aspect of the invention, the bulge curvature tolerance will be approximately 5 mm, wherein the minimal change of the bulge curvature when one or two parameters are changed will be within the 5 mm bulge curvature tolerance for the reference bulge curvature.

Additionally, when one or two parameters are changed, the roll curvature may change minimally from the reference roll curvature between the upper limit radius and the lower limit radius. This minimal change in the roll curvature will be maintained within the area defined by the roll curvature tolerance. In one aspect of the invention, the roll curvature tolerance will be approximately 2.5 mm, wherein the minimal change of the roll curvature when one or two parameters are changed will be within the 2.5 mm roll curvature tolerance for the reference roll curvature. In another aspect of the invention, the roll curvature tolerance will be approximately 5 mm, wherein the minimal change of the roll curvature when one or two parameters are changed will be within the 5 mm roll curvature tolerance for the reference roll curvature.

Figure 19A:
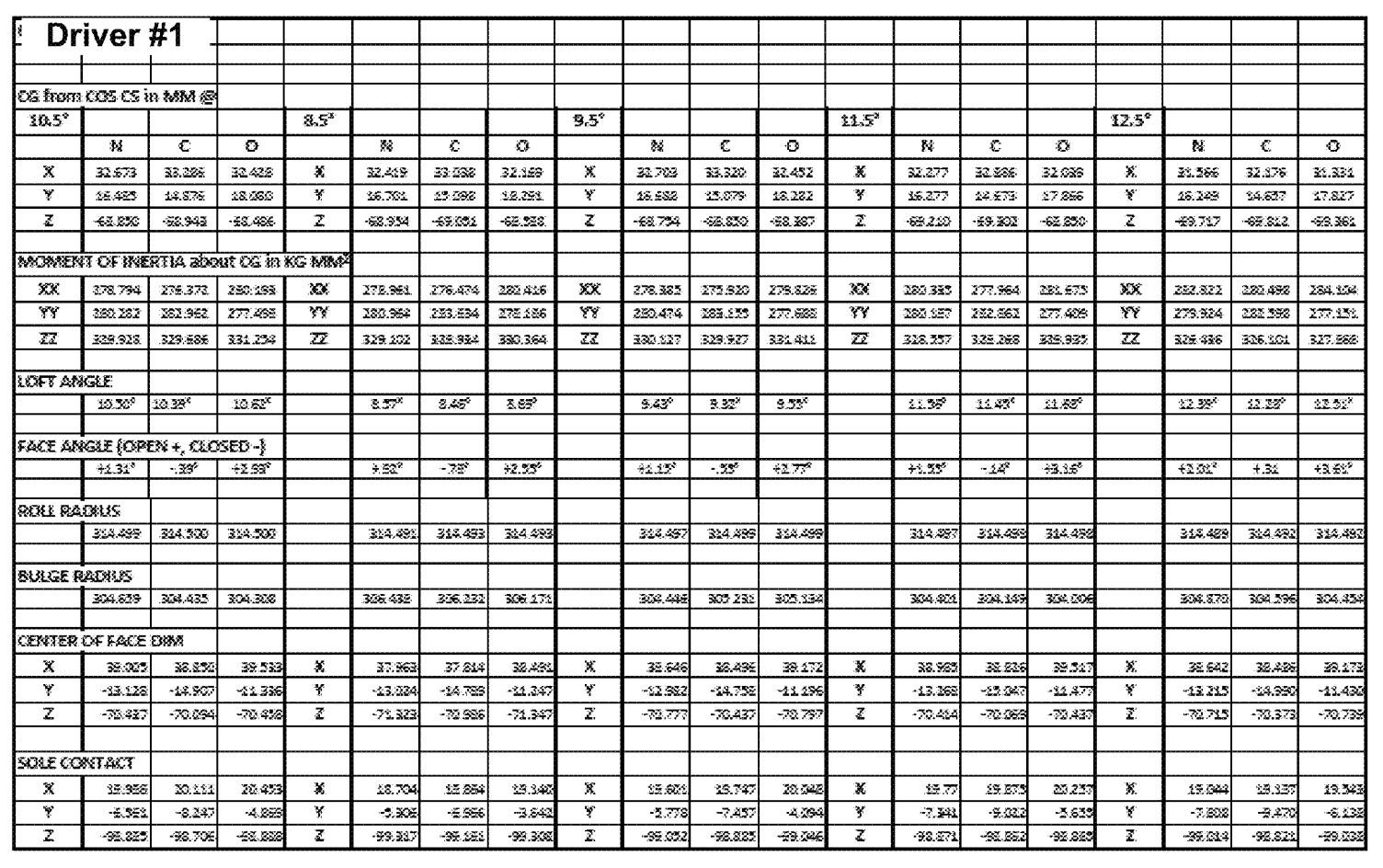

FIG. 19A illustrates an example set of tolerance data for a given driver golf club head. The below set of data/information is illustrated for a club head with a neutral club face angle and changing only the loft angle. The below data is referenced from the table illustrated in FIG. 19A. With this club head in a reference or base position, the reference or base loft angle is at 10.5 degrees. The club head may be adjusted utilizing the adjustment member to five different positions. In this given example, the available positions will be represented by different loft angles, wherein the loft angle may be adjusted to 8.5, 9.5, 10.5, 11.5, and 12.5 degrees. The below tables represents the maximum tolerances for each of the performance parameters through each of the five various configurations as determined utilizing the process as described and detailed above.

TABLE 1A

Driver #1 (C1) Tolerance Levels - Loft Angle Adjustment
Driver #1 (C1) (Data taken from FIG. 19A)
Loft Angle Changes (1 variable independently changed)

| MOI - Tolerances | MOI | % from Reference |
|---|---|---|
| Tolerance of MOI about the X-Axis | 4.4 KG-mm$^2$ | 1.6% |
| Tolerance of MOI about the Y-Axis | 1.0 KG-mm$^2$ | 0.4% |
| Tolerance of MOI about the Z-Axis | 3.7 KG-mm$^2$ | 1.1% |
| Center of Gravity Tolerance Sphere | | |

$(x - 32.1)^2 + (y - 16.5)^2 + (z - (-69.2))^2 = (0.6)^2$
Tolerance Sphere - located at (32.1, 16.5, −69.2) with a radius of 0.6 mm TABLE 1A-continued Driver #1 (C1) Tolerance Levels - Loft Angle Adjustment
Driver #1 (C1) (Data taken from FIG. 19A)
Loft Angle Changes (1 variable independently changed)

| MOI - Tolerances | MOI | % from Reference |
|---|---|---|
| Face Center Tolerance Sphere | | |

$(x - 38.5)^2 + (y - (-13.1))^2 + (z - (-70.9))^2 = (0.5)^2$
Tolerance Sphere - located at (38.5, −13.1, −70.9) with a radius of 0.5 mm
Sole Contact Point Tolerance Sphere $(x - 19.3)^2 + (y - (-6.6))^2 + (z - (-99.1))^2 = (1.3)^2$
Tolerance Sphere - located at (19.1, −6.6, −99.1) with a radius of 1.3 mm

| Bulge Curvature | | |
|---|---|---|
| Maximum Bulge Curvature | 306.4 mm | |
| Minimum Bulge Curvature | 304.4 mm | |
| Bulge Curvature Tolerance | 2.0 mm | 0.7% |
| Roll Curvature | | |
| Maximum Roll Curvature | 314.5 mm | |
| Minimum Roll Curvature | 314.5 mm | |
| Roll Curvature Tolerance | 0.0 mm | 0.0% |
| Face Angle | | |
| Tolerance of Face Angle | 1.1° | |

The below set of data/information is illustrated for a club head changing both the loft angle and the face angle. The below data is referenced from the table illustrated in FIG. 19A. With this club head in a reference or base position, the reference or base loft angle is at 10.5 degrees and the nominal face angle has a neutral position of approximately 1 degree open (or a neutral face angle of 0 degrees). The club head may be adjusted utilizing the adjustment member to fifteen different positions. In this given example, the loft angle may be adjusted to 8.5, 9.5, 10.5, 11.5, and 12.5. In this given example, the face angle may be adjusted from the neutral position to open and closed position (adjusting the face angle approximately 1-1.5 degrees each direction). The below tables represents the maximum tolerances for each of the performance parameters through each of the five various configurations (five loft adjustment positions by three face angle adjustment positions) as determined utilizing the process as described and detailed above.

TABLE 1B

Driver #1 (C1) Tolerance Levels - Loft and Face Angle Adjustment
Driver #1 (C1) (Data taken from FIG. 19A)
Loft Angle and Face Angle Changes (2 variables independently changed)

| MOI - Tolerances | MOI | % from Reference |
|---|---|---|
| Tolerance of MOI about the X-Axis | 8.2 KG-mm$^2$ | 2.9% |
| Tolerance of MOI about the Y-Axis | 6.5 KG-mm$^2$ | 2.3% |
| Tolerance of MOI about the Z-Axis | 5.3 KG-mm$^2$ | 1.6% |
| Center of Gravity Tolerance Sphere | | |

$(x - 32.3)^2 + (y - 16.5)^2 + (z - (-69.1))^2 = (1.8)^2$
Tolerance Sphere - located at (32.1, 16.5, −69.2) with a radius of 0.6 mm
Face Center Tolerance Sphere $(x - 38.7)^2 + (y - (-13.1))^2 + (z - (-70.7))^2 = (2.0)^2$
Tolerance Sphere - located at (38.7, −13.1, −70.7) with a radius of 2.0 mm
Sole Contact Point Tolerance Sphere $(x - 19.6)^2 + (y - (-6.6))^2 + (z - (-99.0))^2 = (2.9)^2$
Tolerance Sphere - located at (19.6, −6.6, −99.0) with a radius of 2.9 mm TABLE 1B-continued Driver #1 (C1) Tolerance Levels - Loft and Face Angle Adjustment
Driver #1 (C1) (Data taken from FIG. 19A)
Loft Angle and Face Angle Changes (2 variables independently changed)

| MOI - Tolerances | MOI | % from Reference |
|---|---|---|
| Bulge Curvature | | |
| Maximum Bulge Curvature | 306.4 mm | |
| Minimum Bulge Curvature | 304.0 mm | |
| Bulge Curvature Tolerance | 2.4 mm | 0.8% |
| Roll Curvature | | |
| Maximum Roll Curvature | 314.5 mm | |
| Minimum Roll Curvature | 314.5 mm | |
| Roll Curvature Tolerance | 0.0 mm | 0.0% |

Figure 19B:
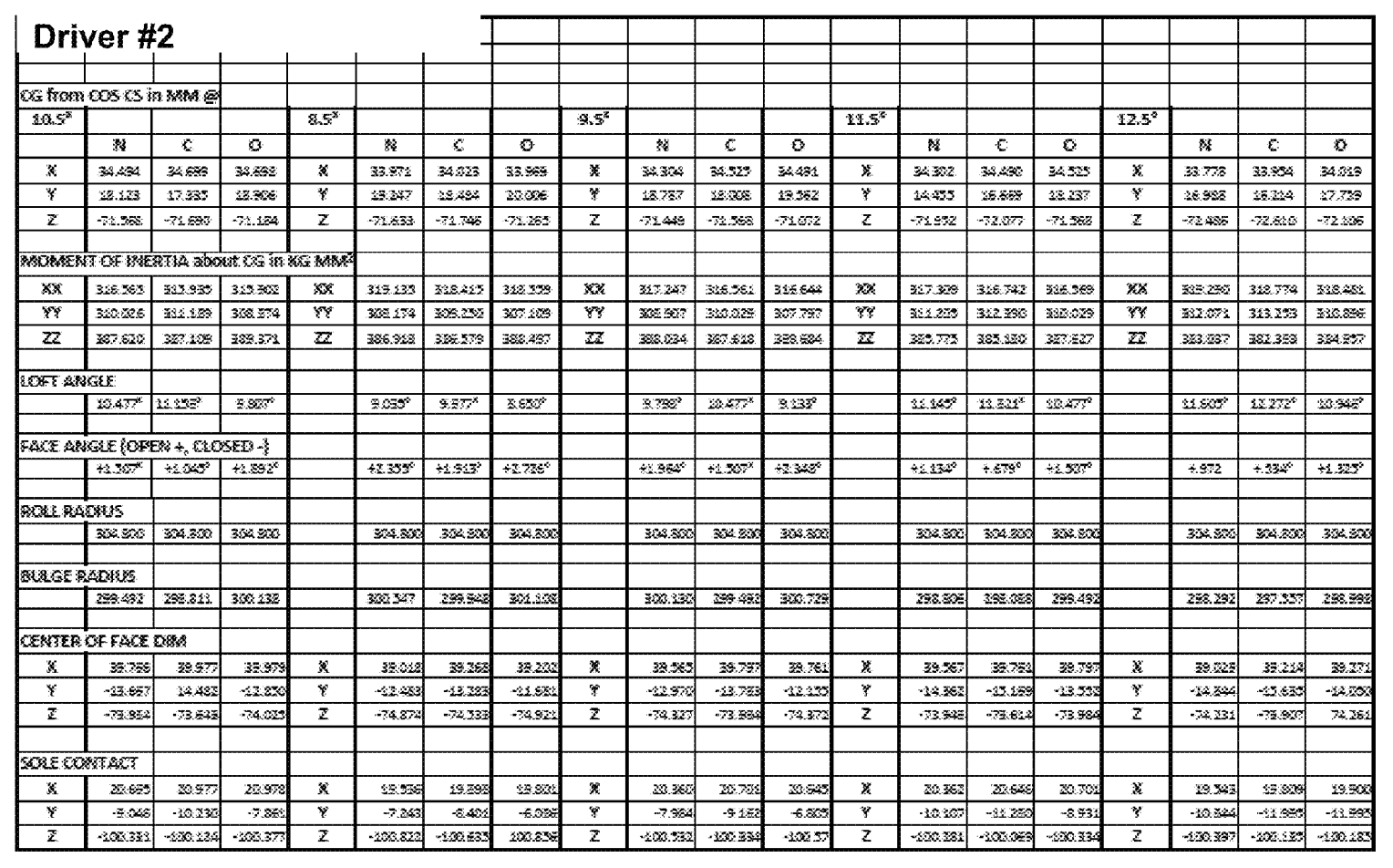

FIG. 19B illustrates an example set of tolerance data for another given driver golf club head representing a different model incorporating the above principles. The below set of data/information is illustrated for a club head with a neutral club face angle and changing only the loft angle. The below data is referenced from the table illustrated in FIG. 19B. With this club head in a reference or base position, the reference or base loft angle is at 10.5 degrees. The club head may be adjusted utilizing the adjustment member to five different positions. In this given example, the available positions will be represented by different loft angles, wherein the loft angle may be adjusted to 8.5, 9.5, 10.5, 11.5, and 12.5 degrees. The below tables represents the maximum tolerances for each of the performance parameters through each of the five various configurations as determined utilizing the process as described and detailed above.

TABLE 2A

Driver #2 (C2) Tolerance Levels - Loft Angle Adjustment
Driver #2 (C2) (Data taken from FIG. 19B)
Loft Angle Changes (1 variable independently changed)

| MOI - Tolerances | MOI | % from Reference |
|---|---|---|
| Tolerance of MOI about the X-Axis | 2.7 KG-mm² | 0.9% |
| Tolerance of MOI about the Y-Axis | 3.9 KG-mm² | 1.3% |
| Tolerance of MOI about the Z-Axis | 5.0 KG-mm² | 1.3% |
| Center of Gravity Tolerance Sphere | | |

$(x - 34.1)^2 + (y - 16.9)^2 + (z - (-72.0))^2 = (2.4)^2$
Tolerance Sphere - located at (34.1, 16.9, −72.0) with a radius of 2.4 mm
Face Center Tolerance Sphere $(x - 39.4)^2 + (y - (-13.7))^2 + (z - (-74.4))^2 = (1.2)^2$
Tolerance Sphere - located at (39.4, −13.7, −74.4) with a radius of 1.2 mm
Sole Contact Point Tolerance Sphere $(x - 20.1)^2 + (y - (-9.0))^2 + (z - (-100.6))^2 = (1.8)^2$
Tolerance Sphere - located at (20.1, −9.0, −100.6) with a radius of 1.8 mm
Bulge Curvature

| Maximum Bulge Curvature | 300.5 mm | |
| Minimum Bulge Curvature | 298.3 mm | |
| Bulge Curvature Tolerance | 2.2 mm | 0.8% |
| Roll Curvature | | |
| Maximum Roll Curvature | 304.8 mm | |
| Minimum Roll Curvature | 304.8 mm | |
| Roll Curvature Tolerance | 0.0 mm | 0.0% |

TABLE 2A-continued

Driver #2 (C2) Tolerance Levels - Loft Angle Adjustment
Driver #2 (C2) (Data taken from FIG. 19B)
Loft Angle Changes (1 variable independently changed)

| MOI - Tolerances | MOI | % from Reference |
|---|---|---|
| Face Angle | | |
| Tolerance of Face Angle | 1.4° | |

The below set of data/information is illustrated for a club head changing both the loft angle and the face angle. The below data is referenced from the table illustrated in FIG. 19B. With this club head in a reference or base position, the reference or base loft angle is at 10.5 degrees and the nominal face angle has a neutral position of approximately 1 degree open (or a neutral face angle of 0 degrees). The club head may be adjusted utilizing the adjustment member to fifteen different positions. In this given example, the loft angle may be adjusted to 8.5, 9.5, 10.5, 11.5, and 12.5. In this given example, the face angle may be adjusted from the neutral position to open and closed positions (adjusting the face angle approximately 1-1.5 degrees in each direction). The below tables represents the maximum tolerances for each of the performance parameters through each of the five various configurations (five loft adjustment positions by three face angle adjustment positions) as determined utilizing the process as described and detailed above.

TABLE 2B

Driver #2 (C2) Tolerance Levels - Loft and Face Angle Adjustment
Driver #2 (C2) (Data taken from FIG. 19B)
Loft Angle and Face Angle Changes (2 variables independently changed)

| MOI - Tolerances | MOI | % from Reference |
|---|---|---|
| Tolerance of MOI about the X-Axis | 3.4 KG-mm² | 1.1% |
| Tolerance of MOI about the Y-Axis | 6.1 KG-mm² | 2.0% |
| Tolerance of MOI about the Z-Axis | 7.3 KG-mm² | 1.9% |
| Center of Gravity Tolerance Sphere | | |

$(x - 34.2)^2 + (y - 17.2)^2 + (z - (-71.8))^2 = (2.8)^2$
Tolerance Sphere - located at (34.2, 17.2, −71.8) with a radius of 2.8 mm
Face Center Tolerance Sphere $(x - 39.5)^2 + (y - (-13.7))^2 + (z - (-74.3))^2 = (2.0)^2$
Tolerance Sphere - located at (39.5, −13.7, −74.3) with a radius of 2.0 mm
Sole Contact Point Tolerance Sphere $(x - 20.3)^2 + (y - (-9.0))^2 + (z - (-100.5))^2 = (3.0)^2$
Tolerance Sphere - located at (20.3, −9.0, −100.5) with a radius of 3.0 mm
Bulge Curvature

| Maximum Bulge Curvature | 301.1 mm | |
| Minimum Bulge Curvature | 297.6 mm | |
| Bulge Curvature Tolerance | 3.5 mm | 1.2% |
| Roll Curvature | | |
| Maximum Roll Curvature | 304.8 mm | |
| Minimum Roll Curvature | 304.8 mm | |
| Roll Curvature Tolerance | 0.0 mm | 0.0% |

Figure 19C:
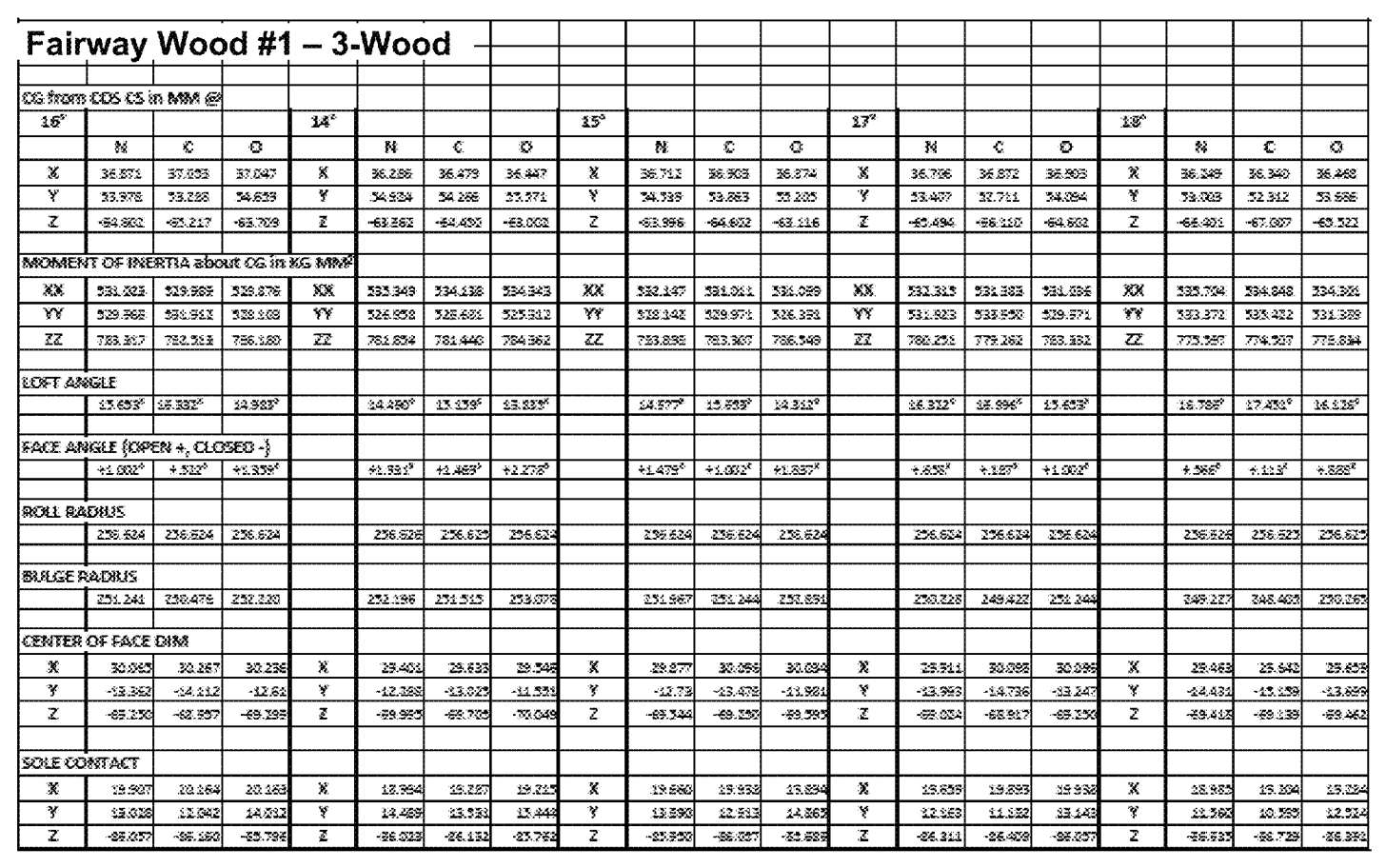

FIG. 19C illustrates an example set of tolerance data for a given fairway wood club head, for example a three-wood. The below set of data/information is illustrated for a club head with a neutral club face angle and changing only the loft angle. The below data is referenced from the table illustrated in FIG. 19C. With this club head in a reference or base position, the reference or base loft angle is at 16 degrees. The club head may be adjusted utilizing the adjustment member to five different positions. In this given example, the available positions will be represented by different loft angles, wherein the loft angle may be adjusted to 14, 15, 16, 17, and 18 degrees. The below tables represents the maximum tolerances for each of the performance parameters through each of the five various configurations as determined utilizing the process as described and detailed above.

TABLE 3A

Fairway Wood #1 (3-Wood) Tolerance Levels - Loft Angle Adjustment
Fairway Wood #1 (Three-wood) (Data taken from FIG. 19C)
Loft Angle Changes (1 variable independently changed)

| MOI - Tolerances | MOI | % from Reference |
|---|---|---|
| Tolerance of MOI about the X-Axis | 4.7 KG-mm$^2$ | 0.9% |
| Tolerance of MOI about the Y-Axis | 6.4 KG-mm$^2$ | 1.2% |
| Tolerance of MOI about the Z-Axis | 8.3 KG-mm$^2$ | 1.1% |
| Center of Gravity Tolerance Sphere | | |

$(x - 36.6)^2 + (y - 54.0)^2 + (z - (-65.1))^2 = (1.3)^2$
Tolerance Sphere - located at (36.6, 54.0, −65.1) with a radius of 1.3 mm
Face Center Tolerance Sphere $(x - 29.7)^2 + (y - (-13.4))^2 + (z - (-69.5))^2 = (1.1)^2$
Tolerance Sphere - located at (29.7, −13.4, −69.5) with a radius of 1.1 mm
Sole Contact Point Tolerance Sphere $(x - 19.5)^2 + (y - (-13.0))^2 + (z - (-86.3))^2 = (1.5)^2$
Tolerance Sphere - located at (19.5, −13.0, −86.3) with a radius of 1.5 mm

| Bulge Curvature | | |
|---|---|---|
| Maximum Bulge Curvature | 251.4 mm | |
| Minimum Bulge Curvature | 248.3 mm | |
| Bulge Curvature Tolerance | 3.1 mm | 1.2% |
| Roll Curvature | | |
| Maximum Roll Curvature | 256.6 mm | |
| Minimum Roll Curvature | 256.6 mm | |
| Roll Curvature Tolerance | 0.0 mm | 0.0% |
| Face Angle | | |
| Tolerance of Face Angle | 1.3° | |

The below set of data/information is illustrated for a club head changing both the loft angle and the face angle. The below data is referenced from the table illustrated in FIG. 19C. With this club head in a reference or base position, the reference or base loft angle is at 16 degrees and the nominal face angle has a neutral position of approximately 1 degree open (or a neutral face angle of 0 degrees). The club head may be adjusted utilizing the adjustment member to fifteen different positions. In this given example, the loft angle may be adjusted to 14, 15, 16, 17, and 18 degrees. In this given example, the face angle may be adjusted from the neutral position to open and closed positions (adjusting the face angle approximately 0.5-1 degrees in each direction). The below tables represents the maximum tolerances for each of the performance parameters through each of the five various configurations (five loft adjustment positions by three face angle adjustment positions) as determined utilizing the process as described and detailed above.

TABLE 3B

Fairway Wood #1 (3-Wood) Tolerance - Loft and Face Angle Adjustment
Fairway Wood #1 (Three-Wood) (Data taken from FIG. 19C)
Loft Angle and Face Angle Changes (2 variables independently changed)

| MOI - Tolerances | MOI | % from Reference |
|---|---|---|
| Tolerance of MOI about the X-Axis | 5.8 KG-mm$^2$ | 1.1% |
| Tolerance of MOI about the Y-Axis | 10.1 KG-mm$^2$ | 1.9% |
| Tolerance of MOI about the Z-Axis | 12.0 KG-mm$^2$ | 1.5% |
| Center of Gravity Tolerance Sphere | | |

$(x - 36.7)^2 + (y - 53.9)^2 + (z - (-65.0))^2 = (2.0)^2$
Tolerance Sphere - located at (36.7, 53.9, −65.0) with a radius of 2.0 mm
Face Center Tolerance Sphere $(x - 29.8)^2 + (y - (-13.4))^2 + (z - (-69.5))^2 = (1.8)^2$
Tolerance Sphere - located at (29.8, −13.4, −69.5) with a radius of 1.8 mm
Sole Contact Point Tolerance Sphere $(x - 19.6)^2 + (y - (-13.0))^2 + (z - (-86.2))^2 = (2.4)^2$
Tolerance Sphere - located at (19.6, −13.0, −86.2) with a radius of 2.4 mm

| Bulge Curvature | | |
|---|---|---|
| Maximum Bulge Curvature | 252.4 mm | |
| Minimum Bulge Curvature | 248.1 mm | |
| Bulge Curvature Tolerance | 4.3 mm | 1.7% |
| Roll Curvature | | |
| Maximum Roll Curvature | 256.6 mm | |
| Minimum Roll Curvature | 256.6 mm | |
| Roll Curvature Tolerance | 0.0 mm | 0.0% |

Figure 19D:
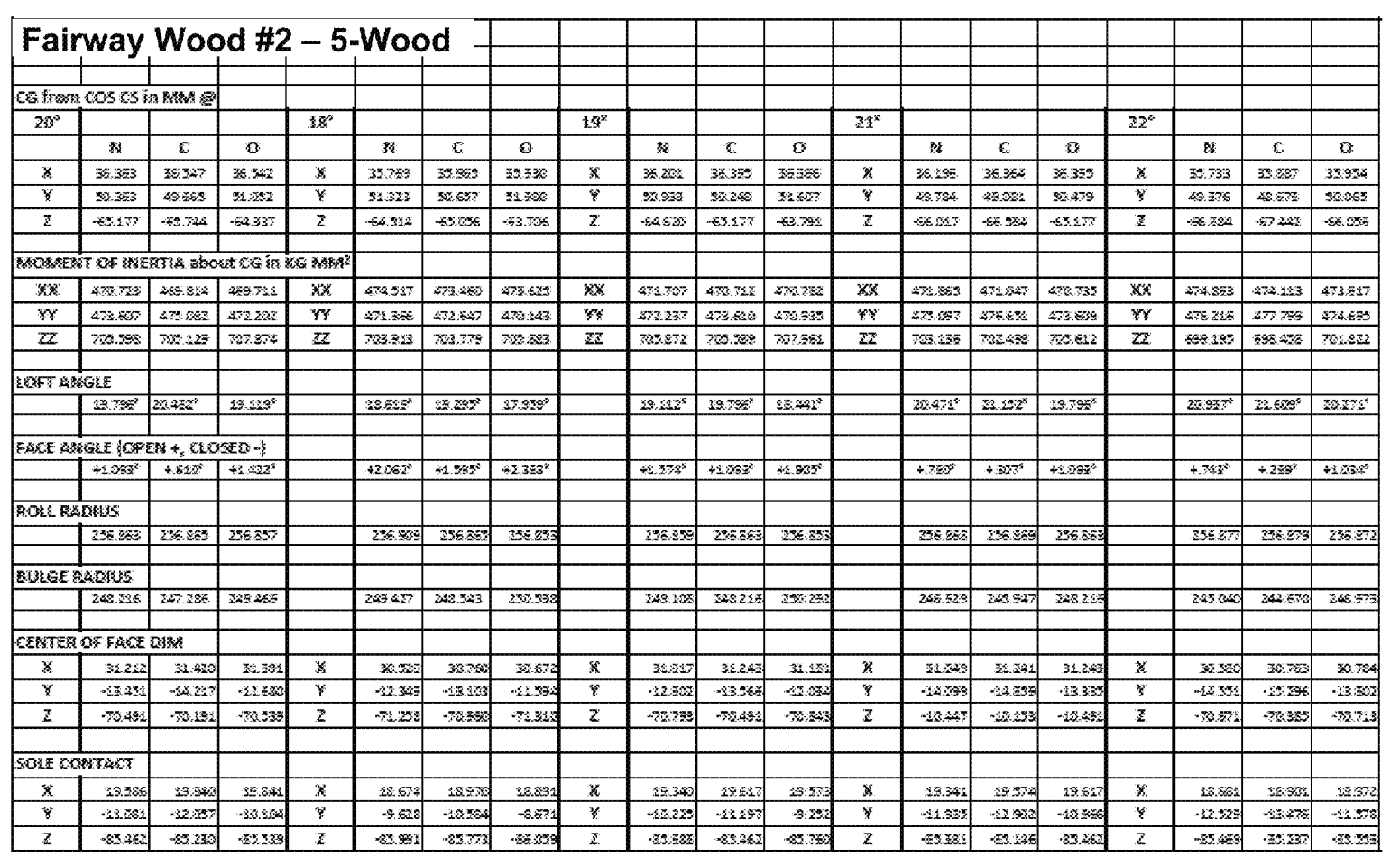

FIG. 19D illustrates an example set of tolerance data for another given fairway wood club head, for example a five-wood. The below set of data/information is illustrated for a club head with a neutral club face angle and changing only the loft angle. The below data is referenced from the table illustrated in FIG. 19D. With this club head in a reference or base position, the reference or base loft angle is at 20 degrees. The club head may be adjusted utilizing the adjustment member to five different positions. In this given example, the available positions will be represented by different loft angles, wherein the loft angle may be adjusted to 18, 19, 20, 21, and 22 degrees. The below tables represents the maximum tolerances for each of the performance parameters through each of the five various configurations as determined utilizing the process as described and detailed above.

TABLE 4A

Fairway Wood #2 (5-Wood) Tolerance - Loft Angle Adjustment
Fairway Wood #2 (Five-wood) (Data taken from FIG. 19D)
Loft Angle Changes (1 variable independently changed)

| MOI - Tolerances | MOI | % from Reference |
|---|---|---|
| Tolerance of MOI about the X-Axis | 4.1 KG-mm$^2$ | 0.9% |
| Tolerance of MOI about the Y-Axis | 4.9 KG-mm$^2$ | 1.0% |
| Tolerance of MOI about the Z-Axis | 6.7 KG-mm$^2$ | 0.9% |
| Center of Gravity Tolerance Sphere | | |

$(x - 36.0)^2 + (y - 50.3)^2 + (z - (-65.7))^2 = (1.2)^2$
Tolerance Sphere - located at (36.0, 50.3, −65.7) with a radius of 1.2 mm
Face Center Tolerance Sphere $(x - 30.9)^2 + (y - (-13.5))^2 + (z - (-70.9))^2 = (1.1)^2$
Tolerance Sphere - located at (30.9, −13.5, −70.9) with a radius of 1.1 mm

TABLE 4A-continued

Fairway Wood #2 (5-Wood) Tolerance - Loft Angle Adjustment
Fairway Wood #2 (Five-wood) (Data taken from FIG. 19D)
Loft Angle Changes (1 variable independently changed)

| MOI - Tolerances | MOI | % from Reference |
|---|---|---|
| Sole Contact Point Tolerance Sphere | | |
| $(x - 19.1)^2 + (y - (-11.1))^2 + (z - (-85.7))^2 = (1.5)^2$ | | |
| Tolerance Sphere - located at (19.1, -11.1, -85.7) with a radius of 1.5 mm | | |
| Bulge Curvature | | |
| Maximum Bulge Curvature | 249.4 mm | |
| Minimum Bulge Curvature | 245.0 mm | |
| Bulge Curvature Tolerance | 4.4 mm | 1.8% |
| Roll Curvature | | |
| Maximum Roll Curvature | 256.9 mm | |
| Minimum Roll Curvature | 256.9 mm | |
| Roll Curvature Tolerance | 0.0 mm | 0.0% |
| Face Angle | | |
| Tolerance of Face Angle | 1.3° | |

The below set of data/information is illustrated for a club head changing both the loft angle and the face angle. The below data is referenced from the table illustrated in FIG. 19D. With this club head in a reference or base position, the reference or base loft angle is at 20 degrees and the nominal face angle has a neutral position of approximately 1 degree open (or a neutral face angle of 0 degrees). The club head may be adjusted utilizing the adjustment member to fifteen different positions. In this given example, the loft angle may be adjusted to 18, 19, 20, 21, and 22 degrees. In this given example, the face angle may be adjusted from the neutral position to open and closed positions (adjusting the face angle approximately 0.5-1 degrees in each direction). The below tables represents the maximum tolerances for each of the performance parameters through each of the five various configurations (five loft adjustment positions by three face angle adjustment positions) as determined utilizing the process as described and detailed above.

TABLE 4B

Fairway Wood #2 (5-Wood) Tolerance - Loft and Face Angle Adjustment
Fairway Wood #2 (Five-Wood) (Data taken from FIG. 19D)
Loft Angle and Face Angle Changes (2 variables independently changed)

| MOI - Tolerances | MOI | % from Reference |
|---|---|---|
| Tolerance of MOI about the X-Axis | 5.2 KG-mm² | 1.1% |
| Tolerance of MOI about the Y-Axis | 7.7 KG-mm² | 1.6% |
| Tolerance of MOI about the Z-Axis | 9.5 KG-mm² | 1.3% |
| Center of Gravity Tolerance Sphere | | |
| $(x - 36.1)^2 + (y - 50.3)^2 + (z - (-65.6))^2 = (1.9)^2$ | | |
| Tolerance Sphere - located at (36.1, 50.3, -65.6) with a radius of 1.9 mm | | |
| Face Center Tolerance Sphere | | |
| $(x - 31.0)^2 + (y - (-13.4))^2 + (z - (-70.7))^2 = (1.8)^2$ | | |
| Tolerance Sphere - located at (31.0, -13.4, -70.7) with a radius of 1.8 mm | | |
| Sole Contact Point Tolerance Sphere | | |
| $(x - 19.3)^2 + (y - (-11.1))^2 + (z - (-85.6))^2 = (2.4)^2$ | | |
| Tolerance Sphere - located at (19.3, -11.1, -85.6) with a radius of 2.4 mm | | |

TABLE 4B-continued

Fairway Wood #2 (5-Wood) Tolerance - Loft and Face Angle Adjustment
Fairway Wood #2 (Five-Wood) (Data taken from FIG. 19D)
Loft Angle and Face Angle Changes (2 variables independently changed)

| MOI - Tolerances | MOI | % from Reference |
|---|---|---|
| Bulge Curvature | | |
| Maximum Bulge Curvature | 250.5 mm | |
| Minimum Bulge Curvature | 244.7 mm | |
| Bulge Curvature Tolerance | 5.8 mm | 2.4% |
| Roll Curvature | | |
| Maximum Roll Curvature | 256.9 mm | |
| Minimum Roll Curvature | 256.9 mm | |
| Roll Curvature Tolerance | 0.0 mm | 0.0% |

Figure 19E:
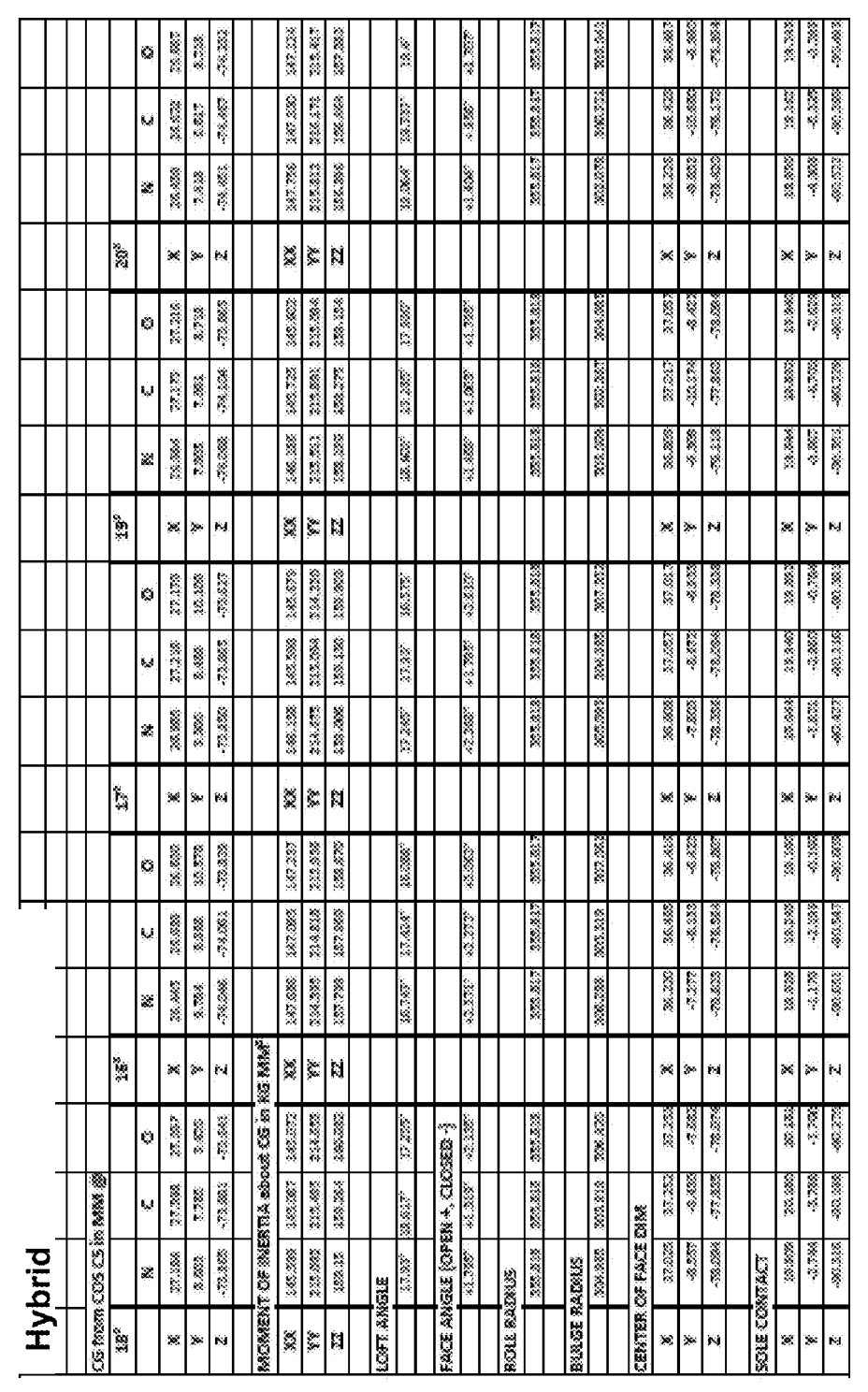

FIG. 19E illustrates an example set of tolerance data for a given hybrid-type club head. The below set of data/information is illustrated for a club head with a neutral club face angle and changing only the loft angle. The below data is referenced from the table illustrated in FIG. 19E. With this club head in a reference or base position, the reference or base loft angle is at 18 degrees. The club head may be adjusted utilizing the adjustment member to five different positions. In this given example, the available positions will be represented by different loft angles, wherein the loft angle may be adjusted to 16, 17, 18, 19, and 20 degrees. The below tables represents the maximum tolerances for each of the performance parameters through each of the five various configurations as determined utilizing the process as described and detailed above.

TABLE 5A

Hybrid-Type Club Tolerance Levels - Loft Angle Adjustment
Hybrid-Type Club Head (Data taken from FIG. 19E)
Loft Angle Changes (1 variable independently changed)

| MOI - Tolerances | MOI | % from Reference |
|---|---|---|
| Tolerance of MOI about the X-Axis | 2.2 KG-mm² | 1.5% |
| Tolerance of MOI about the Y-Axis | 1.4 KG-mm² | 0.7% |
| Tolerance of MOI about the Z-Axis | 2.8 KG-mm² | 1.7% |
| Center of Gravity Tolerance Sphere | | |
| $(x - 26.8)^2 + (y - 8.6)^2 + (z - (-74.2))^2 = (1.2)^2$ | | |
| Tolerance Sphere - located at (26.8, 8.6, -74.2) with a radius of 1.2 mm | | |
| Face Center Tolerance Sphere | | |
| $(x - 36.6)^2 + (y - (-8.6))^2 + (z - (-78.5))^2 = (1.3)^2$ | | |
| Tolerance Sphere - located at (36.6, -8.6, -78.5) with a radius of 1.3 mm | | |
| Sole Contact Point Tolerance Sphere | | |
| $(x - 19.4)^2 + (y - (-2.7))^2 + (z - (-90.5))^2 = (1.6)^2$ | | |
| Tolerance Sphere - located at (19.4, 2.7, -90.5) with a radius of 1.6 mm | | |
| Bulge Curvature | | |
| Maximum Bulge Curvature | 306.3 mm | |
| Minimum Bulge Curvature | 302.1 mm | |
| Bulge Curvature Tolerance | 4.2 mm | 1.4% |
| Roll Curvature | | |
| Maximum Roll Curvature | 355.8 mm | |
| Minimum Roll Curvature | 355.8 mm | |
| Roll Curvature Tolerance | 0.0 mm | 0.0% |
| Face Angle | | |
| Tolerance of Face Angle | 1.0° | |

The below set of data/information is illustrated for a club head changing both the loft angle and the face angle. The below data is referenced from the table illustrated in FIG. 19E. With this club head in a reference or base position, the reference or base loft angle is at 18 degrees and the nominal face angle has a neutral position of approximately 1 degree open (or a neutral face angle of 0 degrees). The club head may be adjusted utilizing the adjustment member to fifteen different positions. In this given example, the loft angle may be adjusted to 16, 17, 18, 19, and 20 degrees. In this given example, the face angle may be adjusted from the neutral position to open and closed positions (adjusting the face angle approximately 0.5-1 degrees). The below tables represents the maximum tolerances for each of the performance parameters through each of the five various configurations (five loft adjustment positions by three face angle adjustment positions) as determined utilizing the process as described and detailed above.

TABLE 5B

Hybrid-Type Club Tolerance Levels - Loft and Face Angle Adjustment Hybrid-Type Club Head (Data taken from FIG. 19E) Loft Angle and Face Angle Changes (2 variables independently changed)

| MOI - Tolerances | MOI | % from Reference |
|---|---|---|
| Tolerance of MOI about the X-Axis | 2.7 KG-mm$^2$ | 1.8% |
| Tolerance of MOI about the Y-Axis | 2.2 KG-mm$^2$ | 1.0% |
| Tolerance of MOI about the Z-Axis | 3.7 KG-mm$^2$ | 2.3% |
| Center of Gravity Tolerance Sphere | | |

$(x - 26.9)^2 + (y - 8.6)^2 + (z - (-74.0))^2 = (2.0)^2$
Tolerance Sphere - located at (26.9, 8.6, -74.0) with a radius of 2.0 mm
Face Center Tolerance Sphere $(x - 36.7)^2 + (y - (-8.6))^2 + (z - (-78.3))^2 = (2.2)^2$
Tolerance Sphere - located at (36.7, -8.6, -78.3) with a radius of 2.2 mm
Sole Contact Point Tolerance Sphere $(x - 19.6)^2 + (y - (-2.7))^2 + (z - (-90.4))^2 = (2.6)^2$
Tolerance Sphere - located at (19.6, -2.7, -90.4) with a radius of 2.6 mm Bulge Curvature

| Maximum Bulge Curvature | 307.6 mm | |
| Minimum Bulge Curvature | 300.9 mm | |
| Bulge Curvature Tolerance | 6.7 mm | 2.2% |

Roll Curvature

| Maximum Roll Curvature | 355.8 mm | |
| Minimum Roll Curvature | 355.8 mm | |
| Roll Curvature Tolerance | 0.0 mm | 0.0% |

Figure 33A:
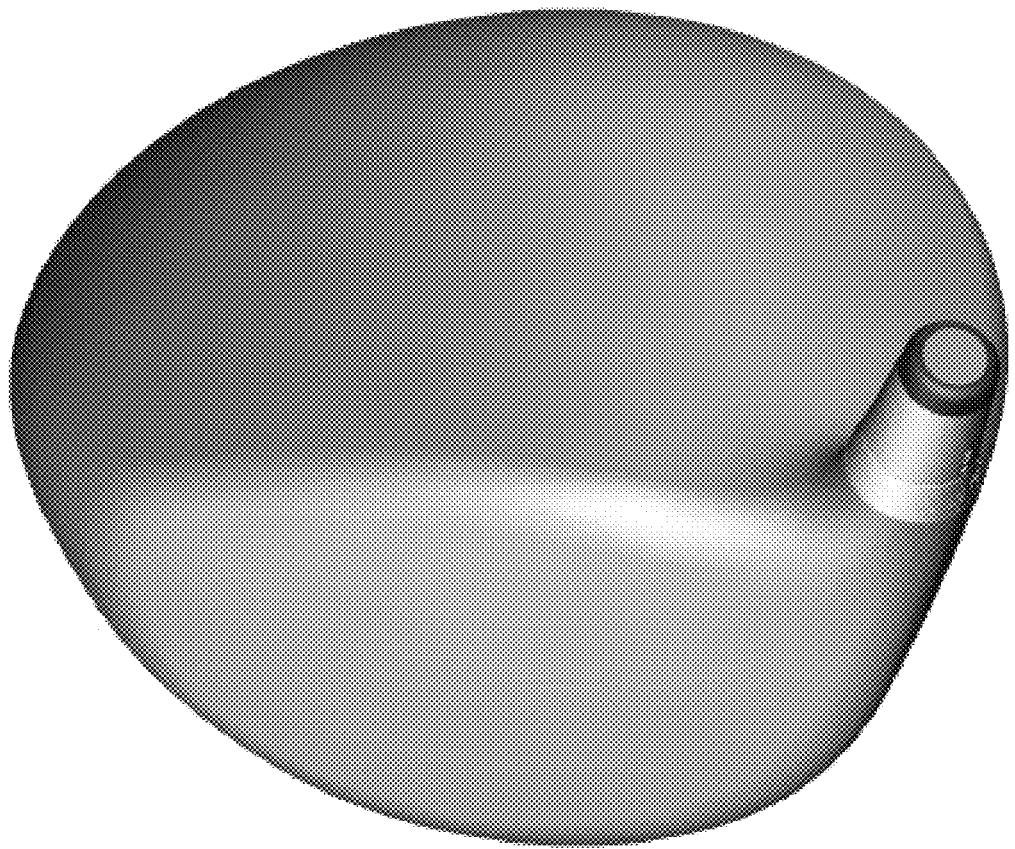
FIGS. 33A through 34B illustrate example golf club heads according to this invention.
Figure 33B:
Figure 34A:
Figure 34B:
Figure 38A:
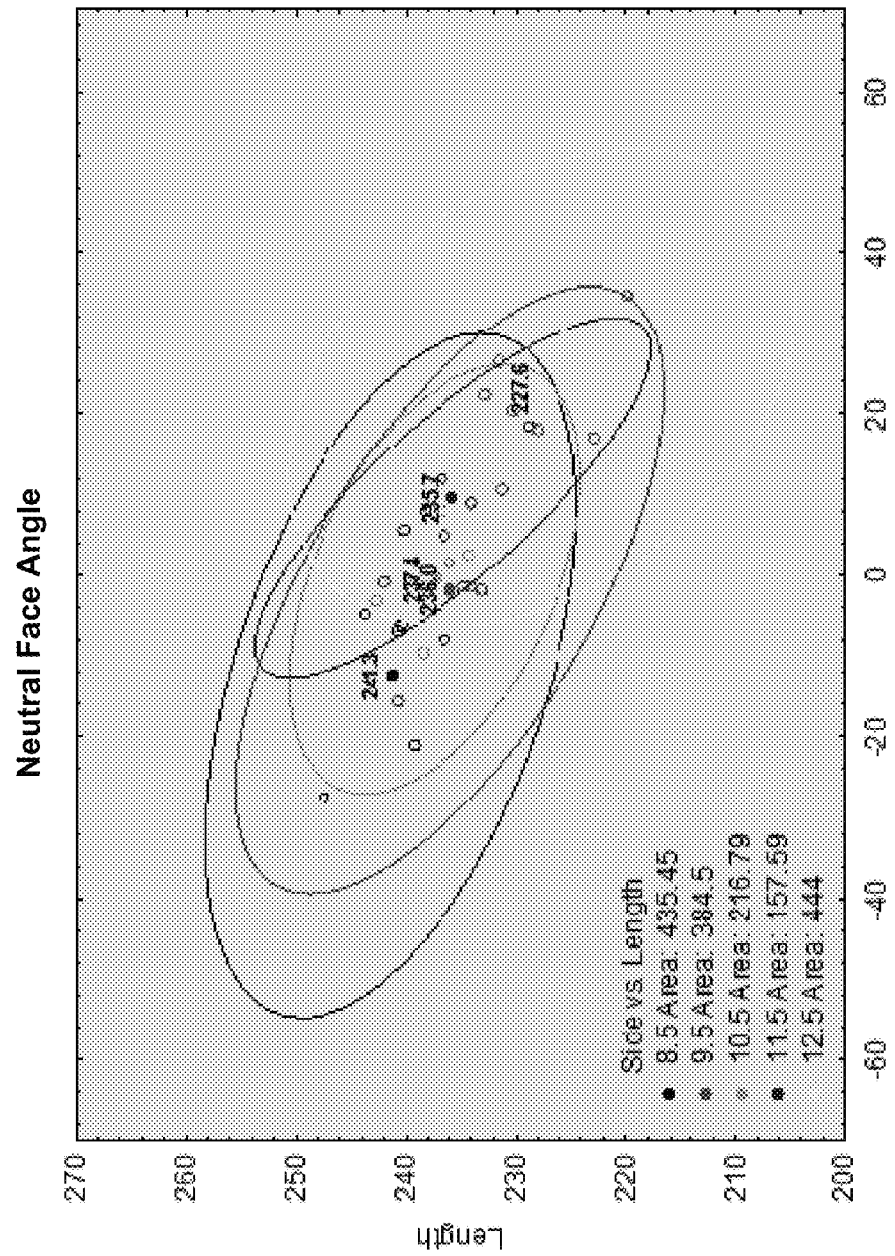
FIGS. 38A through 39C illustrate distance and dispersion ellipses charts of example golf club heads according to this invention.
Figure 38B:
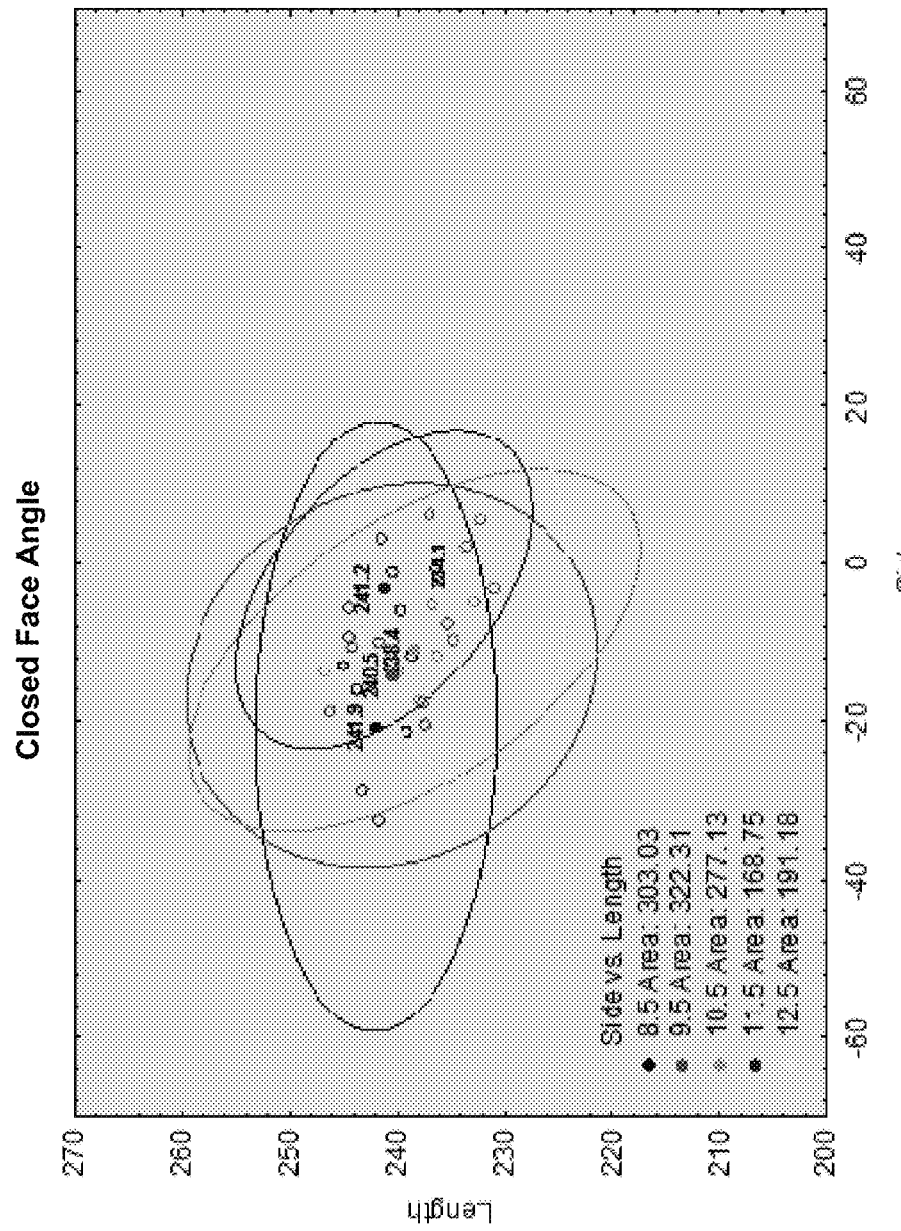
Figure 38C:
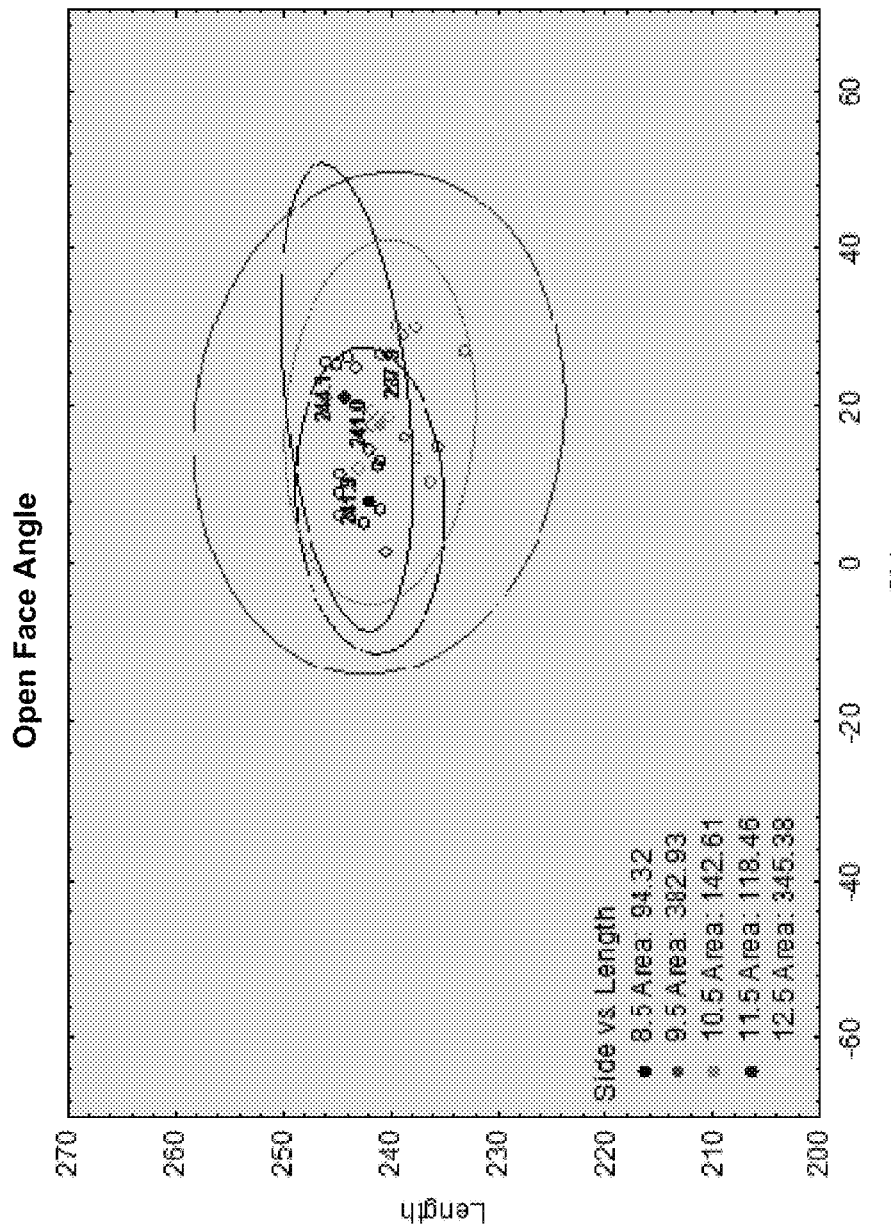
Figure 39A:
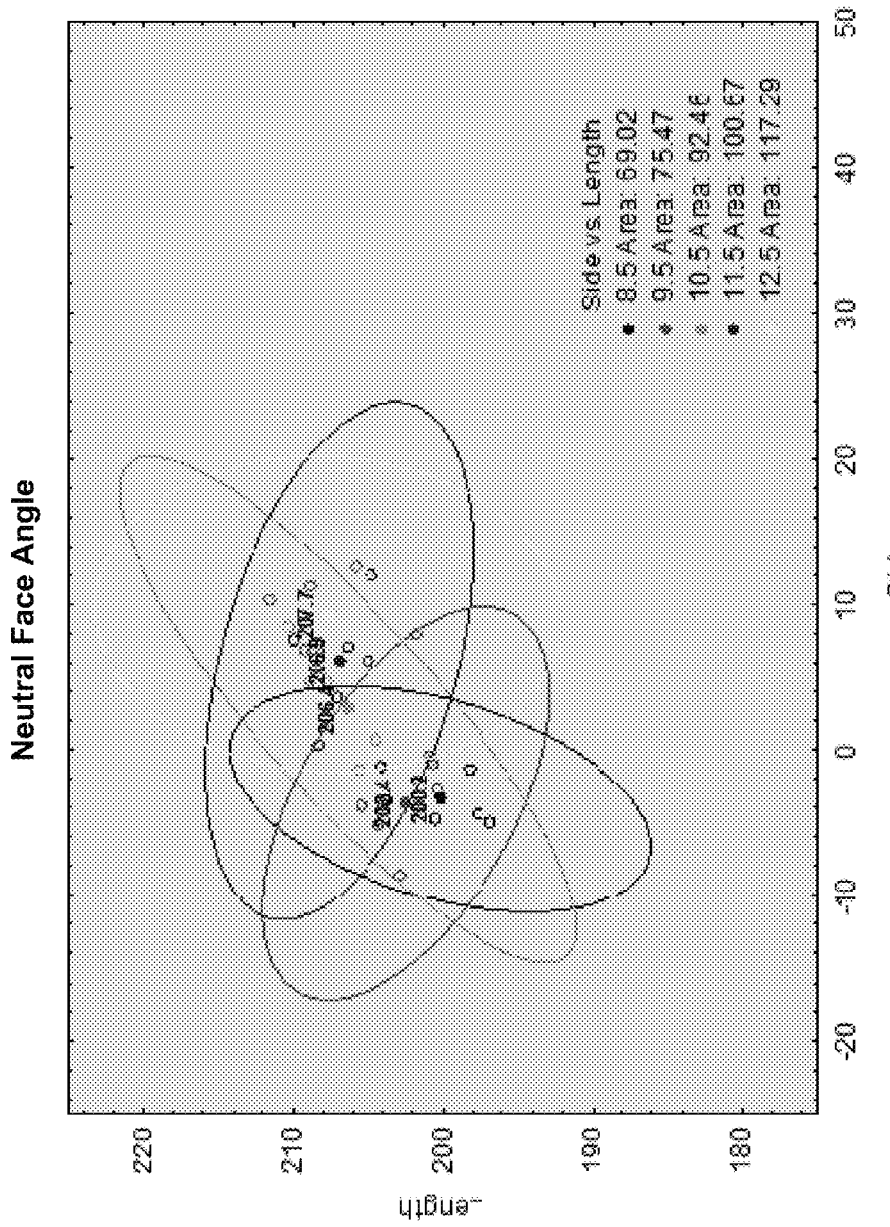
Figure 39B:
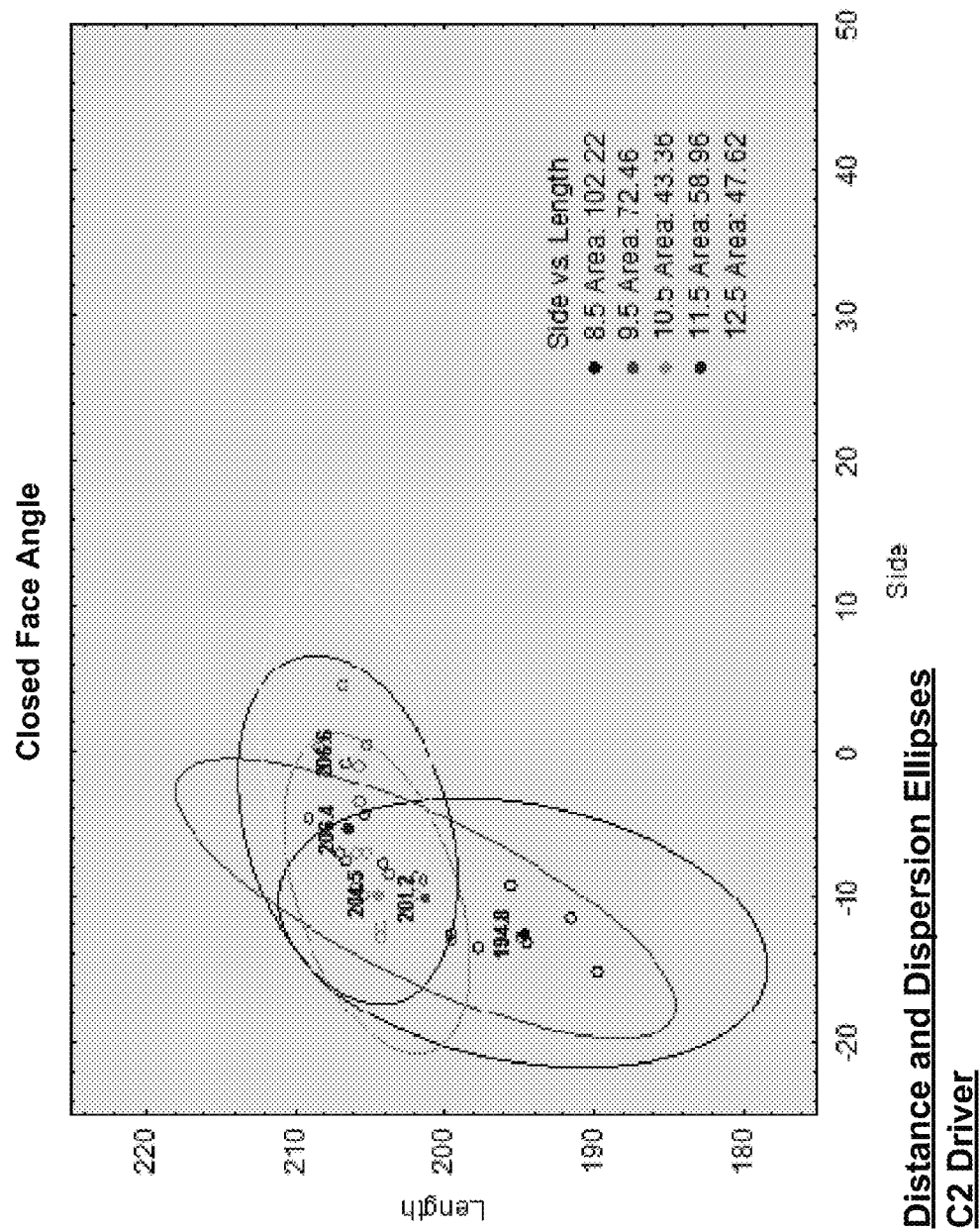
Figure 39C:
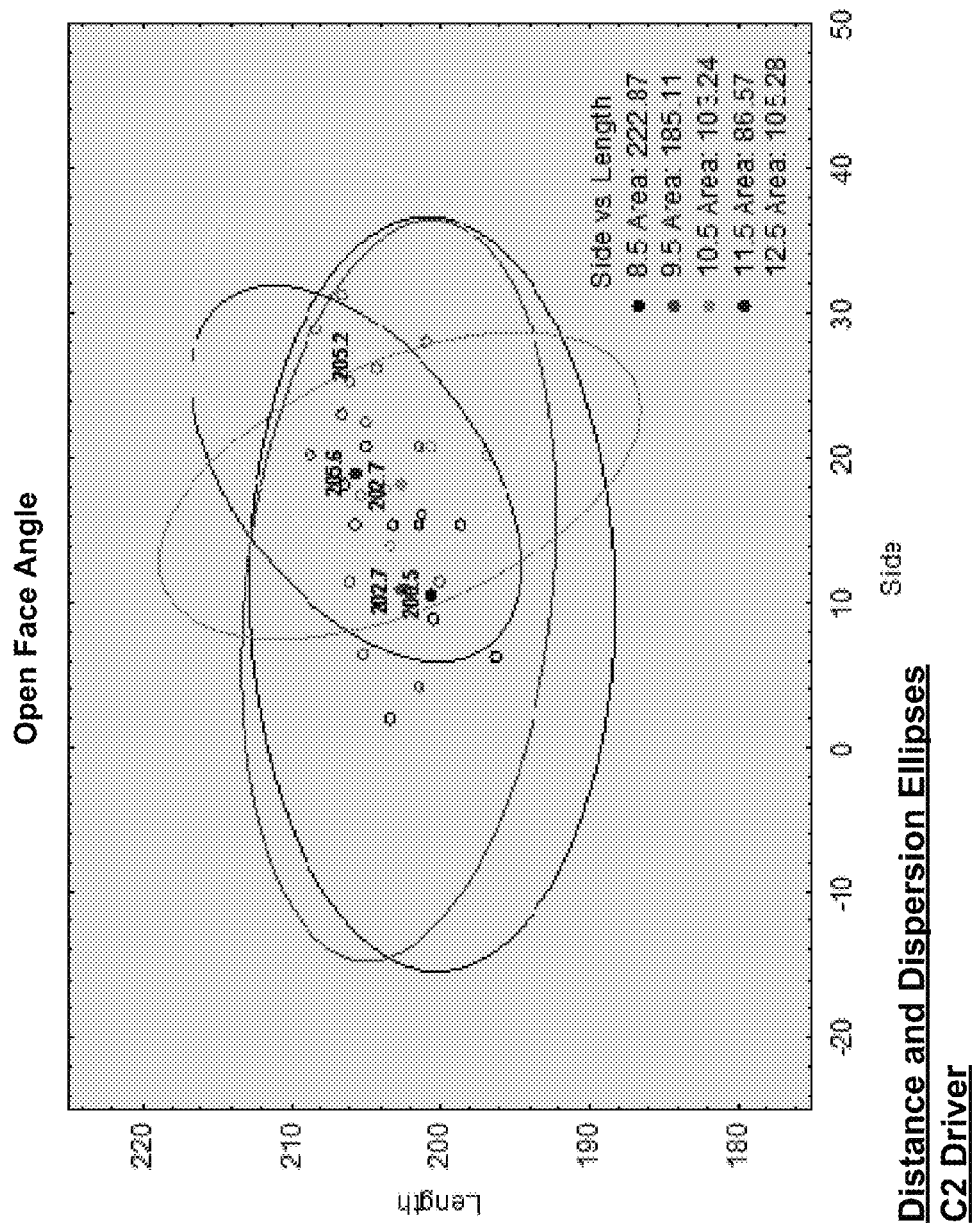

FIGS. 33A and 33B illustrate an adjustable driver or club head manufactured according to the tolerance specifications presented in Tables 1A and 1B above, as well as FIG. 19A, and designated as the C1 driver. FIGS. 34A and 34B illustrated another adjustable driver or club head manufactured according to the tolerance specifications presented in Tables 2A and 2B above, as well as FIG. 19B, and designated as the C2 driver. In these specific driver club heads in accordance with this invention, when one or two parameters are changed independently of other parameters or characteristics, there is substantially no change to other club or club head variables, parameters, or characteristics, such as center of gravity location, face center location, sole contact point, moment of inertia, bulge curvature, and roll curvature. These driver club heads described above and illustrated in FIGS. 33A through 34B utilizing the adjustment member(s) as described above can replace multiple configurations or models of the same type club heads that include different designed-in loft angles and/or designed-in face angles. The driver club head illustrated in FIGS. 33A through 34B, while utilizing the adjustment member(s), is capable of allowing a user to change one or more parameters or characteristics independently of other parameters or characteristics (such as loft angle and/or face angle), while ensuring there is substantially no change to other club or club head variables, parameters or characteristics.

Figure 40A:
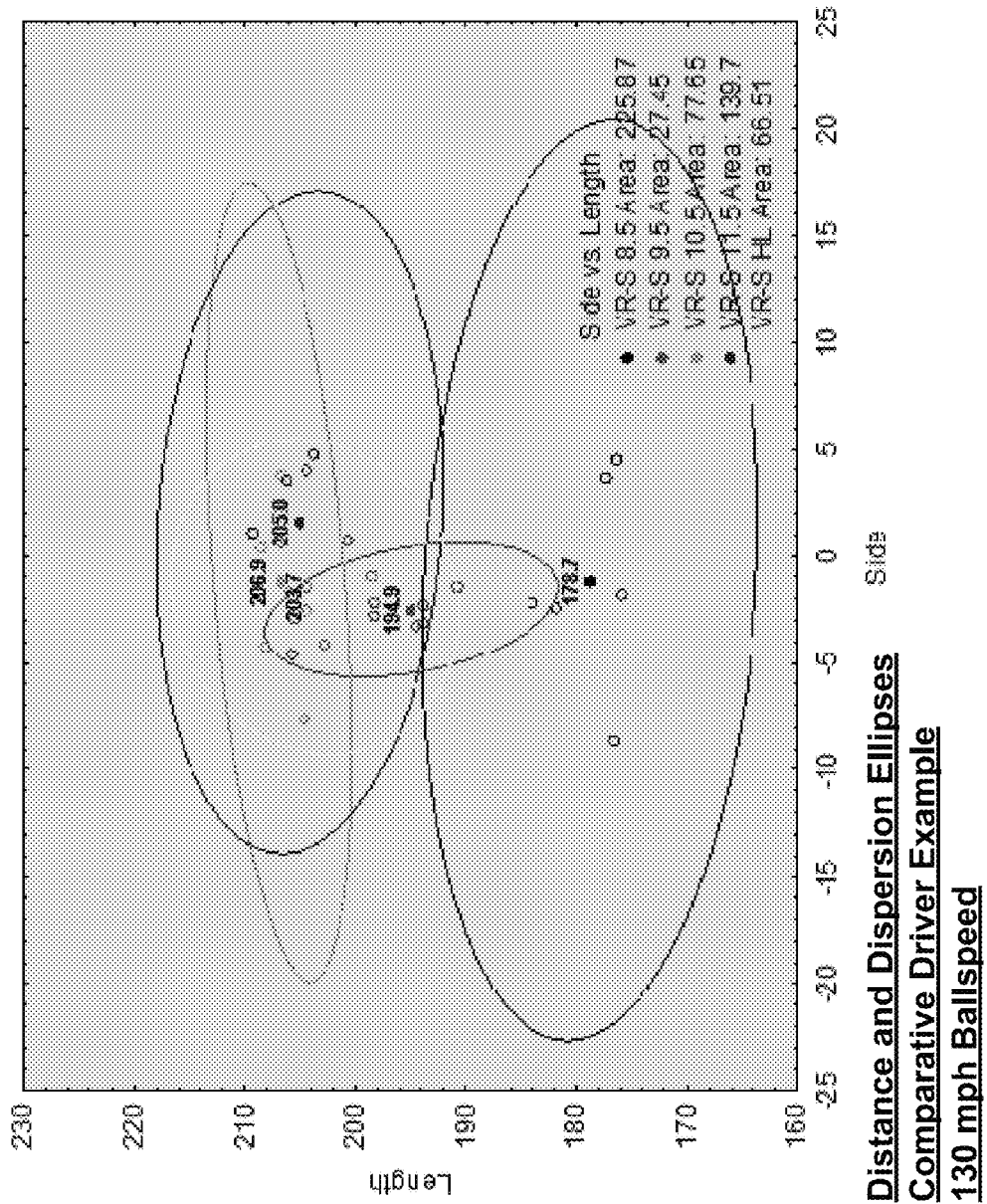
FIG. 40 illustrates a distance and dispersion ellipses chart of a golf club head as a comparative example.

FIGS. 35A through 40 illustrate tables of test data and charts that illustrate data taken from robot testing of adjustable clubs or club heads manufactured according to the tolerance specifications presented in Tables 1A through 2B above and identified as the C1 driver and C2 driver, as well as a series of comparative example clubs having designed-in loft angles. Specifically, FIGS. 35A through 35C illustrate tables of test data of the C1 driver as described and detailed above in Tables 1A and 1B, while FIGS. 38A through 38C illustrate distance and dispersion ellipses charts of the C1 driver as described and detailed above in Tables 1A and 1B. Additionally, FIGS. 36A through 36C illustrate tables of test data of the C2 driver as described and detailed above in Tables 2A and 2B, while FIGS. 39A through 39C illustrate distance and dispersion ellipses charts of the C2 driver as described and detailed above in Tables 2A and 2B. FIGS. 37 and 40 illustrate a table of test data and a distance and dispersion ellipses chart of comparative example driver clubs having designed-in loft angles.

As illustrated in the data tables and distance and dispersion ellipses charts, the example club heads according to the specifications of Tables 1A through 2B achieved performance that is consistent or superior to the comparative examples. As an example, specifically, the smash factor of the club heads according to the specifications of Tables 1A through 2B is consistent to the comparative example club heads. Additionally, as another example, the dispersion of the club heads according to the specifications of Tables 1A through 2B is consistent or better than the comparative example club heads. Additionally, as another example, the distance of the club heads according to the specifications of Tables 1A through 2B is consistent or better than the comparative example club heads.

Description of Example Adjustment Members

As was described above, the adjustment member and/or a second adjustment member allows a user to change one or more parameters or characteristics independently of other parameters or characteristics, while ensuring there is substantially no change to other club or club head variables, parameters or characteristics. There are various methods and structures for the adjustment member and/or the second adjustment member that allows a user to change one or more parameters or characteristics independently of other parameters or characteristics, while ensuring there is substantially no change to other club or club head variables, parameters or characteristics. Generally, the adjustment member and/or the second adjustment member may be operably associated with the club. The following methods or structures will be generally described below: 1) ball-and-socket type hosel/shaft connections; 2) rotatable hosel inserts with offset axes (either one or more sleeves); and 3) replaceable hosels, with each hosel yielding a different configuration. Other adjustment and connection methods or structures known and used in the art may be utilized without departing from this invention.

Figure 20A:
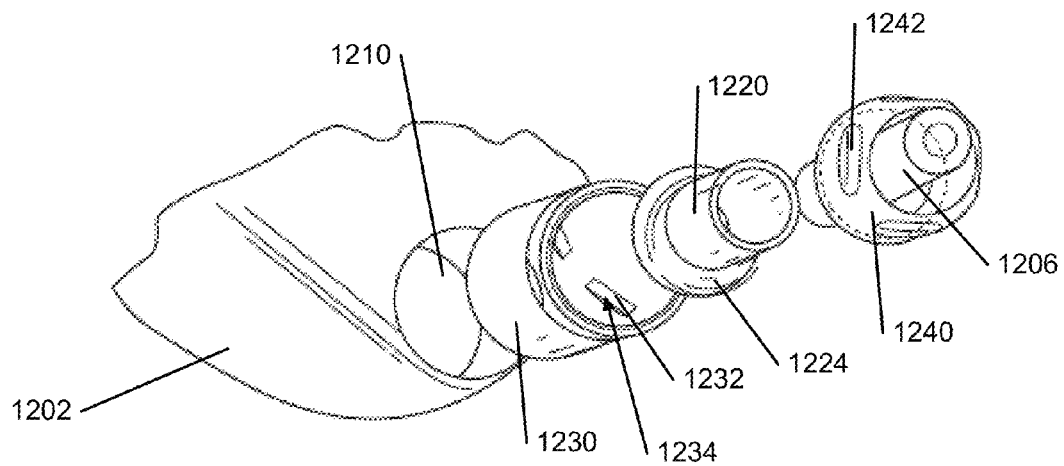
FIGS. 20A and 20B illustrate an example adjustment member for an example golf club according to this invention.
Figure 20B:
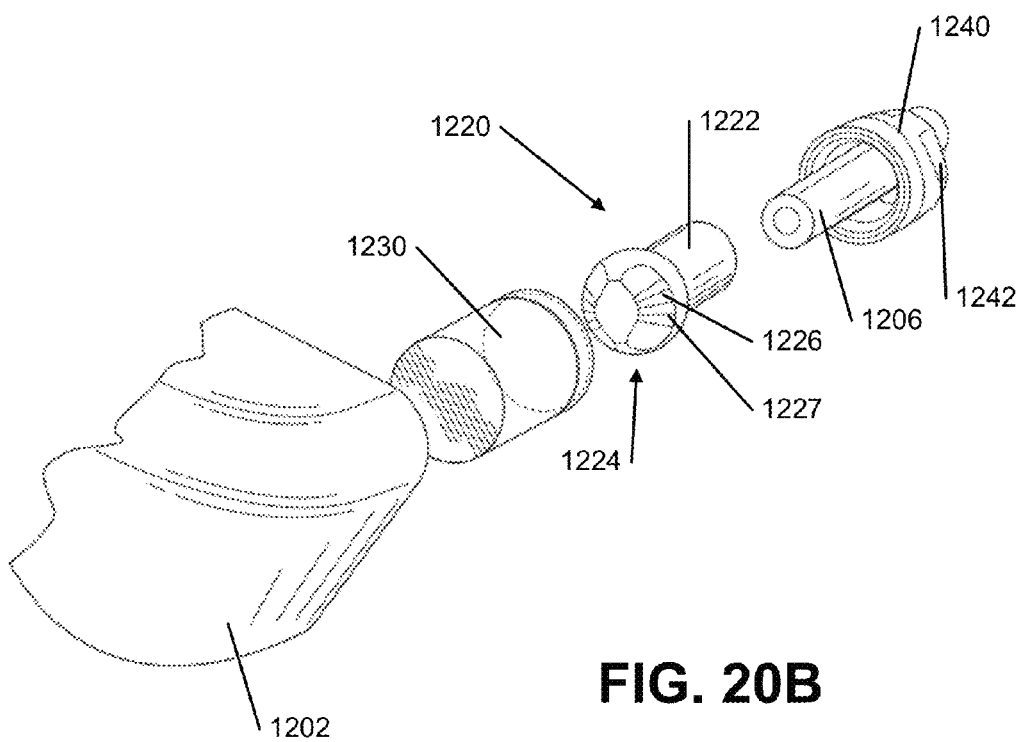

In one aspect of the invention, FIGS. 20A and 20B depict an illustration of a ball-and-socket type hosel/shaft connection or a spherical releasable connection. The spherical releasable connection assembly 1204 between golf club heads and shafts in accordance with aspects of this invention may include a shaft adapter 1220, a hosel insert 1230, and a shaft retainer 1240. The hosel insert 1230 may be at least partially located within an interior chamber 210 of the golf club head 202. The shaft adapter 1220 may be releasably connected to the hosel insert 1230. The shaft retainer 1240 may be slidably engaged along the golf club shaft 1206 and may be secured to the hosel insert 1230, thereby securing the shaft adapter 1220 firmly against the hosel insert 1230.

The golf club head 1202 may comprise an interior chamber 1210 configured to receive a hosel insert 1230. As shown in FIG. 20A, the interior chamber 1210 may be configured to receive a hosel insert 1230. The hosel insert 1230 may be at least partially located within the interior chamber 1210. The hosel insert 1230 has an outer perimeter and an inner perimeter. The outer perimeter may be configured to be engaged with the interior chamber 1210 of the golf club head 1202. The inner perimeter may include a rotation inhibiting structure 1232.

As seen in FIGS. 20A and 20B, the illustrative shaft adapter 1220 may be hollow and may be sized to receive a free end portion of a golf shaft 1206. Conversely, the shaft adapter 1220 may also be sized to be received within a hollow portion at the free end of a golf shaft 1206.

The lower end 1224 of the shaft adapter 1220 may be defined by a spherical member. The spherical member 1224 may be configured to releasably mate with the hosel insert 1230. As seen in FIG. 20A, the lower end 1224 of the shaft adapter 1220 comprises a spherical member 1224 configured to mate with at least a portion of the rotation inhibiting structure 1232 of the hosel insert 1230.

Additional aspects of this invention relate to the spherical member 1224 having a direction change region. Releasable golf club head/shaft connection assemblies 1204 may enable club fitters (or others) to adjust various positions and/or angles of the club head 1202 (and its ball striking face) with respect to the free end (grip) of the shaft 1206 (e.g., face angle, lie angle, loft angle, etc.), while ensuring there is substantially no change to the other club or club head variables, parameters, or characteristics. This connection may allow the modification of the face angle, lie angle, and loft angle when the orientation of the shaft adapter 1220 is varied, while ensuring there is substantially no change to the other club or club head variables, parameters, or characteristics.

In another embodiment in accordance with this invention, the adjustment member and/or the second adjustment member may include one or more rotatable hosel inserts or sleeves that allows a user to change one or more parameters or characteristics independently of other parameters or characteristics, while ensuring there is substantially no change to other club or club head variables, parameters or characteristics. One or both of the rotatable hosel inserts may include offset axes, such that when one or more of the inserts are rotated, the effective club head configuration is changed. When the club head configuration is changed, this will generally change one or more parameters or characteristics independently of other parameters or characteristics, while ensuring there is substantially no change to other club or club head variables.

One sleeve may be attached or engaged with the shaft, while another sleeve may be attached or engaged with the hosel. Each of the sleeves may also engage with one another. In another embodiment, there may just be one sleeve attached or engaged with the shaft or one sleeve attached or engaged with the hosel. As was stated above, when one sleeve or two sleeves are rotated within the hosel assembly, either one or two parameters may be changed for the user, while ensuring there is substantially no change to the other club or club head variables, parameters, or characteristics.

In another embodiment, the adjustment member and/or second adjustment member may include replaceable hosel inserts that allow a user to change one or more parameters or characteristics independently of other parameters or characteristics, while ensuring there is substantially no change to other club or club head variables, parameters or characteristics. The replaceable hosel inserts, when inserted into the hosel and/or the club head, will create a certain configuration of a club head with a given set of parameters. For example, when a first replaceable hosel insert is inserted into and locked into the club head, the club head may have a set of parameters or characteristics. When a second replaceable hosel insert is inserted into and locking into the club head in place of the first replaceable hosel insert, the club head may have a different set of parameters or characteristics. Utilizing the second replaceable hosel insert may change one or more of the parameters, while ensuring there is substantially no change to the other club or club head variables, parameters, or characteristics. A third replaceable hosel insert may also be inserted into and locking into the club head in place of the first and/or second replaceable hosel insert. Utilizing the third replaceable hosel insert may change one or more of the parameters, while ensuring there is substantially no change to the other club or club head variables, parameters, or characteristics. Multiple replaceable hosel inserts may be utilized without departing from this invention.

Figure 21A:
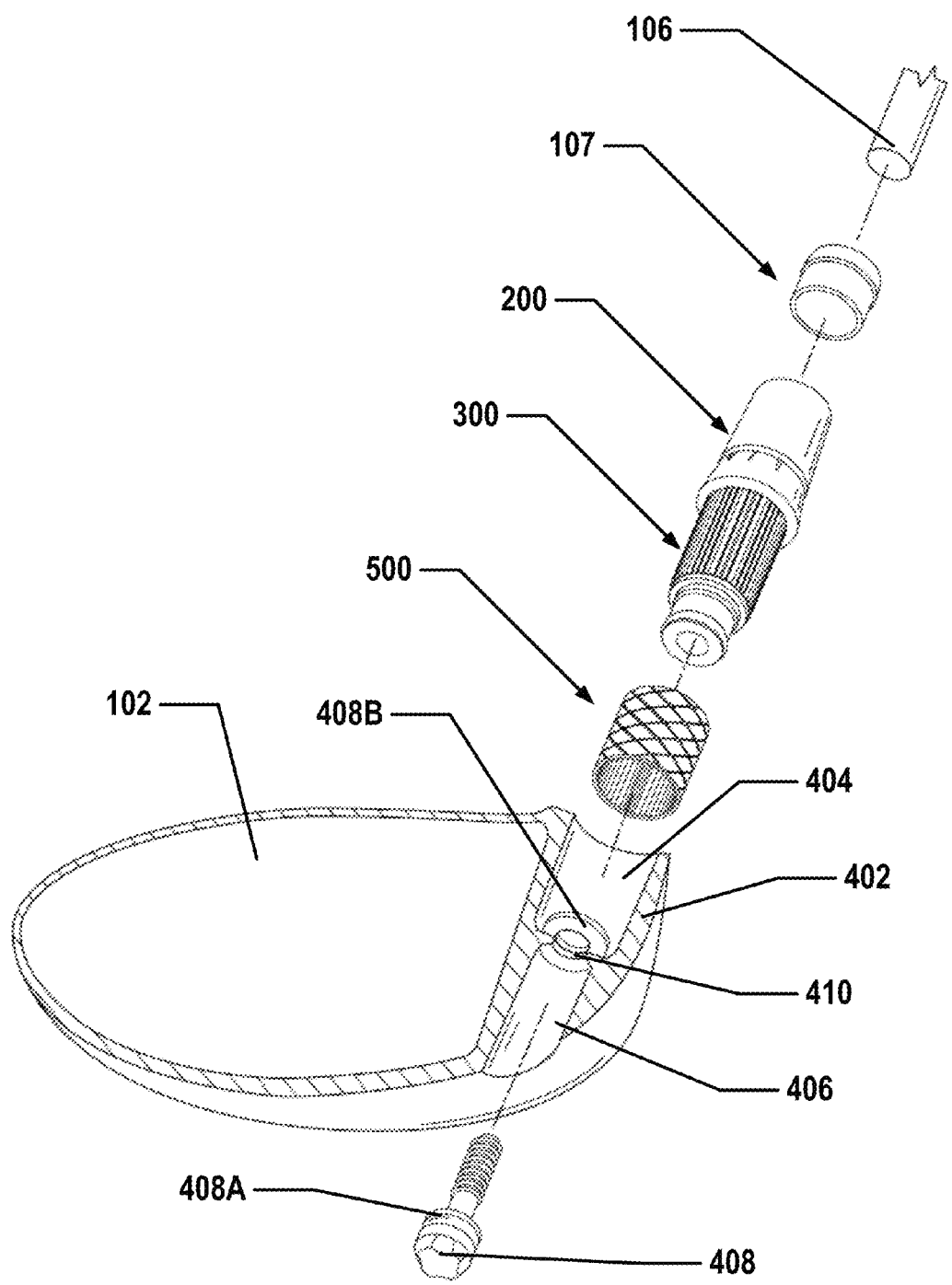
FIGS. 21A through 32C illustrate various views of another example adjustment member for an example golf club according to this invention.

FIGS. 21A through 26 illustrate a releasable connection 104 between golf club heads and shafts in accordance with examples of this invention. FIG. 21A illustrates an exploded view of the releasable connection 104. As illustrated in FIG. 21A, this releasable connection 104 between the golf club head 102 and the shaft 106 includes a shaft adapter 200, a hosel adapter 300, and a hosel ring 500. Generally, the hosel ring 500 is configured to engage a club head chamber 404 in the golf club head 102, the hosel adapter 300 is configured to engage in the locking ring 500 and the golf club head 102, the shaft adapter 200 is configured to engage in the hosel adapter 300, and the shaft 106 is configured to engage the shaft adapter 200. The details of the engagement of these example components/parts will be explained in more detail below.

The releasable connection 104, as described below, includes two different sleeves, a shaft adapter 200 and a hosel adapter 300. These two different sleeves may provide the ability to adjust two different club head parameters independently. Additionally, in accordance with aspects of this invention, one sleeve may be utilized, wherein either the shaft adapter 200 or the hosel adapter 300 may be eliminated such that only one club head parameter may be adjusted independently of the other parameters or characteristics with substantially no change (or minimal change) in the other parameters or characteristics of the golf club head. In another embodiment, one of either the shaft adapter 200 or the hosel adapter 300 may include an off-axis or angled bore and the other the shaft adapter 200 or the hosel adapter 300 may not include an off-axis or angled bore. Additionally, in accordance with aspects of this invention, the two different sleeves may be utilized with off-axis or angled bores, however they may provide the ability to adjust one club head parameter independently with substantially no change (or minimal change) in the other parameters or characteristics of the golf club head. With this embodiment, only one club head parameter may be adjusted independently of the other parameters or characteristics. For each of these adjustments, whether adjusting two different club head parameters independently or adjusting one club head parameter, there may be substantially no change (or minimal change) in the other parameters or characteristics of the golf club head.

In this exemplary embodiment, neither the shaft adapter 200 nor the hosel adapter 300 need to be removed from the club head 102 to rotate the shaft adapter 200 and/or hosel adapter 300 to various configurations. The shaft adapter 200 and hosel adapter 300 are captive within the releasable connection 104. In one exemplary embodiment to achieve this captive feature, the shaft adapter 300 may include a stop ring 205. The stop ring 205 may be in the form of a compression o-ring. The stop ring 205 may also be other mechanical features without departing from this invention, such as c-clips. This stop ring 205 allows the hosel adapter 300 to disengage from the shaft adapter 200 without being removed from the club head 102 and thereby allows the hosel adapter 300 and/or the shaft adapter 200 to be rotated without being removed from the club head 102. Other embodiments may be contemplated without utilizing the captive feature and wherein the shaft adapter 200 and/or hosel adapter 300 may need to be removed from the club head 102 in order to rotate and/or change the configuration of the club head 102.

Figure 21B:
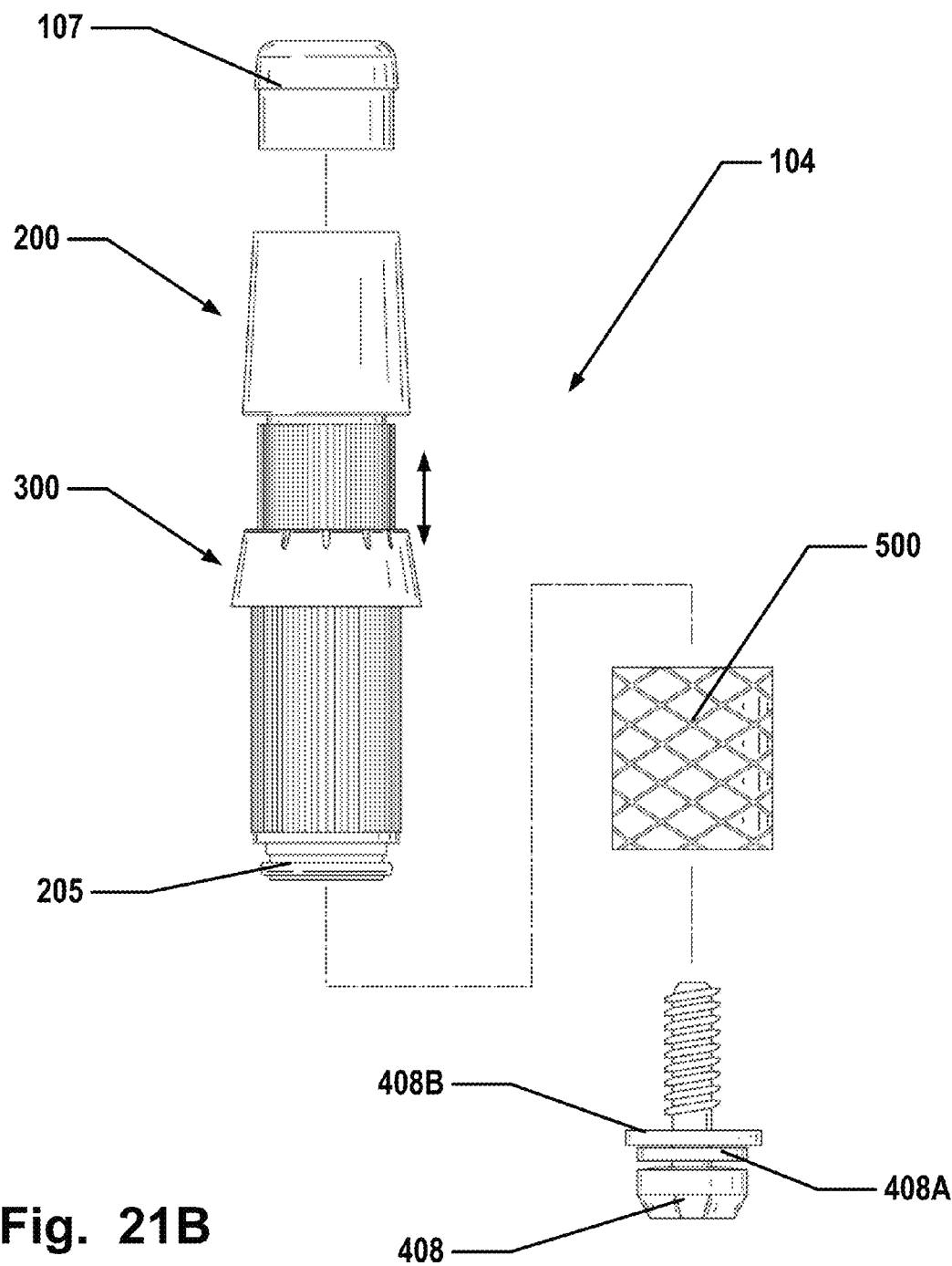

FIGS. 21A and 21B illustrate an exploded view of the releasable connection 104. Generally, the hosel ring 500 is configured to engage a club head chamber 404 in the golf club head 102, the hosel adapter 300 is configured to engage in the hosel ring 500 and the golf club head 102, the shaft adapter 200 is configured to engage in the hosel adapter 300, and the shaft 106 is configured to engage the shaft adapter 200. The details of the engagement of these example components/parts will be explained in more detail below.

As illustrated in FIGS. 22A through 22D, the shaft adapter 1200 includes a generally cylindrical body 202 having a first end 204 and an opposite second end 206. The first end 204 defines an opening to an interior cylindrical chamber 208 for receiving the end of a golf club shaft 106. The second end 206 includes a securing structure (e.g., a threaded hole 210 in this example structure) that assists in securely engaging the shaft adapter 200 to a club head body 102 as will be explained in more detail below. Additionally, the second end 206 includes a stop ring 205. The stop ring 205 may extend radially from the second end 206 of the shaft adapter 200. The stop ring 205 may be capable of stopping and holding the hosel adapter 300 engaged with the shaft adapter 200, but thereby allowing the adjustment and rotation of the hosel adapter 300 and/or the shaft adapter 200 without being removed from the club head 102. The stop ring 1205 may be integral to the shaft adapter 200, i.e. formed and/or as part of the shaft adapter 200, extending radially from the second end 206 of the shaft adapter 200. Additionally, the stop ring 205 may be a separate compression o-ring that fits into a channel 207 that extends radially around the second end 206 of the shaft adapter 200. The separate stop ring 205 (compression o-ring) may be rubber or a metal material.

As shown, at least a portion of the first end 204 of the shaft adapter 200 includes a first rotation-inhibiting structure 212. While a variety of rotation-inhibiting structures may be provided without departing from this invention, in this example structure, the rotation-inhibiting structure 212 constitutes splines 212a extending along a portion of the longitudinal axis 226 of the exterior surface of the shaft adapter 200. The splines 212a of the shaft adapter 200 may prevent rotation of the shaft adapter 200 with respect to the member into which it is fit (e.g., a hosel adapter, as will be explained in more detail below). A variety of rotation-inhibiting structures may be used without departing from the invention. The interaction between these splines and the hosel adapter cylindrical interior will be discussed more below. Other configurations of splines may be utilized without departing from this invention.

The first rotation-inhibiting structure 212 may extend along a length of the shaft adapter 200 such that the hosel adapter 300 can be disengaged from the first rotation-inhibiting structure 212 and be rotated while still captive on the shaft adapter 200.

FIGS. 22A and 22B further illustrate that the first end 204 of the shaft adapter 200 includes an expanded portion 214. The expanded portion 214 provides a stop that prevents the shaft adapter 200 from extending into the hosel adapter 300 and the club head body 102 and provides a strong base for securing the shaft adapter 200 to the hosel adapter 300 and the club head body 102. Also, the exterior shape of the first end 204 may be tapered to provide a smooth transition between the shaft 106, the hosel adapter 300, and the club head 102 and a conventional aesthetic appearance.

Figure 22C:
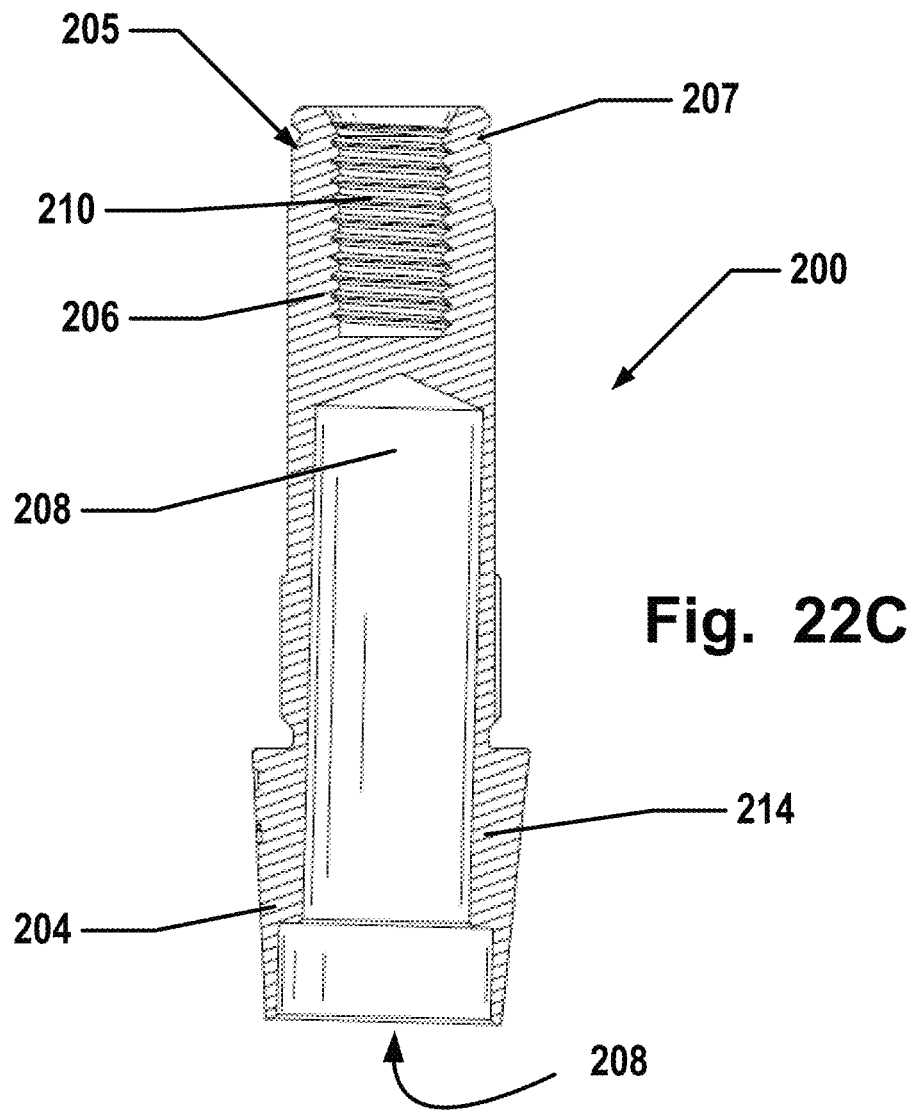
Figure 22D:
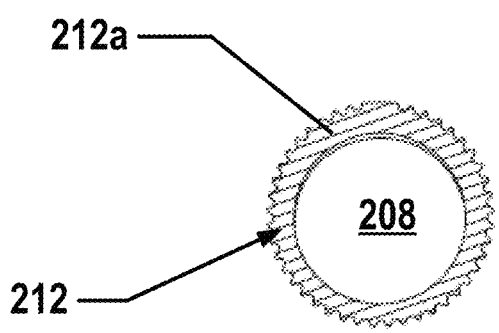

Other features of this example shaft adapter 200 may include an "off-axis" or angled bore hole or interior chamber 208 in which the shaft 106 is received as illustrated for example in FIG. 22C. More specifically, in this illustrated example, the outer cylindrical surface of the shaft adapter 200 extends in a first axial direction, and the interior cylindrical surface of the bore hole 208 extends in a second axial direction that differs from the first axial direction, thereby creating a shaft adapter offset angle. In this manner, while the shaft adapter 200 exterior maintains a constant axial direction corresponding to that of the interior of the hosel adapter 300 and the openings, the shaft 106 extends away from the club head 102 and the hosel adapter 300 at a different and adjustable angle with respect to the club head 102, the hosel adapter 300, and the club head's ball striking face. In this given example, the shaft position and/or angle corresponds to a given face angle of the golf club head 102. One rotational position may be neutral face, one rotational position may be open face, and one rotational position may be closed face. Other rotational positions may be utilized without departing from this invention. The shaft position and/or face angle may be adjusted, for example, by rotating the shaft adapter 200 with respect to the hosel adapter 300 and the club head hosel.

While any desired shaft adapter offset angle may be maintained between the first axial direction and the second axial direction, in accordance with some examples of this invention, this shaft adapter offset angle or face angle adjustment may be between 0.25 degrees and 10 degrees, and in some examples between 0.5 degrees and 8 degrees, between 0.75 degrees and 6 degrees, or even between 1 degree and 4 degrees. In more specific examples of the invention, the shaft adapter offset angle or face angle adjustment may by approximately 1.5 degrees offset or 2.0 degrees offset.

FIGS. 23A through 23E illustrate an example hosel adapter 300 in accordance with this invention. As shown, the hosel adapter 300 is generally cylindrical in shape. The hosel adapter 300 has a first end 304 and an opposite second end 306. The first end 304 defines an opening to a borehole 308 for receiving the shaft adapter 200. Within the first end 304 and along the interior sides of the borehole 308, the first end 304 includes a second rotation-inhibiting structure 312 configured to engage the first rotation-inhibiting structure 212 on the shaft adapter 200 (e.g., in an interlocking manner with respect to rotation).

Figure 23A:
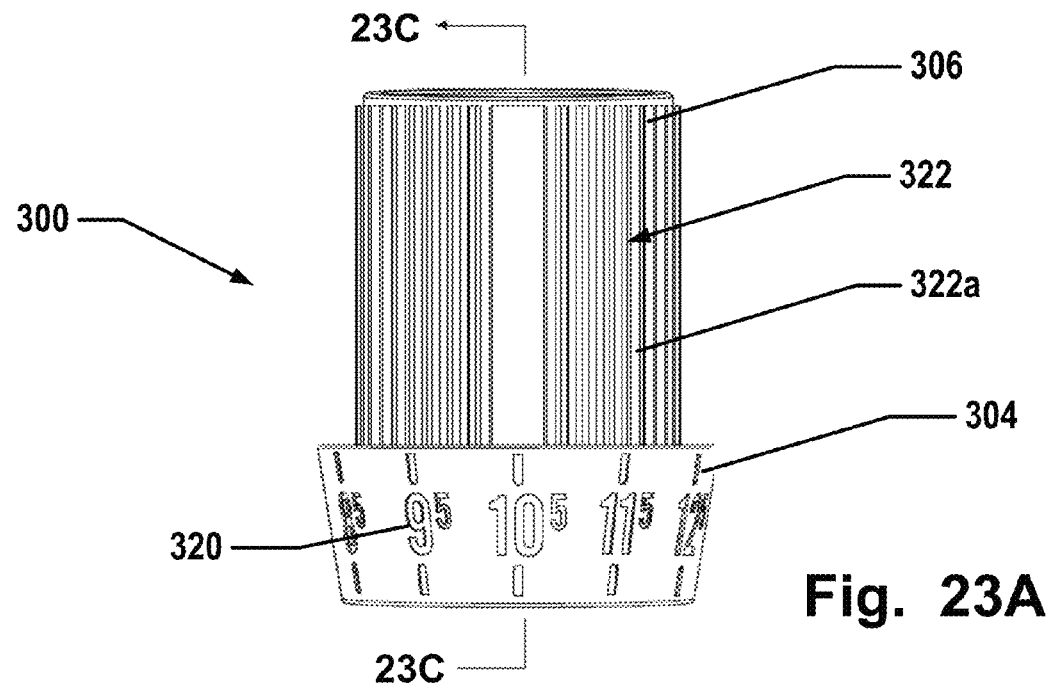
Figure 23B:
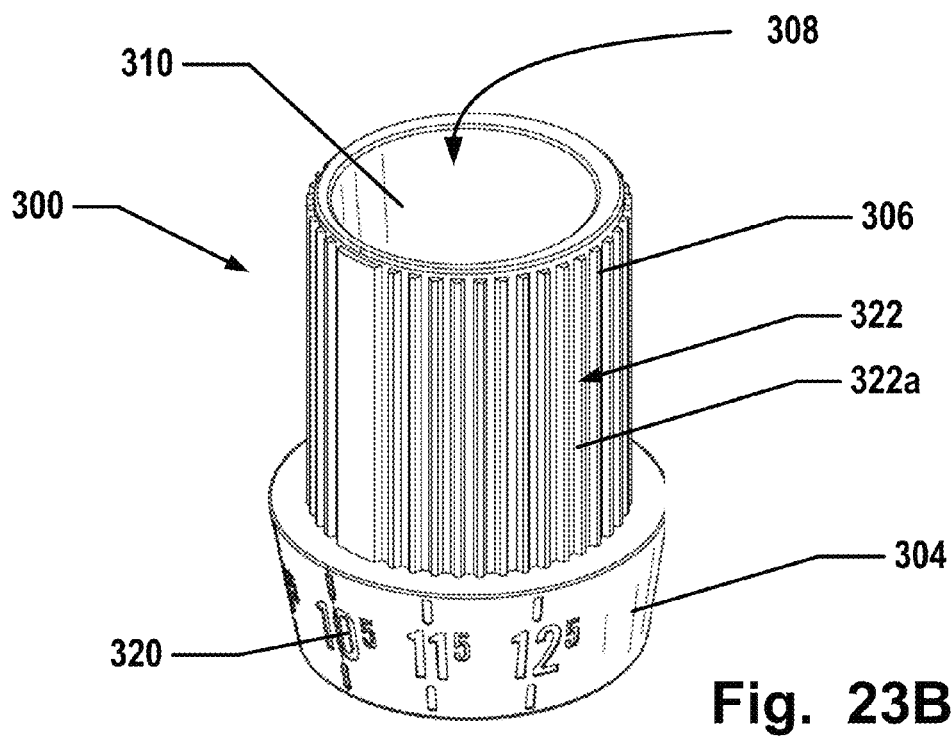
Figure 23C:
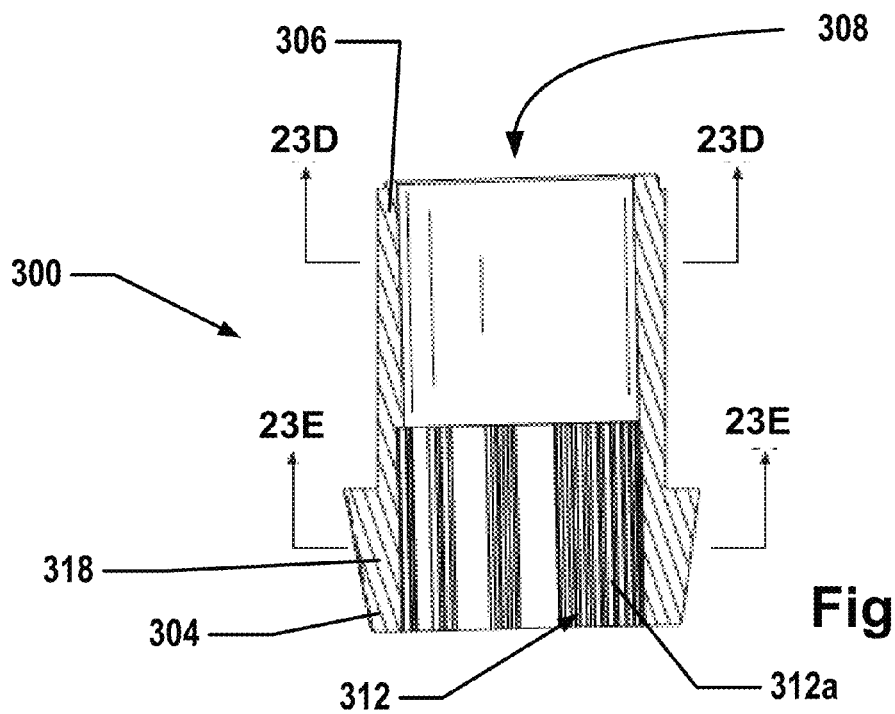
Figure 23D:
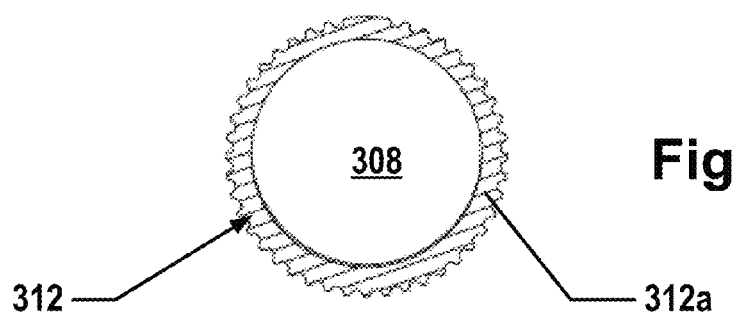
Figure 23E:
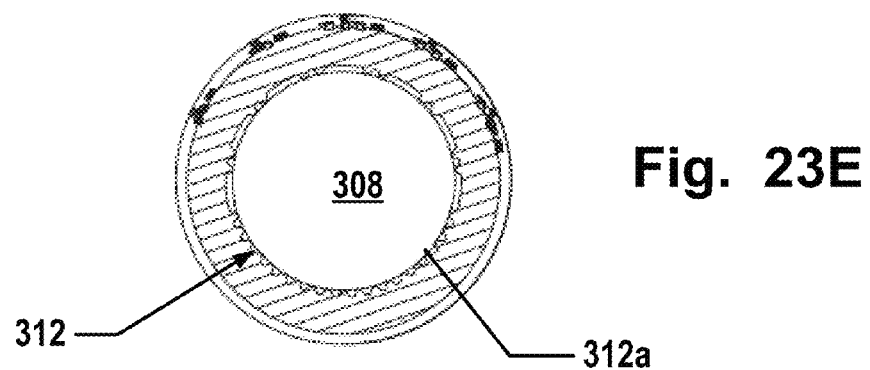

As illustrated in FIG. 23C, at least a portion of the interior of the first end 304 of the hosel adapter 300 includes the second rotation-inhibiting structure 312. While a variety of rotation-inhibiting structures may be provided without departing from this invention, in this example structure, the second rotation-inhibiting structure 312 constitutes splines 312a extending along the interior longitudinal axis. The splines 312a of the hosel adapter 300 may prevent rotation of the shaft adapter 200 with respect to the hosel adapter 300 into which it is fit (and ultimately with respect to a golf club head). The splines 312a of the hosel adapter 300 and the splines 212a of the shaft adapter 200 may be configured to interact with each other to thereby limit the number of rotations of the shaft adapter 200 within the hosel adapter 300. This will be explained more below.

Other features of this example hosel adapter 300 may include an "off-axis" or angled bore hole or interior chamber 308 in which the shaft adapter 200 is received as illustrated for example in FIG. 23C. More specifically, in this illustrated example, the outer cylindrical surface of the hosel adapter 300 extends in a first axial direction, and the interior cylindrical surface of the bore hole 308 extends in a second axial direction that differs from the first axial direction, thereby creating a hosel adapter offset angle. In this manner, while the hosel adapter 300 exterior maintains a constant axial direction corresponding to that of the interior of the club head chamber 404 and hosel ring 500 and the openings, the shaft adapter 200 (and thereby the shaft 106) extends away from the club head 102 at a different and adjustable angle with respect to the club head 102, the hosel adapter 300, and the club head's ball striking face. In this given example, the shaft position and/or angle corresponds to a given loft angle. The rotational positions for loft angle may be defined by loft angles starting from approximately 7.5 degrees to 12.5 degrees. Similar configurations of loft angles starting lower and higher may also be utilized without departing from this invention. The club head position and/or loft angle may be adjusted, for example, by rotating the hosel adapter 300 with respect to the hosel ring 500 and the club head 102.

While any desired hosel adapter offset angle may be maintained between the first axial direction and the second axial direction, in accordance with some examples of this invention, this hosel adapter offset angle or face angle adjustment may be between 0.25 degrees and 10 degrees, and in some examples between 0.5 degrees and 8 degrees, between 0.75 degrees and 6 degrees, or even between 1 degree and 4 degrees. In more specific examples of the invention, the hosel adapter offset angle or face angle adjustment may by approximately 1 degree or one-half degree offset.

The second end 306 of the hosel adapter 300 defines a second opening 310 for receiving a securing member 408. Generally, the second opening 310 is sized such that the securing member 408 is able to freely pass through the second opening 310 to engage the threaded hole 210 in the shaft adapter 200. Alternatively, if desired, the securing member 408 also may engage the hosel adapter 300 at the second opening 310 (e.g., the second opening 310 may include threads that engage threads provided on the securing member 408). The securing member 408 may also include a spherical washer 408A and a screw retention device 408B.

Figure 24A:
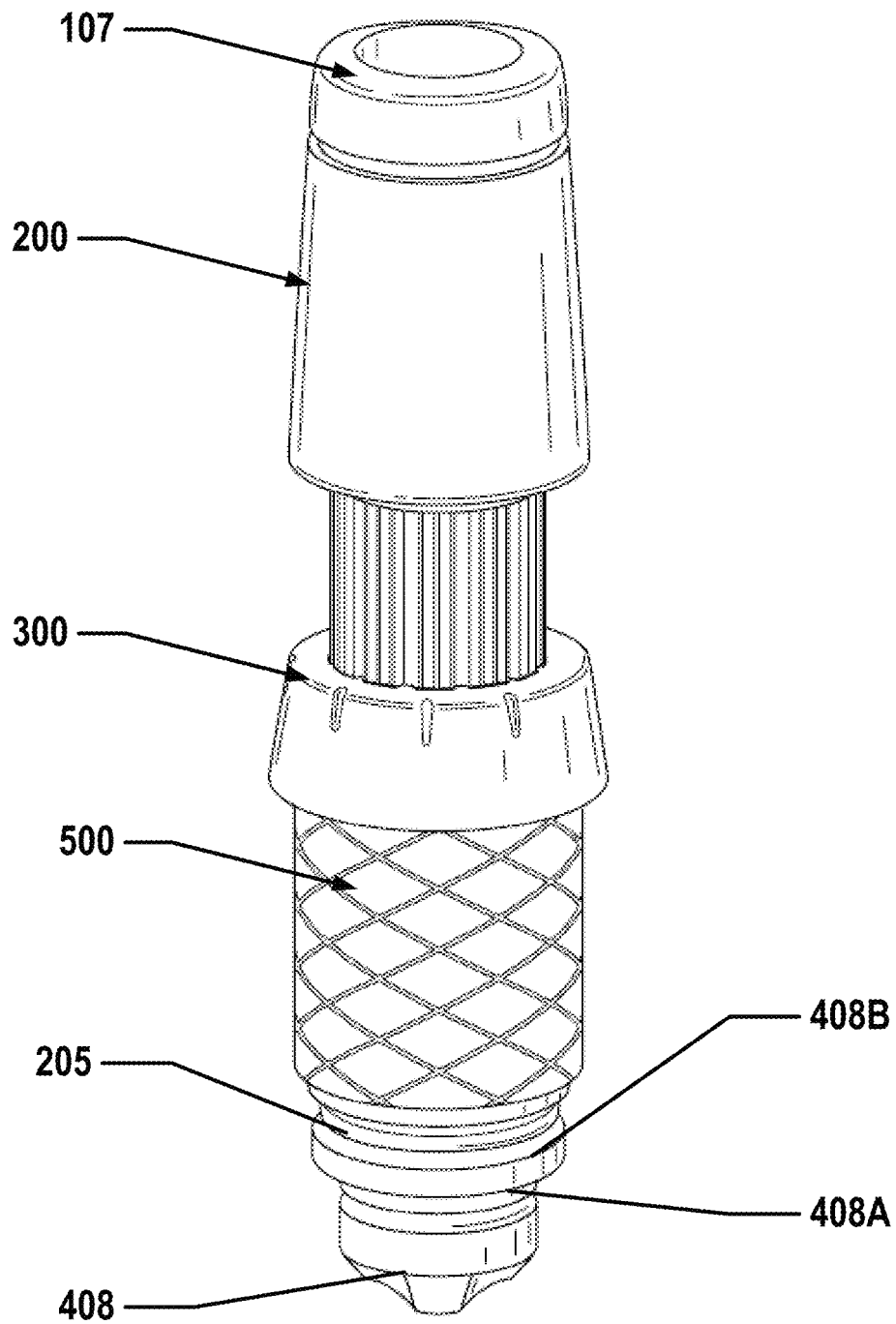
Figure 24B:
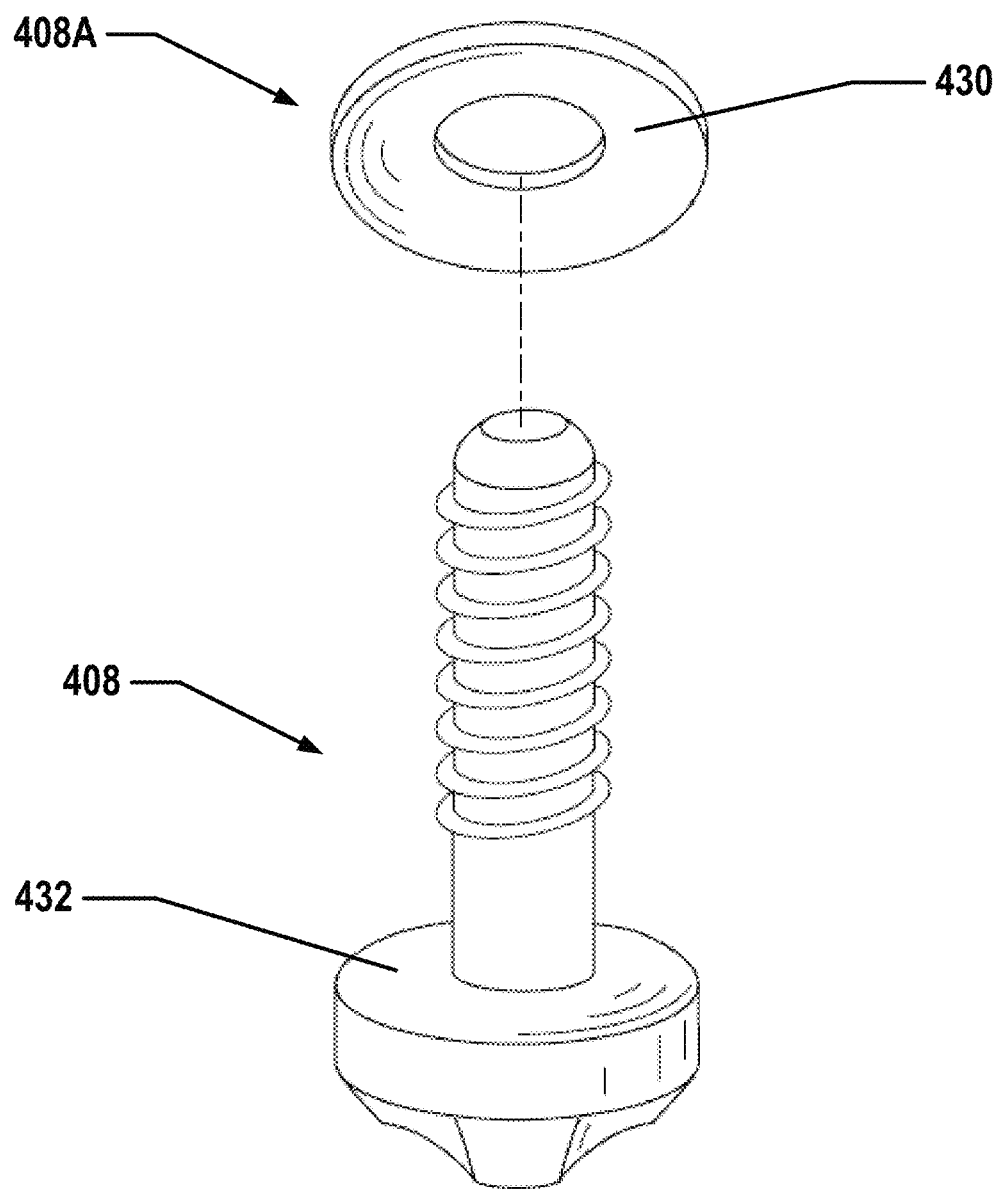
Figure 25:
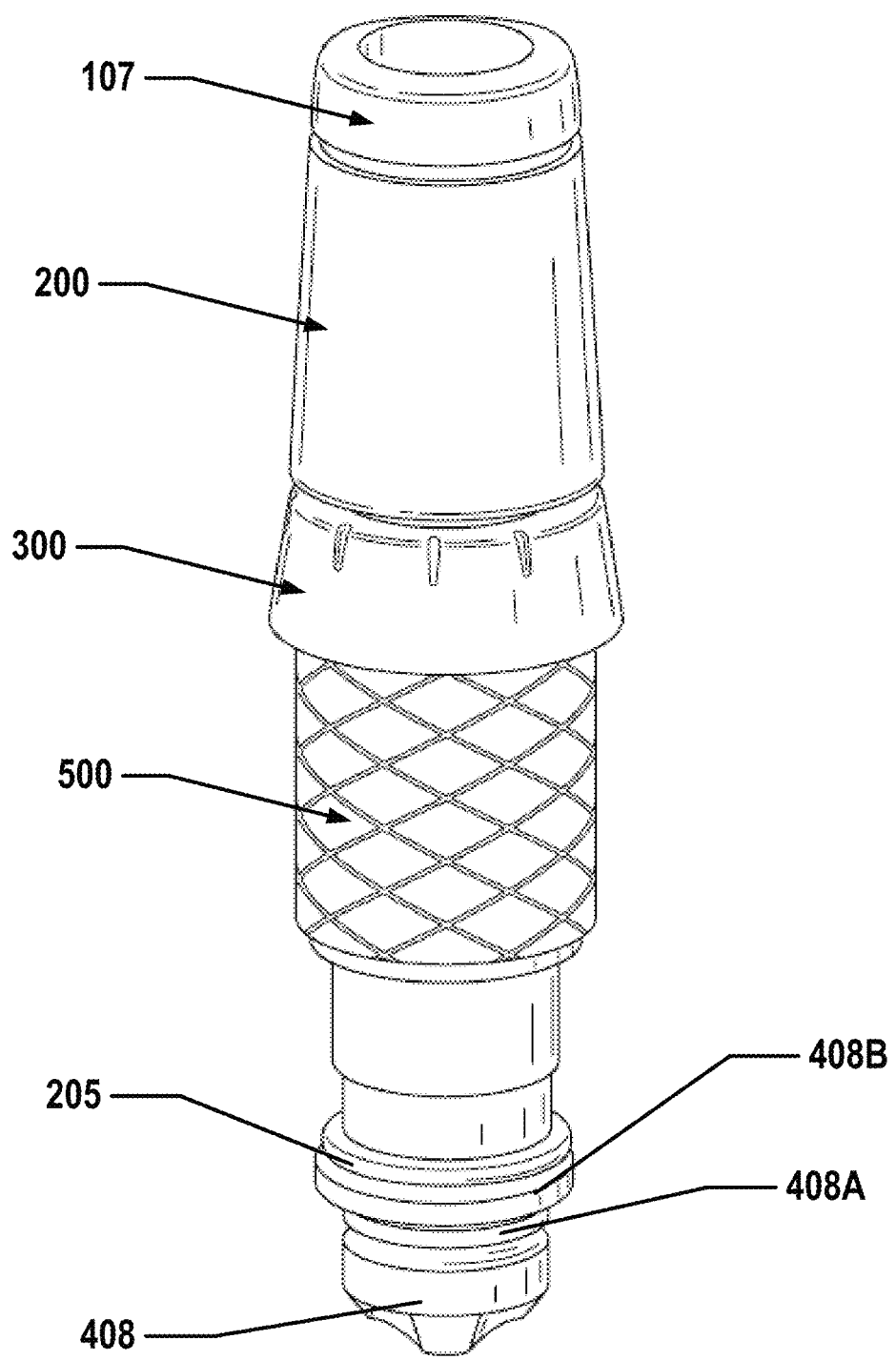
Figure 26:
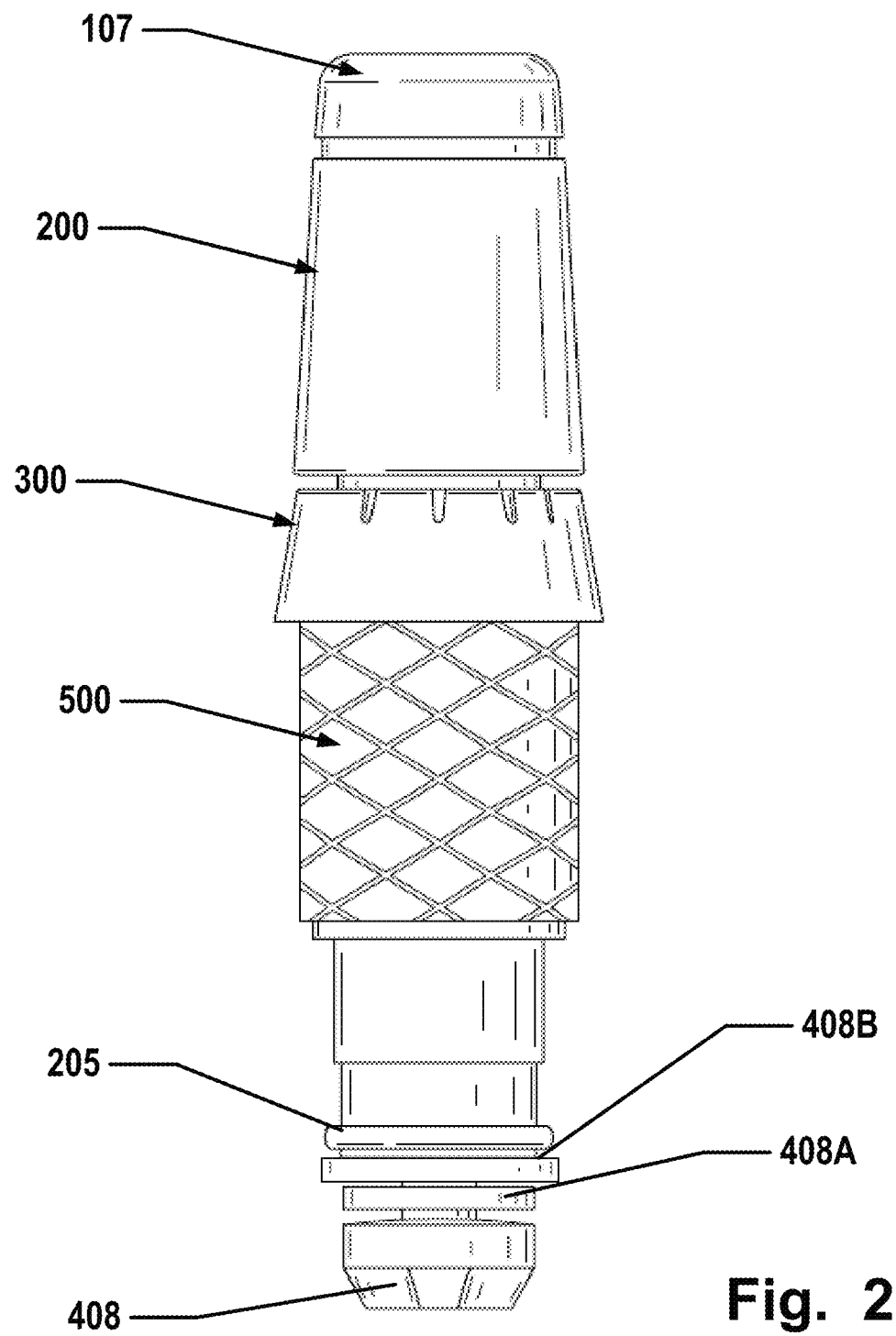

As illustrated in FIG. 24B, the spherical washer 408A may have a convex surface 430 on the side that mates or engages the head of the threaded bolt member 408. Additionally, the head of the threaded bolt member 408 may have a concave surface 432 that mates with the convex surface 430 of the spherical washer 408A. This convex-concave surface 430-432 mating assists with and allows the misalignment from the rotation of the off-axis sleeves may cause for the threaded bolt member 408 and the rest of the releasable connection 104.

As illustrated in FIG. 21A, the securing system may also include a screw retention device 408B. The screw retention device 408B may be located in the club head chamber 404. Additionally, the screw retention device 408B may be sized such that the screw retention device is bigger than the mounting plate 410. The screw retention device 408B retains the threaded bolt member 408 and not allowing the threaded bolt member 408 to fall out of the club head 102.

The hosel adapter 300 may also be non-rotatable with respect to the golf club head 102. As illustrated in FIGS. 23A and 23B, the exterior of the first end 304 along an exterior surface 302 of the hosel adapter 300 includes a third rotation-inhibiting structure 322 configured to engage a fourth rotation-inhibiting structure 512 on a hosel ring 500 (e.g., in an interlocking manner with respect to rotation). As shown, at least a portion of the first end 304 of the hosel adapter 300 includes the third rotation-inhibiting structure 322 on the exterior surface 302 of the hosel adapter. While a variety of rotation-inhibiting structures may be provided without departing from this invention, in this example structure, the rotation-inhibiting structure 322 constitutes splines 322a extending along the longitudinal axis of the exterior surface of the hosel adapter 300. The splines 322a on the exterior surface of the hosel adapter 300 may prevent rotation of the hosel adapter 300 with respect to the member into which it is fit (e.g., a club head or hosel ring 500, as will be explained in more detail below). The third rotation-inhibiting structure 322 may extend along the overall longitudinal length of the hosel adapter 300.

FIGS. 23A and 23B further illustrate that the first end 304 of the hosel adapter 300 includes an expanded portion 318. The expanded portion 318 provides a stop that prevents the hosel adapter 300 from extending into the club head body and provides a strong base for securing the hosel adapter 300 to the club head body 102. Also, the exterior shape of the first end 304 may be tapered to provide a smooth transition between the shaft 106 and the club head 102 and a conventional aesthetic appearance.

The hosel adapter 300 may be made from any desired materials and from any desired number of independent parts without departing from this invention. In this illustrated example, the entire hosel adapter 300 is made as a unitary, one-piece construction from conventional materials, such as metals or metal alloys, plastics, and the like. In at least some example structures according to this invention, the hosel adapter 300 will be made from a titanium, aluminum, magnesium, steel, or other metal or metal alloy material. Additionally, the hosel adapter 300 may be made from a self-reinforced polypropylene (SRP), for example PrimoSpire® SRP. The bore and/or surface structures (e.g., splines 312a, splines 322a, and expanded portion 318) may be produced in the material in any desired manner without departing from the invention, including via production methods that are commonly known and/or used in the art, such as by drilling, tapping, machining, lathing, extruding, grinding, casting, molding, etc. The shaft adapter 200 and hosel adapter 300 and any of the other parts could be metal or plastic, or any other suitable materials in any combination. For example, the hosel adapter 300 may be a high-strength plastic while the shaft adapter 200 is made of a metal. Other combinations may utilized without departing from the invention.

Exemplary hosel rings 500 are illustrated in FIGS. 21A and 21B. As shown, the hosel ring 500 is generally cylindrical in shape. Along the interior sides of the borehole 508, the hosel ring 500 includes a fourth rotation-inhibiting structure 512 configured to engage the third rotation-inhibiting structure 322 on the hosel adapter 300 (e.g., in an interlocking manner with respect to rotation). At least a portion of the interior of the hosel ring 500 includes the fourth rotation-inhibiting structure 512. While a variety of rotation-inhibiting structures may be provided without departing from this invention, in this example structure, the fourth rotation-inhibiting structure 512 constitutes splines 512a extending along the interior longitudinal axis. The splines 512a of the hosel ring 500 may prevent rotation of the hosel adapter 300 with respect to the club head 102 into which it is fit. The splines 512a of the hosel ring 500 and the exterior splines 322a of the hosel adapter 300 may be configured to interact with each other to thereby limit the number of rotations of the hosel adapter 300 within the hosel ring 500. This interaction will be explained more below.

The hosel ring 500 may also be non-rotatable with respect to the golf club head 102. In an exemplary embodiment, the hosel ring 500 may secured to the club head chamber 404 by any means known and/or used in the art, such as adhesive, glue, epoxy, cement, welding, brazing, soldering, or other fusing techniques, etc. FIG. 21A illustrates the hosel ring 500 secured to the club head 102 in the club head chamber 404. Additionally, the hosel ring 500 may be an integral part of the club head 102, wherein the hosel ring 500 may be molded into the club head chamber 404.

The hosel ring 500 may be made from any desired materials and from any desired number of independent parts without departing from this invention. In this illustrated example, the entire hosel ring 500 is made as a unitary, one-piece construction from conventional materials, such as metals or metal alloys, plastics, and the like. In at least some example structures according to this invention, the hosel ring 500 will be made from a titanium, aluminum, magnesium, steel, or other metal or metal alloy material. The bore and/or surface structures (e.g., splines 512a) may be produced in the material in any desired manner without departing from the invention, including via production methods that are commonly known and/or used in the art, such as by drilling, tapping, machining, lathing, extruding, grinding, casting, molding, etc.

FIGS. 24A through 26 illustrate the releasable connection 104 showing all of the components fitted together. Additionally, as illustrated in FIGS. 21A, 21B, 24A, 25, and 26, the releasable connection 104 may also include a shaft ring 107. The shaft ring 107 may provide an additional smooth transition from the shaft 106 to the shaft adapter 200.

The adjustment of the rotational position of the shaft adapter 200 (and the attached shaft 106) and hosel adapter 300 will be explained in more detail below in conjunction with FIG. 21A. Changing the rotational position of the shaft adapter 200 with respect to the hosel adapter 300 may adjust one or more of various parameters, such as loft angle, face angle, or lie angle of the overall golf club. In the exemplary embodiment as illustrated in FIGS. 21A-26, changing the rotational position of the shaft adapter 200 with respect to the hosel adapter 300 may adjust the face angle. Other parameters of the club head may be designed to be adjustable, such as inset distance, offset distance, to fade bias, to draw bias, etc). Additionally, changing the rotational position of the hosel adapter 300 with respect to the hosel ring 500 and the club head 102 may adjust one or more of the various parameters of the overall golf club. In the exemplary embodiment as illustrated in FIGS. 21A through 26, changing the rotational position of the hosel adapter 300 with respect to the hosel ring 500 and the club head 102 may adjust the loft angle. In these specific embodiments, the shaft adapter 200 and the hosel adapter 300 have independent off-axis bores which enable them to independently adjust the face angle (shaft adapter 200) and the loft angle (hosel adapter 300).

To enable users to easily identify the club head's "settings" (e.g., the club head body 102 position and/or orientation with respect to the shaft 106), any or all of the shaft 106, the shaft adapter 200, hosel adapter 300, and/or the club head 102 may include markings or indicators. FIGS. 22A and 22B show an indicator 220 on the shaft adapter 200 (e.g., on the expanded portion 214). FIGS. 23A and 23B show an indicator 320 on the hosel adapter 300 (e.g., on the expanded portion 318). By noting the relative positions of the various indicators, a club fitter or other user can readily determine and know the position of the shaft 106 with respect to the club head body 102 and its ball striking face. If desired, the indicators (e.g., indicators 220, or 320) may be associated with and/or include specific quantitative information, such as a specifically identified loft angle and face angle.

Golf club adjustability design has generally included having mating parts and cooperating engagement surfaces allowing for specific adjustability of the golf club head 102. However, these current designs offer many possible adjustable combinations regarding loft angles, face angles, and lie angles. While this adjustability provides some benefits to the golfers, a large number of options to the golfer can also be confusing and cumbersome to the golfer. In certain exemplary embodiments, the present design and specifically the spline configurations of the various rotation-inhibiting structures, provide a limited set of adjustability options that is more user-friendly for the golfer. For example, the adjustability may be limited to only three different adjustable loft angles and three different adjustable face angles. The loft angles may vary from 7.5 degrees to 12.5 degrees. The face angles may be generally referred to as Neutral, Open, and Closed. Therefore, each club head will have a finite number of rotatable positions, such as a total of nine different face angle and loft angle configurations. The configuration of the rotation-inhibiting structures limit the rotational positions of the shaft adapter and the hosel adapter, providing a more simple, streamlined adjustment features for the golfer. Thus from the figures and descriptions herein, the various spline configurations having engagement surfaces structured such that certain positions are allowed to provide desired adjustment while additional positions are prevented (e.g. the respective splines cannot fit together) to specifically limit the adjustability options.

Another exemplary option set is using four different adjustable loft angles and three different adjustable face angles, thereby creating a club head with a total of twelve different face angle and loft angle configurations. Another exemplary option set is using five different adjustable loft angles and three different adjustable face angles, thereby creating club head with a total of fifteen different face angle and loft angle configurations. Another exemplary option set is using seven different adjustable loft angles and three different adjustable face angles, thereby creating club head with a total of twenty-one different face angle and loft angle configurations. Other configurations of adjustable face angles and loft angles may be utilized without departing from this invention.

Figure 27A:
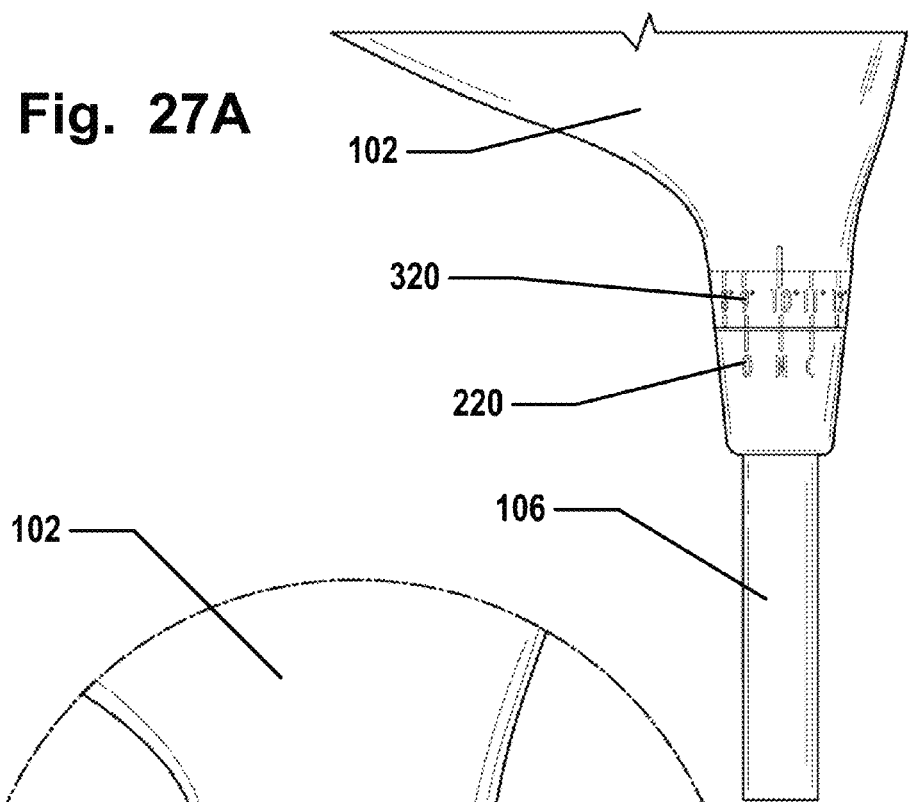
Figure 27B:
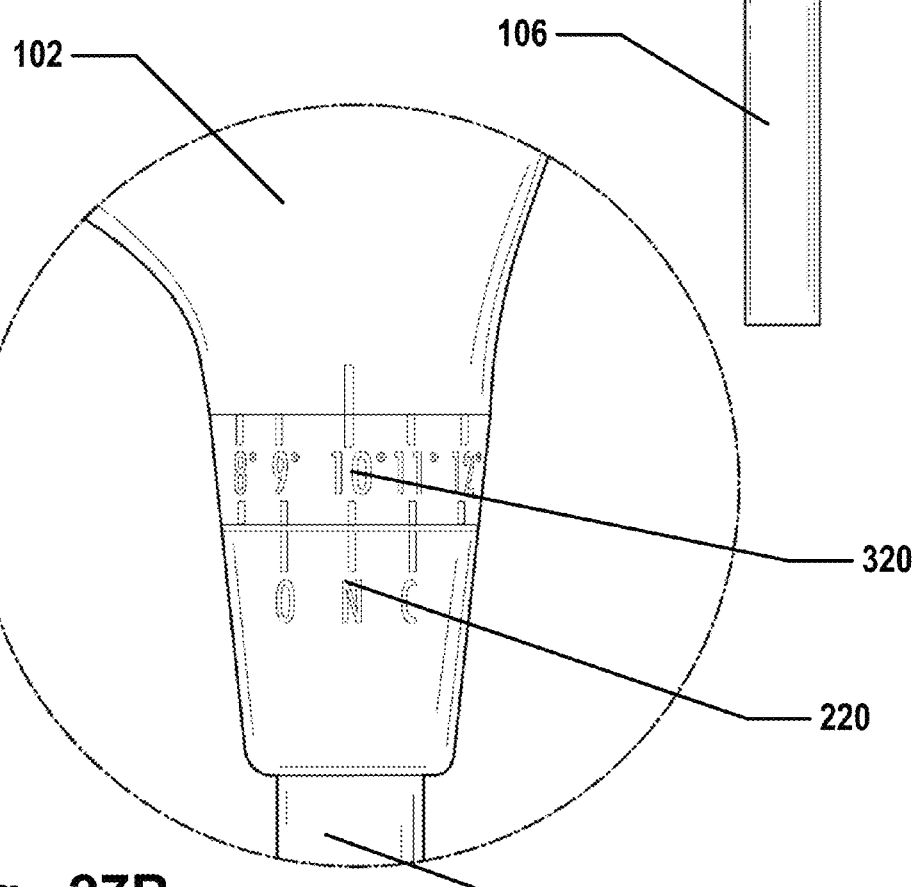
Figures 28A, 28B:
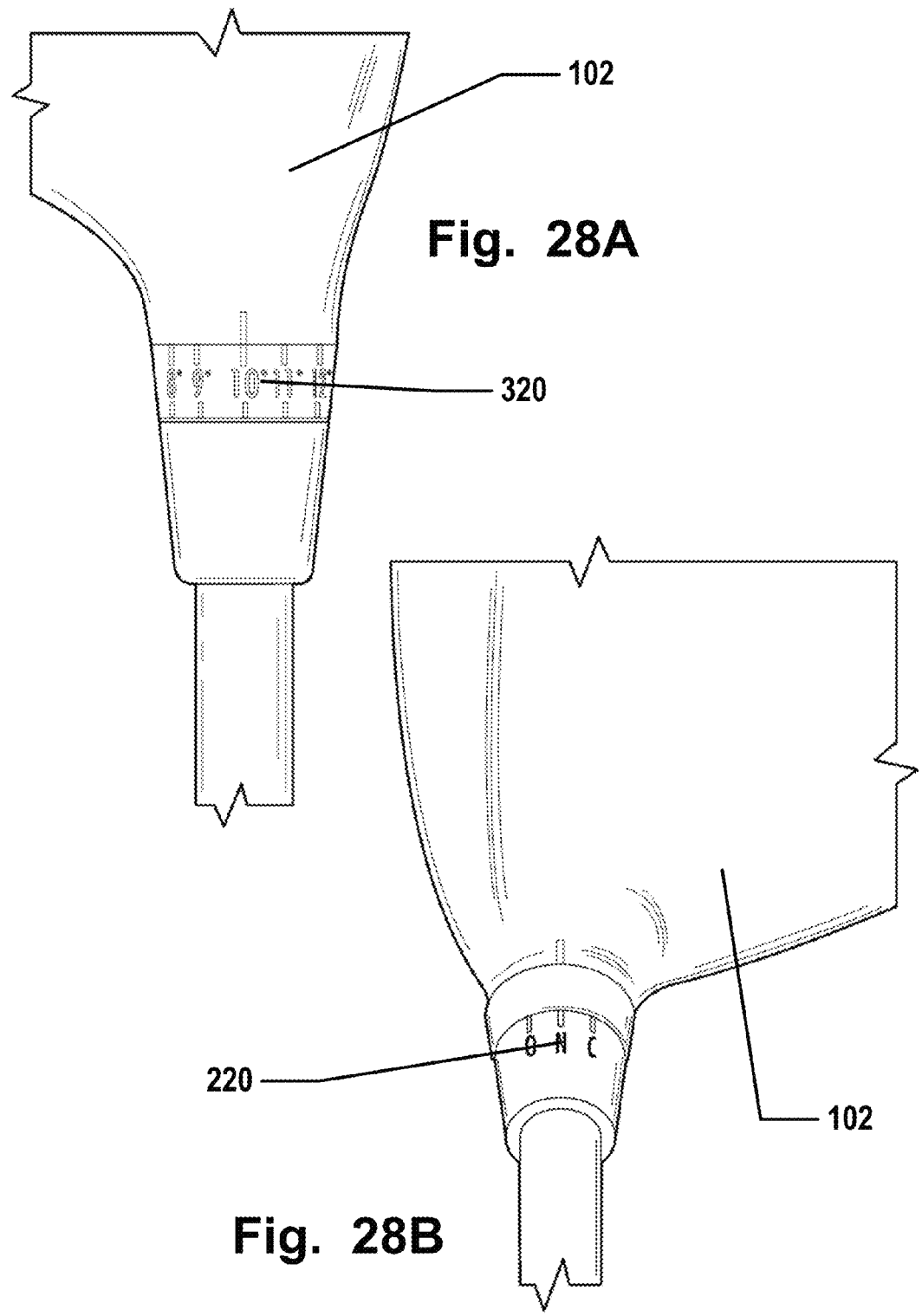
Figure 29:
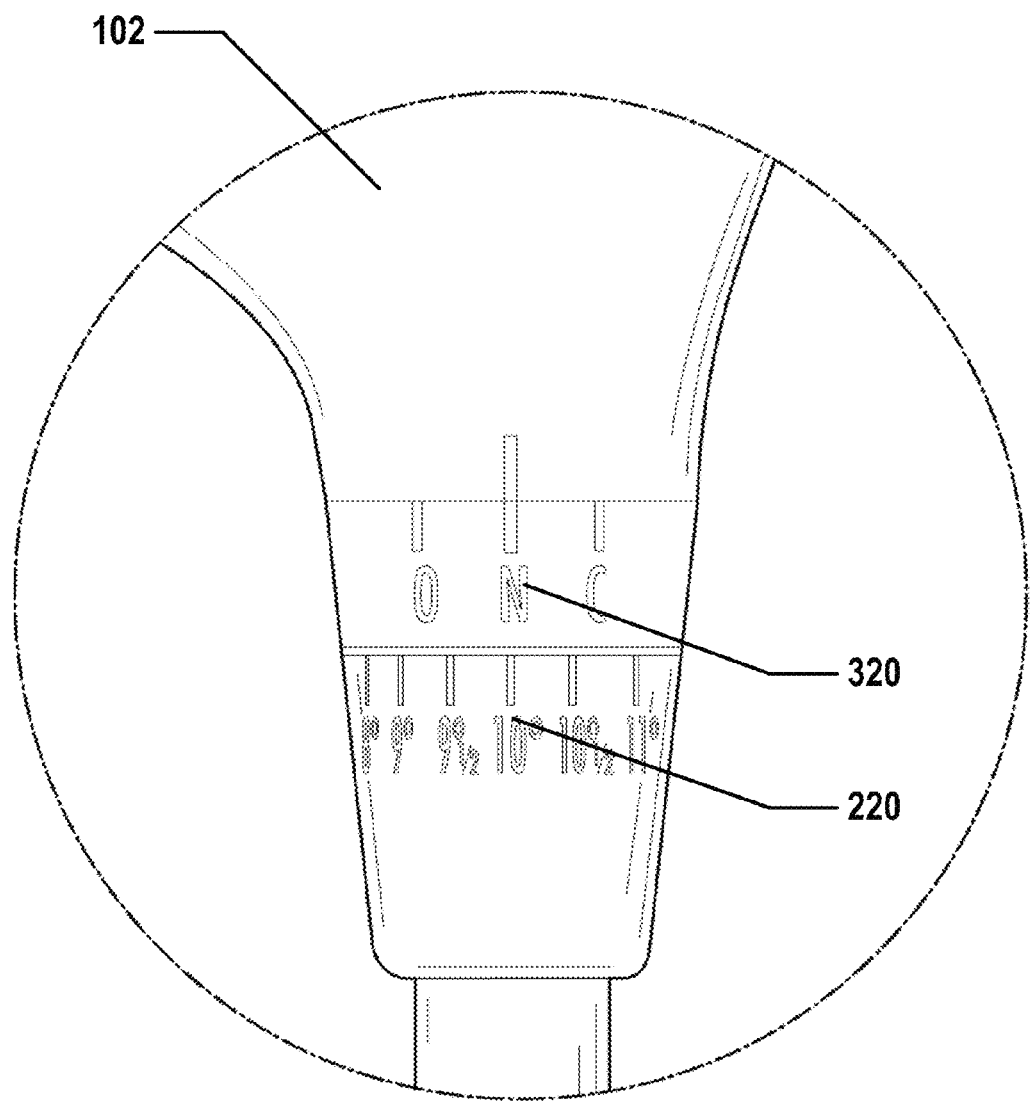
Figure 30:
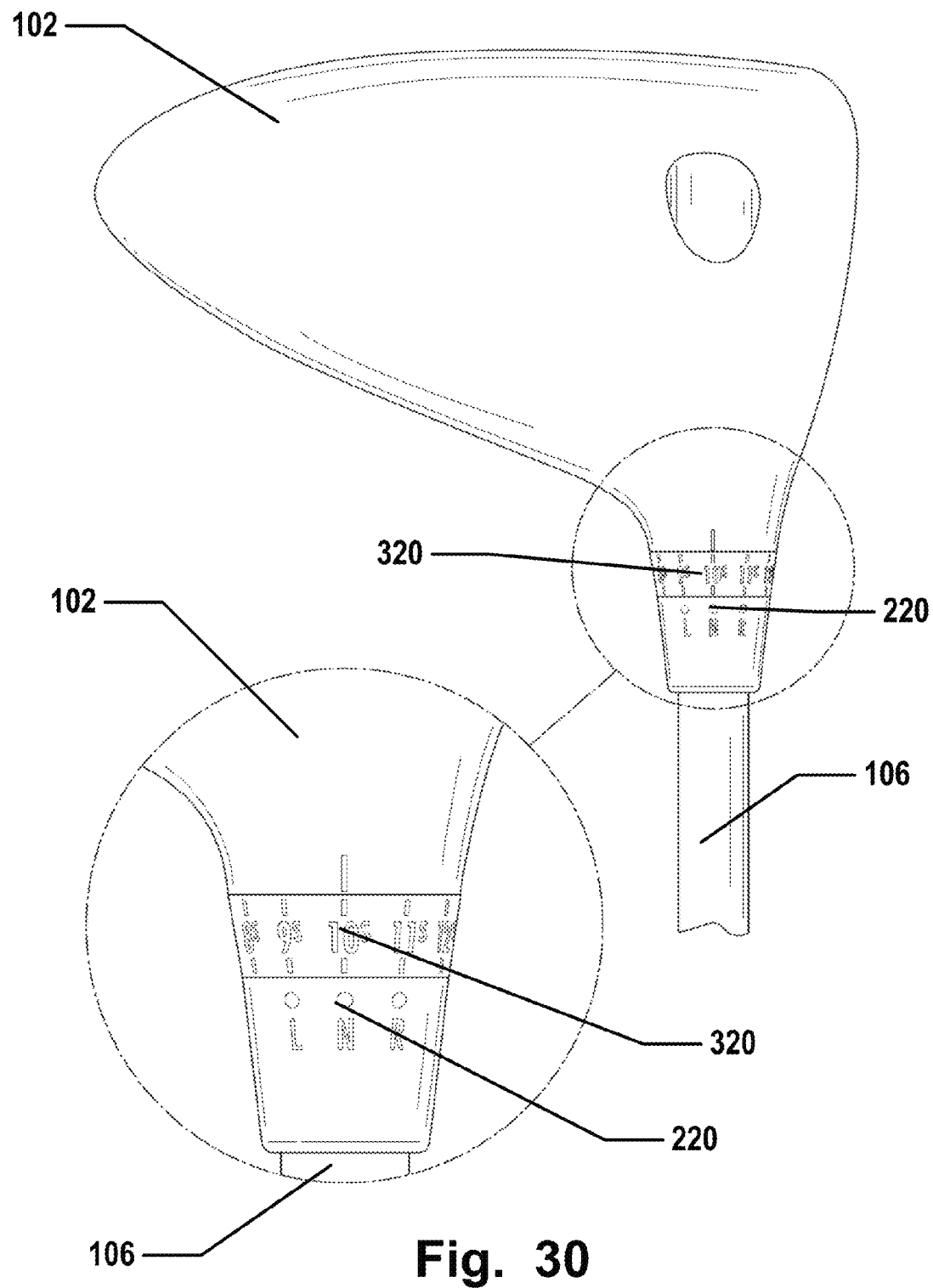
Figure 31A:
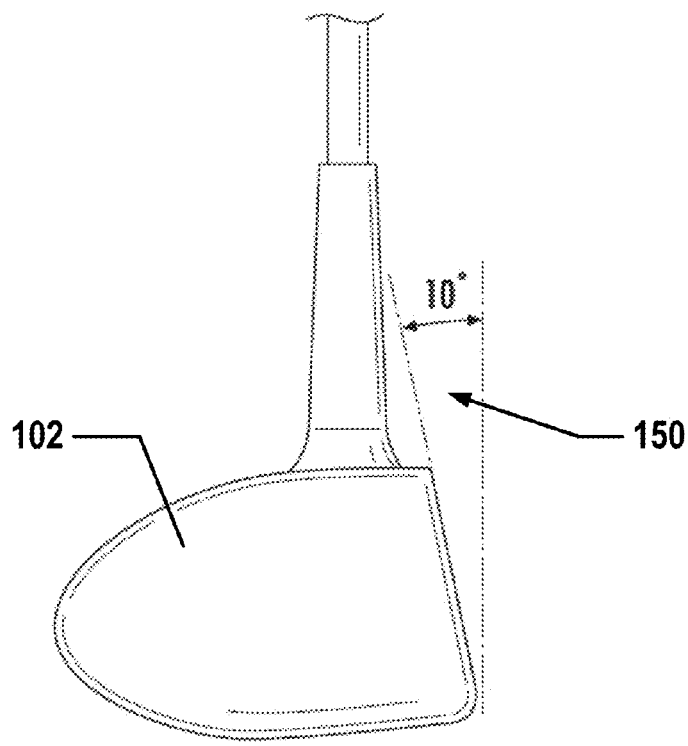
Figure 31B:
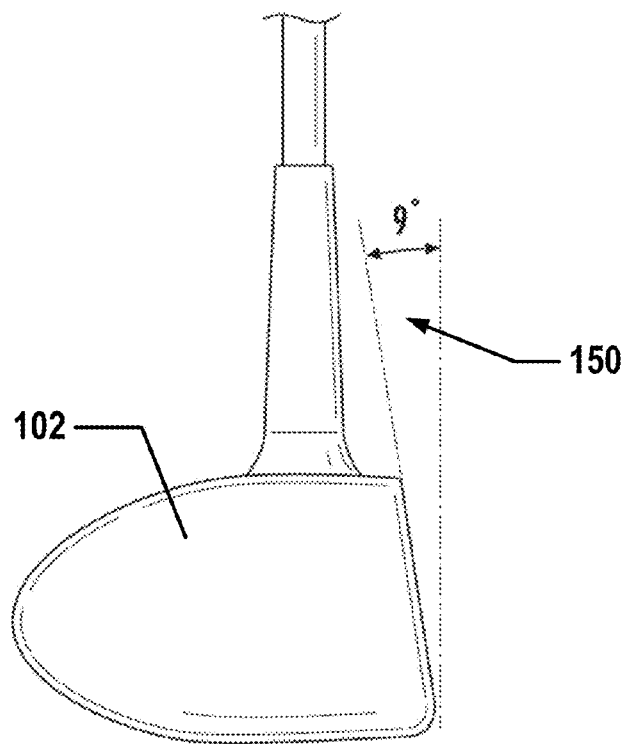
Figure 31C:
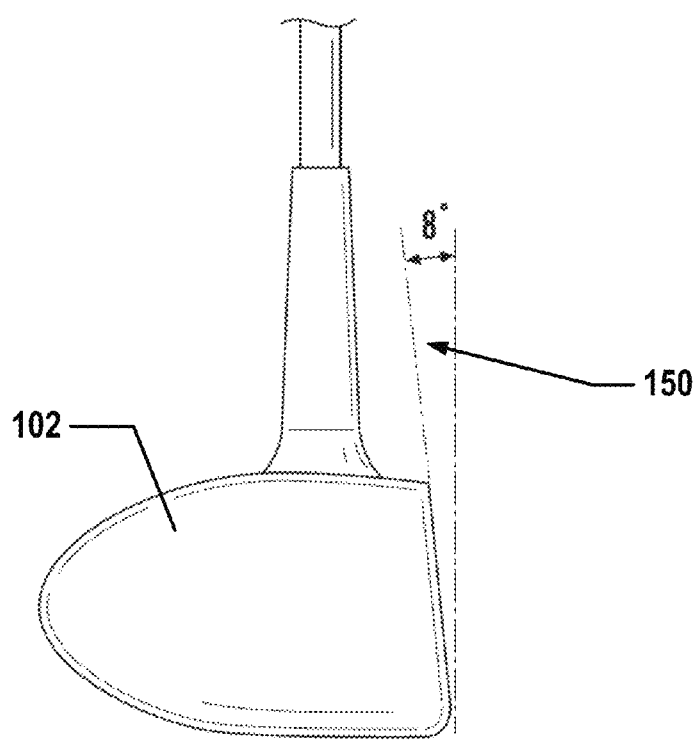
Figure 31D:
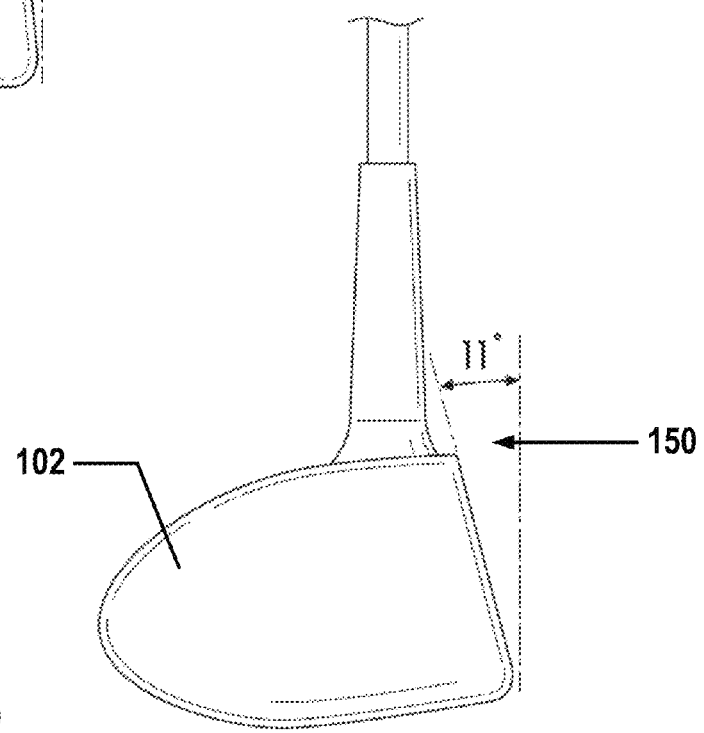
Figure 31E:
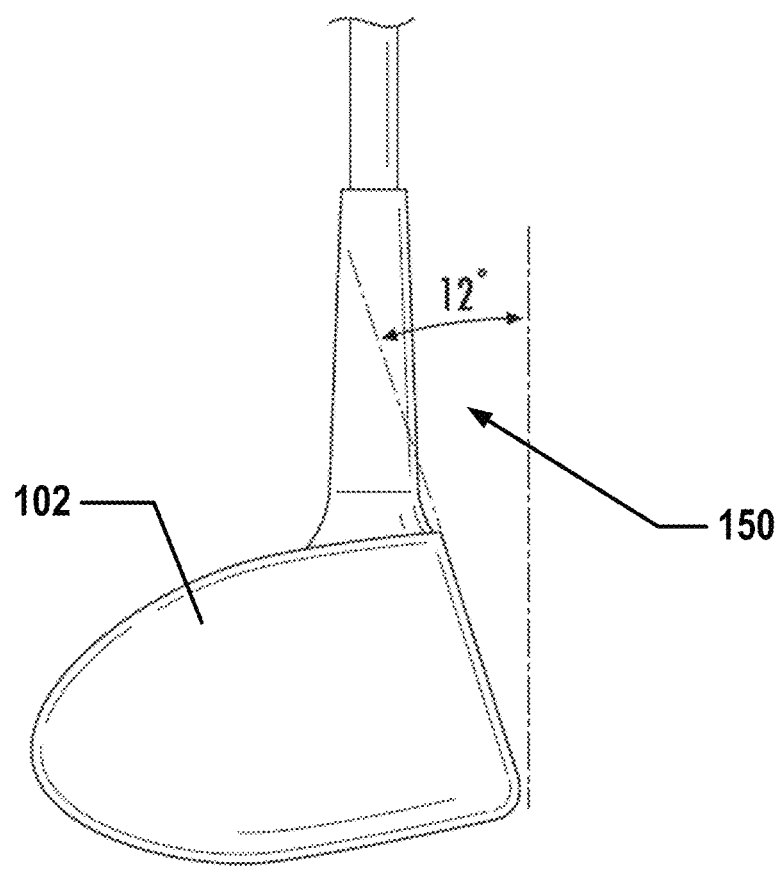
Figure 32A:
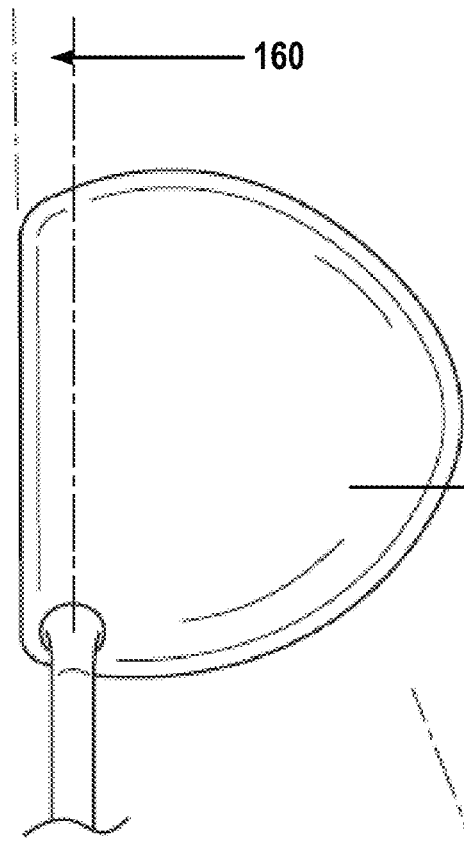
Figure 32B:
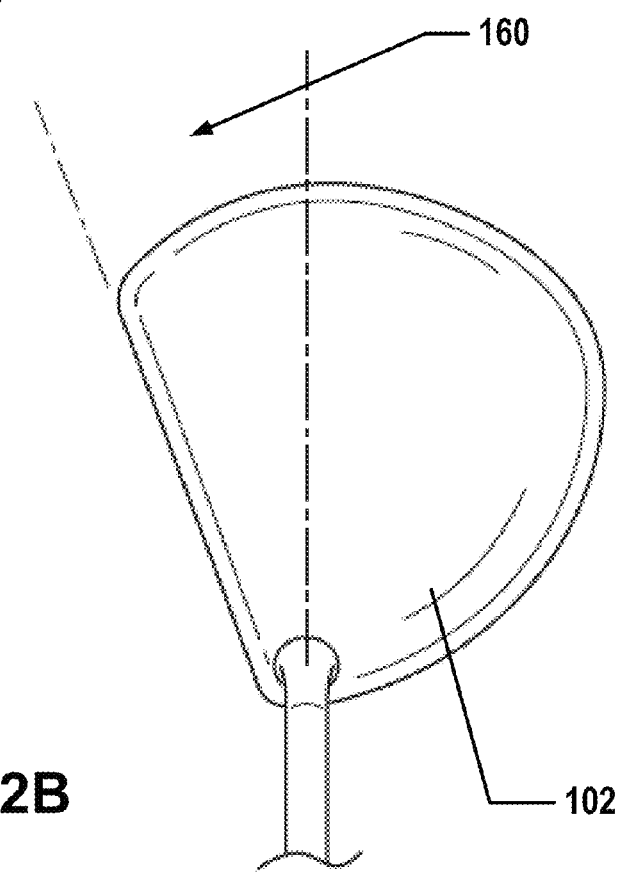
Figure 32C:
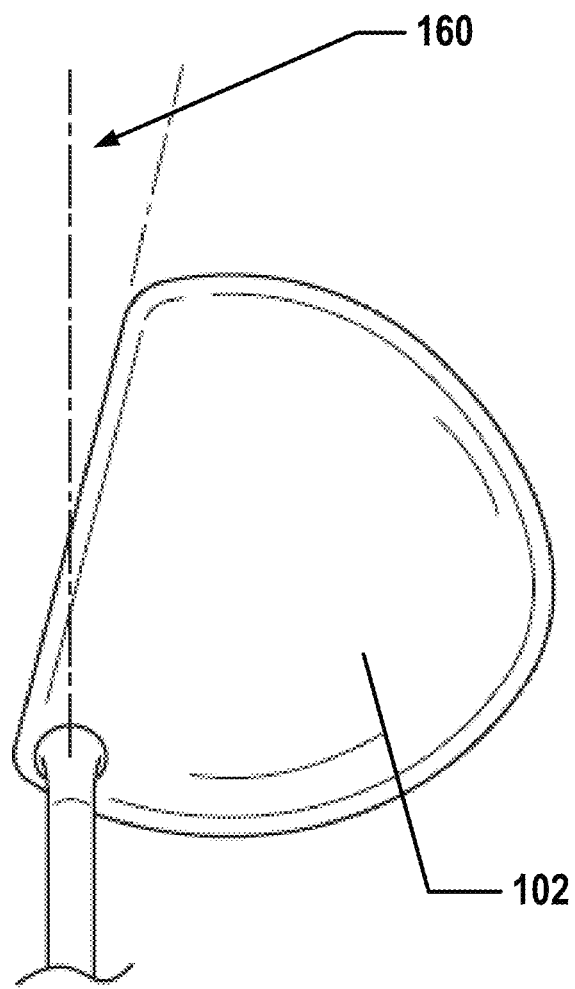

The exemplary embodiment in FIGS. 27A and 27B illustrates a spline configuration that allows five loft angles and three face angles of adjustability. The adjustable loft angles may include 8 degrees, 9 degrees, 10 degrees, 11 degrees, and 12 degrees. FIGS. 31A through 31E show example loft angles for this given club head. The adjustable face angles may include Open ("O"), Neutral ("N") and Closed ("C"). FIGS. 32A through 32C show example face angles for this given club head. The exemplary embodiment in FIG. 30 illustrates a spline configuration that allows five loft angles and three face angles of adjustability. This spline configuration allows for the adjustability of loft angles that may include 8.5 degrees, 9.5 degrees, 10.5 degrees, 11.5 degrees, and 12.5 degrees. The adjustable face angles may include Open or Left ("L"), Neutral ("N"), and Closed or Right ("R"). The exemplary embodiment in FIG. 29 illustrates a spline configuration with seven loft angles and three face angles of adjustability. This spline configuration includes adjustable loft angles that may include 8 degrees, 9 degrees, 9.5 degrees, 10 degrees, 10.5 degrees, 11 degrees, and 12 degrees (not shown). The adjustable face angles may include Open ("O"), Neutral ("N") and Closed ("C"). FIGS. 28A through 30 illustrated other example embodiments of the adjustability options without departing from this invention.

It should be understood that a "Neutral" face angle may be a reference point/reference face angle and not an actual "neutral" face angle of the face or club head. For example, "Neutral" may represent a 1-degree closed face angle of the face. Using a 2-degree face angle adjustment, "Closed" would have a 3-degree closed face and "Open" would have a 1-degree open face. In another example, "Neutral" may represent a 3-degree open face angle of the face. Using a 2-degree face angle adjustment, "Closed" would have a 1-degree open face and "Open" would have a 5-degree open face.

The spline configuration of the embodiment illustrated in FIGS. 21A-26 will be now be described to illustrate how the invention provides for and limits the rotational movement of the shaft adapter 200 and hosel adapter 300 and adjustable face angle and loft angle positions as described above. The embodiment in FIGS. 21A-26 illustrates a three loft angle and three face angle adjustability spline configuration. The internal splines 312a of the hosel adapter 300 and the splines 212a of the shaft adapter 200 may be configured to engage with each other to thereby limit the number of rotations of the shaft adapter 200 within the hosel adapter 300, which in turn thereby defines a concrete number of configurations for the golf club head 102. Additionally, the splines of the hosel ring 500 and the exterior splines 322 of the hosel adapter 300 may also be configured to engage with each other to thereby limit the number of rotations of the hosel adapter 300 within the hosel ring 500. For example, the spline configuration of the hosel ring 500 and the exterior splines 322 of the hosel adapter 300 may be limited to being rotated in three different rotational positions (e.g., three different loft angles).

Description of Example Methods of Assembling Golf Clubs

The present invention provides various methods regarding the assembly and manufacture of golf club heads and golf clubs. Methods of improved inventory management and for providing a selection of golf clubs to sellers are also disclosed.

Additionally, another aspect of this invention may relate to methods of assembling golf clubs using adjustment members in accordance with examples of this invention. Such methods may include: (a) providing a golf club head with at least a first base parameter (e.g., by manufacturing it, from a third party supplier, etc.); (b) producing at least one adjustment member (including the adjustment members described herein) that permits substantially independent adjustment of the first base parameter from a first base parameter value to one or more alternate values; (c) engaging (e.g., via cements or adhesives, via other fusing or mechanical fastening techniques, or in a releasable manner, etc.) the adjustment member with the head, wherein the adjustment member is operably associated with the club head and may utilize cooperating surfaces to achieve adjustment; (d) engaging a shaft and grip with the golf club head and/or the adjustment member; wherein steps (a)-(d) produce a reconfigurable first golf club that eliminates the need to provide at least one other golf club head having a second base parameter value to produce a second golf club.

The reconfigurable golf club may include a base loft angle (which could also be addressed as baseline loft angle or neutral loft angle). This base loft angle may include any loft angle appropriate for a particular golf club, for example a driver type golf club may have a nominal base loft angle of approximately 10.5 degrees loft angle. Other loft angles may be utilized without departing from this invention.

The method may further include changing the club loft angle from the base loft angle. The adjustment member according to examples of this invention may allow a user to change the club loft angle from the base loft angle in discrete increments, for example 1 degree, plus a tolerance, e.g. +/−0.3 degree. The adjustment member may therefore allow the user to change the exemplary base club loft angle to 9.5 degrees or 11.5 degrees, effectively lowering or raising the loft angle by 1 degree. Additionally, the adjustment member may allow the user to change the club loft angle by up to +/−4 degrees, plus a tolerance, e.g. 0.3 degree, from a base or reference loft angle. For example, the adjustment member may allow the user to change the nominal base loft angle to 6.5 degrees, 7.5 degrees, 8.5 degrees, 9.5 degrees, 11.5 degrees, 12.5 degrees, 13.5 degrees, or 14.5 degrees. When the loft angle is changed, there may be substantially no change (or a minimal change) to any other parameters, variables or characteristics of the golf club head or golf club, e.g., lie angle, face angle, bulge curvature, roll curvature, face center location, club head center of gravity location, sole contact point location, moments of inertia of the club head about various axes passing through the center of gravity, etc. The adjustment member according to examples of this invention may enable a user to select from at least 3 different lofts on a single club head, while ensuring there is substantially no change to other club or club head variables, parameters or characteristics.

In another example, or in addition to the above example, the reconfigurable golf club may include a base face angle (which could also be addressed as baseline face angle or neutral face angle). This base face angle may include any face angle appropriate for a particular golf club, for example a driver type golf club may have a nominal base face angle of approximately 1 degree open or a neutral face angle, or 0 degrees. Other base face angles may be utilized without departing from this invention.

The method may further include changing the club face angle from the base face angle. A second adjustment member, according to examples of this invention may allow a user to change the club face angle from the base face angle in discrete increments, for example 2 degree, plus a tolerance, e.g. +/−0.5 degree. The adjustment member may therefore allow the user to change the exemplary base club face angle from a neutral face angle to a +2 degree open face angle or a −2 degree closed face angle, effectively lowering or raising the face angle by 2 degrees. Additionally, the adjustment member may allow the user to change the club face angle by up to +/−4 degrees, plus a tolerance, e.g. 0.5 degree, from the base face angle. For example, the adjustment member may allow the user to change the nominal base face angle from a neutral face angle to a +4 degree open face angle or a −4 degree closed face angle. When the face angle is changed, there may be substantially no change to any other parameters, variables or characteristics of the golf club head or golf club, e.g., lie angle, loft angle, bulge curvature, roll curvature, face center location, club head center of gravity location, sole contact point location, moments of inertia of the club head about various axes passing through the center of gravity, etc. The adjustment member according to examples of this invention may enable a user to select from at least 3 different face angles on a single club head, while ensuring there is substantially no change to other club or club head variables, parameters or characteristics.

In another method of manufacturing a golf club, relating to methods of assembling golf clubs using adjustment members for the distribution or sale to a retailer in accordance with examples of this invention. Such methods may include: (a) manufacturing a golf club head with at least a first base parameter; (b) producing at least one adjustment member that permits substantially independent adjustment of the first base parameter from a first base parameter value to at least two alternate configurations; (c) engaging (e.g., via cements or adhesives, via other fusing or mechanical fastening techniques, or in a releasable manner, etc.) the adjustment member with the head, wherein the adjustment member is operably associated with the club head and may utilize cooperating surfaces to achieve adjustment; (d) engaging a shaft and grip with the golf club head and/or the adjustment member; wherein steps (a)-(d) produce a reconfigurable first golf club that eliminates the need to provide at least one other golf club head having a second base parameter value to produce a second golf club.

For example, the reconfigurable golf club may include a base loft angle (which could also be addressed as baseline loft angle or neutral loft angle). This base loft angle may include any loft angle appropriate for a particular golf club, for example a driver type golf club may have a nominal base loft angle of approximately 10.5 degrees loft angle. Other loft angles may be utilized without departing from this invention.

The method may further include changing the club loft angle from the base loft angle. The adjustment member according to examples of this invention may allow a user to change the club loft angle from the base loft angle in discrete increments, for example 1 degree, plus a tolerance, e.g. +/−0.3 degree. The adjustment member may therefore allow the user to change the exemplary base club loft angle to 8.5 degrees or 10.5 degrees, effectively lowering or raising the loft angle by 1 degree. Additionally, the adjustment member may allow the user to change the club loft angle by up to +/−4 degrees, plus a tolerance, e.g. 0.3 degree, from a reference loft angle. For example, the adjustment member may allow the user to change the nominal base loft angle to 5.5 degrees, 6.5 degrees, 7.5 degrees, 10.5 degrees, 11.5 degrees, 12.5 degrees, or 13.5 degrees. When the loft angle is changed, there may be substantially no change to any other parameters, variables or characteristics of the golf club head or golf club, e.g., lie angle, loft angle, bulge curvature, roll curvature, face center location, club head center of gravity location, sole contact point location, moments of inertia of the club head about various axes passing through the center of gravity, etc. The adjustment member according to examples of this invention may enable a user to select from at least 3 different lofts on a single club head, while ensuring there is substantially no change to other club or club head variables, parameters or characteristics.

In another example, or in addition to the above example, the reconfigurable golf club may include a base face angle (which could also be addressed as baseline face angle or neutral face angle). This base face angle may include any face angle appropriate for a particular golf club, for example a driver type golf club may have a nominal base face angle of approximately 1 degree open or a neutral face angle of 0 degrees. Other base face angles may be utilized without departing from this invention.

The method may further include changing the club face angle from the base face angle. The adjustment member may include a second adjustment member, according to examples of this invention may allow a user to change the club face angle from the base face angle in discrete increments, for example 2 degree, plus a tolerance, e.g. +/−0.5 degree. The adjustment member may therefore allow the user to change the exemplary base club face angle from a neutral face angle to a +2 degree open face angle or a −2 degree closed face angle, effectively lowering or raising the face angle by 2 degrees. Additionally, the adjustment member may allow the user to change the club face angle by up to +/−4 degrees, plus a tolerance, e.g. 0.5 degree, from the base face angle. For example, the adjustment member may allow the user to change the nominal base face angle from a neutral face angle to a +4 degree open face angle or a −4 degree closed face angle. When the face angle is changed, there may be substantially no change to any other parameters, variables or characteristics of the golf club head or golf club, e.g., lie angle, loft angle, bulge curvature, roll curvature, face center location, club head center of gravity location, sole contact point location, moments of inertia of the club head about various axes passing through the center of gravity, etc. The adjustment member according to examples of this invention may enable a user to select from at least 3 different face angles on a single club head, while ensuring there is substantially no change to other club or club head variables, parameters or characteristics.

Additionally, the method may include engaging a second shaft and grip with the golf club head and/or the adjustment member, wherein the second shaft and grip have different characteristics than the first shaft and grip. Additionally, the method may include engaging a third shaft and grip with the golf club head and/or the adjustment member, wherein the third shaft and grip have different characteristics than the first shaft and grip and the second shaft and grip.

Purchaser/Retail Methods

As additional example aspects of this invention, a purchaser of a golf club described herein may be provided with a comprehensive selection of options at retail, and the retailer providing the golf club may maintain a reduced amount of inventory for the proffered selection.

In a first example, the retailer may offer golf club heads for purchase and shaft assemblies for sale, as well as complete golf clubs. FIGS. 35A through 36B illustrate various prior art retail displays of golf clubs and retail display systems of golf clubs in accordance with aspects of this invention. As illustrated in FIGS. 35A through 36B, the shaft assemblies may, for example, be offered in four different flex ratings, e.g., senior (A) flex, regular (R) flex, stiff (S) flex, or extra stiff (X) flex and a single loft (e.g. a base loft of 10.5 degrees). Conventionally, a retailer would need to carry an inventory of multiple lofts, e.g., 8.5 degrees, 9.5 degrees, 10.5 degrees, 11.5 degrees and 12.5 degrees, for each shaft flex offered. For example, a retailer may wish to have on hand, at any given time, 25 units of each shaft flex and loft available for a particular golf club model to ensure adequate supply to purchasers. The retailer would therefore be required to maintain an inventory of approximately 500 conventional golf clubs (25 A-flex 8.5 degree loft golf clubs, 25 A-flex 9.5 degree loft golf clubs, 25 S-Flex 8.5 degree loft golf clubs, 25 S-Flex 9.5 degree loft golf clubs, 25 R-Flex 8.5 degree loft golf clubs, 25 R-Flex 9.5 degree loft golf clubs, 25 X-Flex 8.5 degree loft golf clubs, 25 X-Flex 9.5 degree loft golf clubs, etc.). By offering for sale golf clubs incorporating the principles taught herein, the retailer would only need to carry an inventory of 100 assembled golf clubs (25 A-flex with variable loft angle adjustment golf clubs, 25 R-flex with variable loft angle adjustment golf clubs, 25 S-flex with variable loft angle adjustment golf clubs, and 25 X-flex with variable loft angle adjustment golf clubs), wherein an adjustment member would allow the golf clubs to be adjusted from the base loft to the remaining lofts desired (e.g., from 10.5 degrees to 8.5 degrees, 9.5 degrees, 11.5 degrees or 12.5 degrees) while other club or club head parameters remain substantially constant within a specified range. This reduction in inventory drastically reduces the number of golf clubs the retailer would be required to purchase to have sufficient inventory on hand at any given time, freeing up cash flow that can be invested elsewhere. Additionally, the reduced inventory would drastically reduce storage space requirements, significantly reducing overhead costs.

In a second example, the retailer may offer for sale unassembled golf clubs comprising golf club heads (or golf club head assemblies) and shafts (or shaft assemblies) according to the principles taught herein. The shafts (or shaft assemblies) may have four different flex ratings, e.g., senior (A) flex, regular (R) flex, stiff (S) flex, or extra stiff (X) flex and the golf club heads may be provided in a single base loft (e.g. 10.5 degrees). Incorporating a similar strategy as disclosed above, but maintaining separate inventories of golf club heads and shaft assemblies, the retailer may further reduce inventory and therefore further reduce overhead costs and increase cash flow. For example, by offering for sale golf club heads and shaft assemblies incorporating the principles taught herein, the retailer would only need to carry an inventory of 100 shaft assemblies (25 A-flex, 25 R-flex, 25 S-flex, and 25 X-flex) and 25 golf club heads wherein an adjustment member would allow the golf clubs to be adjusted from the base loft to the remaining lofts desired (e.g., from 10.5 degrees to 8.5 degrees, 9.5 degrees, 11.5 degrees or 12.5 degrees) while other club or club head parameters remain substantially constant within a specified range.

Figure 41A:
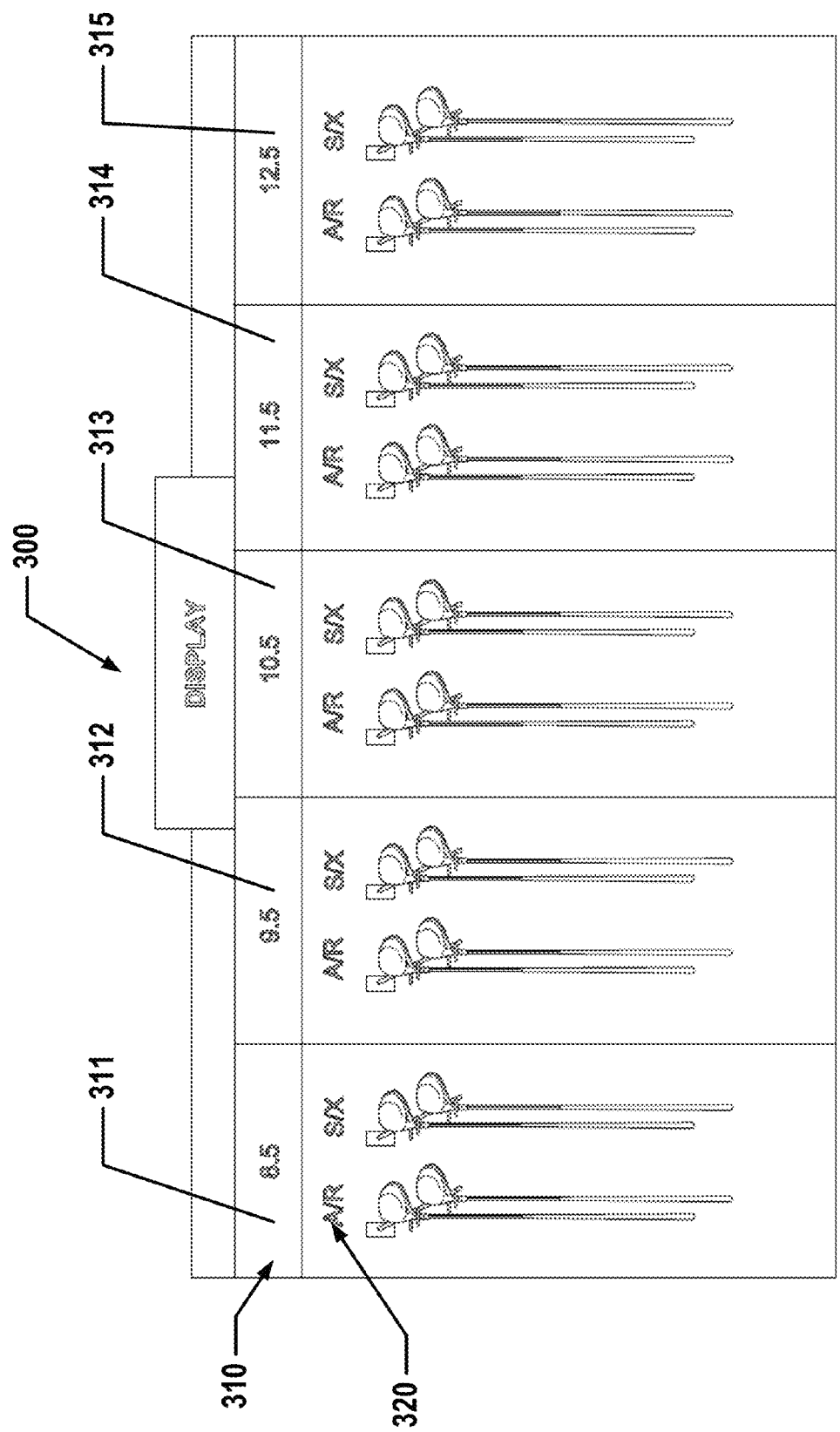

FIG. 41A illustrates a prior art model of a sample selection, retail offering, or retail display 300 of a model of golf club drivers. As illustrated in FIG. 41A, the retail display 300 includes golf club drivers with five different lofts angles 310, that include loft angles of 8.5 degrees 311, 9.5 degrees 312, 10.5 degrees 313, 11.5 degrees 314, and 12.5 degrees 315. Within each loft angle configuration 310, the retail display 300 also includes golf club drivers with four different shaft flex configurations 320, that include a shaft flex 320 of senior (A) flex, regular (R) flex, stiff (S) flex, or extra stiff (X) flex. With these example configurations for a golf club model, there may be 20 different golf club heads to achieve the five different loft angle configurations 310 with four different shaft flex configurations 320.

FIG. 41B illustrates a model of a sample selection, retail offering, or retail display 350 of a model of golf club drivers in accordance with aspects of the invention. The golf club drivers illustrated and offered at the retail offering 350 illustrated in FIG. 41B include a golf club that includes an adjustment member that allows a user to change both the loft angle and the face angle independently of one another. Additionally the golf club head offered for sale in the retail display 350 incorporates design aspects that ensure there is substantially no changes to certain club or club head performance variables, parameters, or characteristics, and/or specified change of other performance variables, parameters, or characteristics. As illustrated in FIG. 41B, there are only four golf clubs offered for sale at the retail display 350. The first golf club 352 has a shaft with a senior (A) flex and a club head and adjustment members in accordance with aspects of the invention. The second golf club 354 has a shaft with a regular (R) flex and a club head and adjustment members in accordance with aspects of the invention. The third golf club 356 has a shaft with a stiff (S) flex and a club head and adjustment members in accordance with aspects of the invention. The fourth golf club 358 has a shaft with an extra stiff (X) flex and a club head and adjustment members in accordance with aspects of the invention.

Each of the club heads illustrated in FIG. 41B may include an adjustment member that allows the golf clubs to be adjusted from the base loft angle to the remaining loft angles desired (e.g., from 10.5 degrees to 8.5 degrees, 9.5 degrees, 11.5 degrees or 12.5 degrees) while other club or club head parameters remain substantially constant within a specified range. Therein, in accordance with aspects of this invention, the retail display 350 as illustrated in FIG. 41B, and utilizing the golf club head and adjustment members as described in this invention, could take the place of the prior art retail display 300 as illustrated in FIG. 41A. By utilizing aspects of this invention, FIG. 35B includes a retail display 350 with 16 less golf clubs than the prior art model retail display as illustrated in FIG. 41A.

Figure 42A:
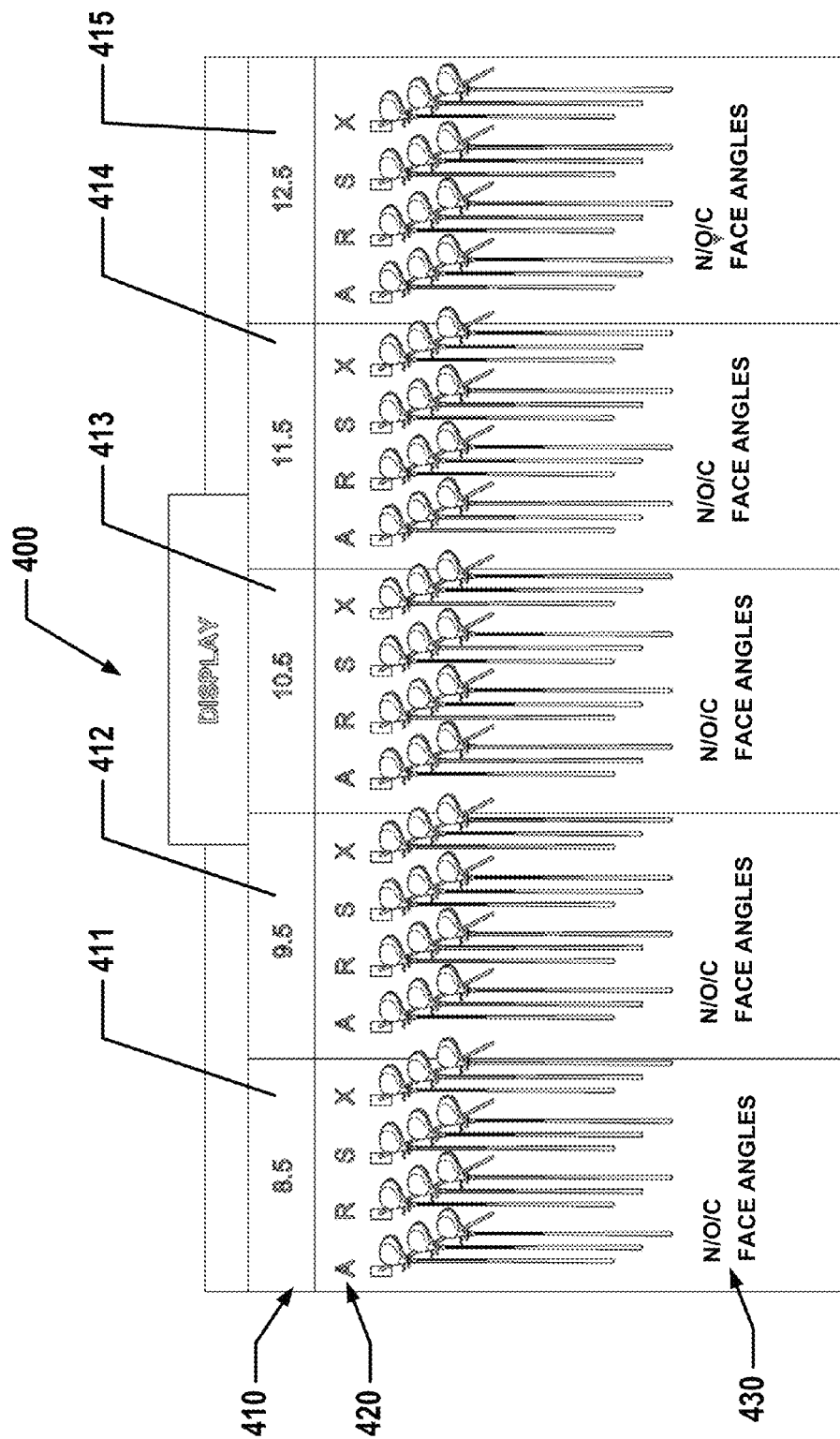

In another aspect of the invention, FIG. 42A illustrates a prior art model of a sample selection, retail offering, or retail display 400 of a model of golf club drivers. As illustrated in FIG. 42A, the retail display 400 includes golf club drivers with five different lofts angles 410, that include loft angles of 8.5 degrees 411, 9.5 degrees 412, 10.5 degrees 413, 11.5 degrees 414, and 12.5 degrees 415. Within each loft angle configuration 410, the retail display 400 also includes golf club drivers with four different shaft flex configurations 420, that include a shaft flex 420 of senior (A) flex, regular (R) flex, stiff (S) flex, or extra stiff (X) flex. Within each different loft angle configuration 410 and each different shaft flex 420, there are three additional golf club drivers with three different face angle configurations 430, a neutral face angle, an open face angle and a closed face angle. With these example configurations for a golf club model, there may be 60 different golf club heads to achieve the five different loft angle configurations 410 with four different shaft flex configurations 420 with three different face angle configurations 430.

Figure 42B:
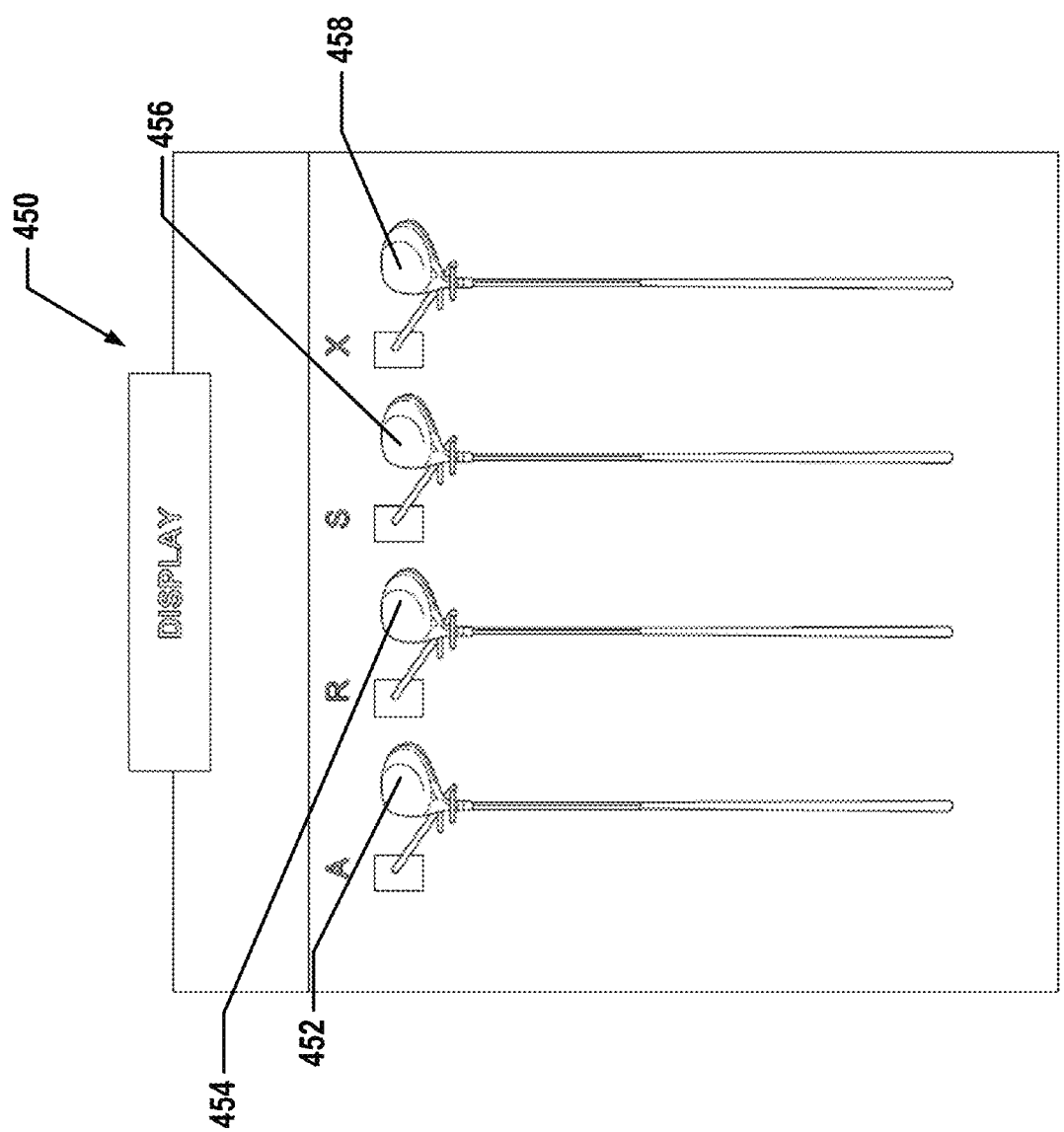

FIG. 42B illustrates a model of a sample selection, retail offering, or retail display 450 of a model of golf club drivers in accordance with aspects of the invention. The golf club drivers illustrated and offered at the retail offering 450 illustrated in FIG. 42B include a golf club that includes an adjustment member, such as described herein, that allows a user to change both the loft angle and the face angle independently of one another. Additionally the golf club head offered for sale in the retail display 450 incorporates design aspects, such as described herein, that ensure there are substantially no changes to certain club or club head performance variables, parameters, or characteristics, and/or specified change of other performance variables, parameters, or characteristics. As illustrated in FIG. 42B, there are only four golf clubs offered for sale at the retail display 450. The first golf club 452 has a shaft with a senior (A) flex and a club head and adjustment members in accordance with aspects of the invention. The second golf club 454 has a shaft with a regular (R) flex and a club head and adjustment members in accordance with aspects of the invention. The third golf club 456 has a shaft with a stiff (S) flex and a club head and adjustment members in accordance with aspects of the invention. The fourth golf club 458 has a shaft with an extra stiff (X) flex and a club head and adjustment members in accordance with aspects of the invention.

Each of the club heads illustrated in FIG. 42B may include an adjustment member that allows the golf clubs to be adjusted from the base loft angle to the remaining loft angles desired (e.g., from 10.5 degrees to 8.5 degrees, 9.5 degrees, 11.5 degrees or 12.5 degrees) while other club or club head parameters remain substantially constant within a specified range. Additionally, each of the club heads may include a second adjustment member that allows the golf clubs to be adjusted from the base face angle to the remaining face angles desired (e.g., from neutral face angle to a closed face angle or an open face angle). Therein, in accordance with aspects of this invention, the retail display 450 as illustrated in FIG. 42B, and utilizing the golf club head and adjustment members as described in this invention, could take the place of the prior art retail display 400 as illustrated in FIG. 42A. By utilizing aspects of this invention, FIG. 42B includes a retail display 450 with 54 less golf clubs than the prior art model retail display as illustrated in FIG. 42A.

Figure 43:
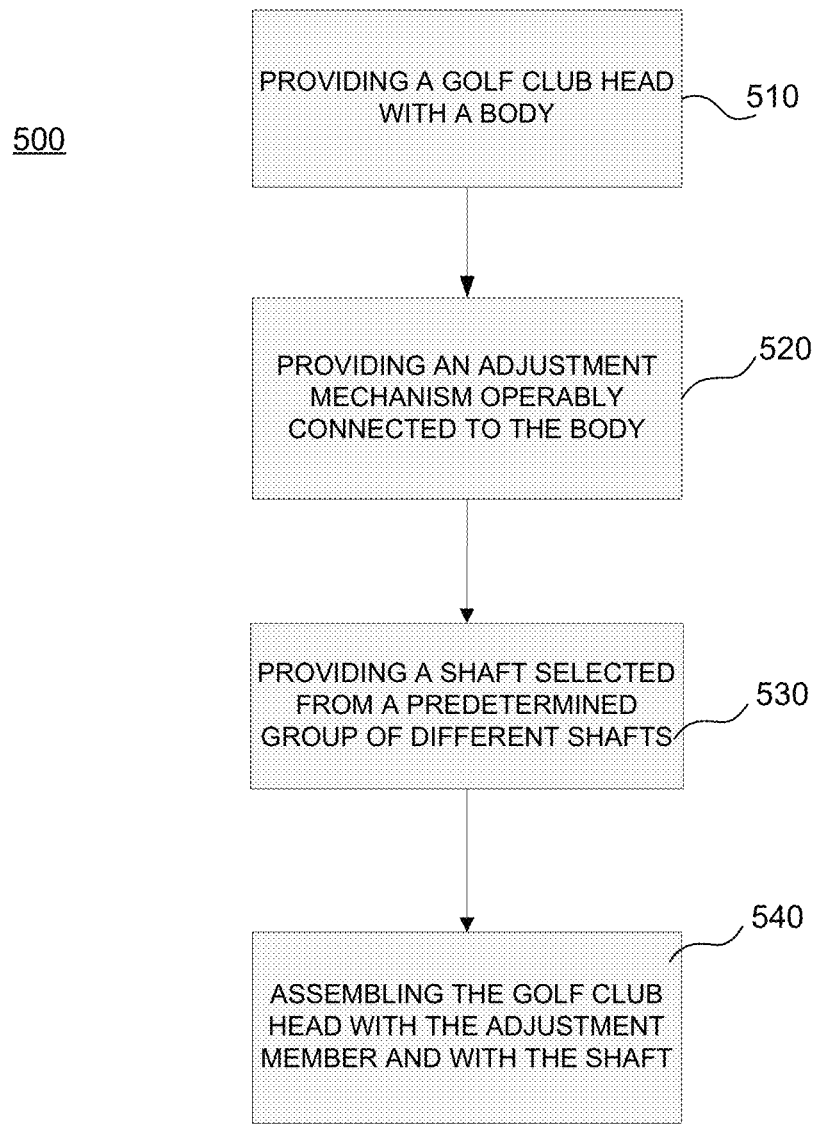
FIG. 43 illustrates a flowchart for an example method according to this invention.

FIG. 43 shows a flow chart 500 for a method of providing an inventory selection to a retail seller of golf clubs in accordance with an aspect of the invention. As illustrated in FIG. 43, the method may include one or more of the following steps: 1) providing a golf club head with a body 510; 2) providing an adjustment member that is configured to be operably connected to the body 520; 3) providing a shaft selected from a predetermined group of different shafts 530; and 4) assembling the golf club head with the adjustment member and with the shaft 540 to form a golf club. The adjustment member may allow a user to change a first parameter independently of the other parameters or characteristics. Similarly, the golf club head may incorporate design aspects that ensure there is substantially no change to certain club or club head performance variables, parameters, or characteristics, and/or specified change of other performance variables, parameters, or characteristics.

In another aspect of the invention, the method as illustrated in FIG. 43 for providing an inventory selection to a retail seller of golf clubs may also include providing a second adjustment member operably connected to the body. The second adjustment member may allow a user to change a second parameter independently of the other parameters or characteristics. Similarly, the golf club head may incorporate design aspects that ensure there is substantially no change to certain club or club head performance variables, parameters, or characteristics, and/or specified change of other performance variables, parameters, or characteristics. It is understood that the second adjustment member may be incorporated with or otherwise part of the first adjustment member wherein the adjustment member is capable of independent adjusting the first parameter and the second parameter.

In another aspect of the invention, a manufacturer may provide a golf club retailer with three golf club types, wherein there is one golf club head for each golf club type. The golf club heads may include a driver head, a fairway wood head, and a hybrid head. Additionally, the manufacturer of the golf club heads may provide each of the golf club heads may include an adjustment member, wherein the adjustment member may allow a user to change a parameter independently of the other parameters or characteristics, while ensuring there is substantially no change to certain club or club head performance variables, parameters, or characteristics, and/or specified change of other performance variables, parameters, or characteristics. Additionally, the manufacturer may offer a predetermined number of shafts and/or shaft flexes that may include but are not limited to: a shaft flex 420 of senior (A) flex, regular (R) flex, stiff (S) flex, or extra stiff (X) flex.

In another aspect of the invention, a retailer may provide for sale to a user three golf club types, wherein there is one golf club head for each golf club type. The golf club heads may include a driver head, a fairway wood head, and a hybrid head. Additionally, the retailer may provide each of the golf club heads with an adjustment member, wherein the adjustment member may allow a user to change a parameter independently of the other parameters or characteristics, while ensuring there is substantially no change to certain club or club head performance variables, parameters, or characteristics, and/or specified change of other performance variables, parameters, or characteristics. Additionally, the retailer may offer a pre-determined number of shafts and/or shaft flexes that may include but are not limited to: a shaft flex 420 of senior (A) flex, regular (R) flex, stiff (S) flex, or extra stiff (X) flex.

Figure 44:
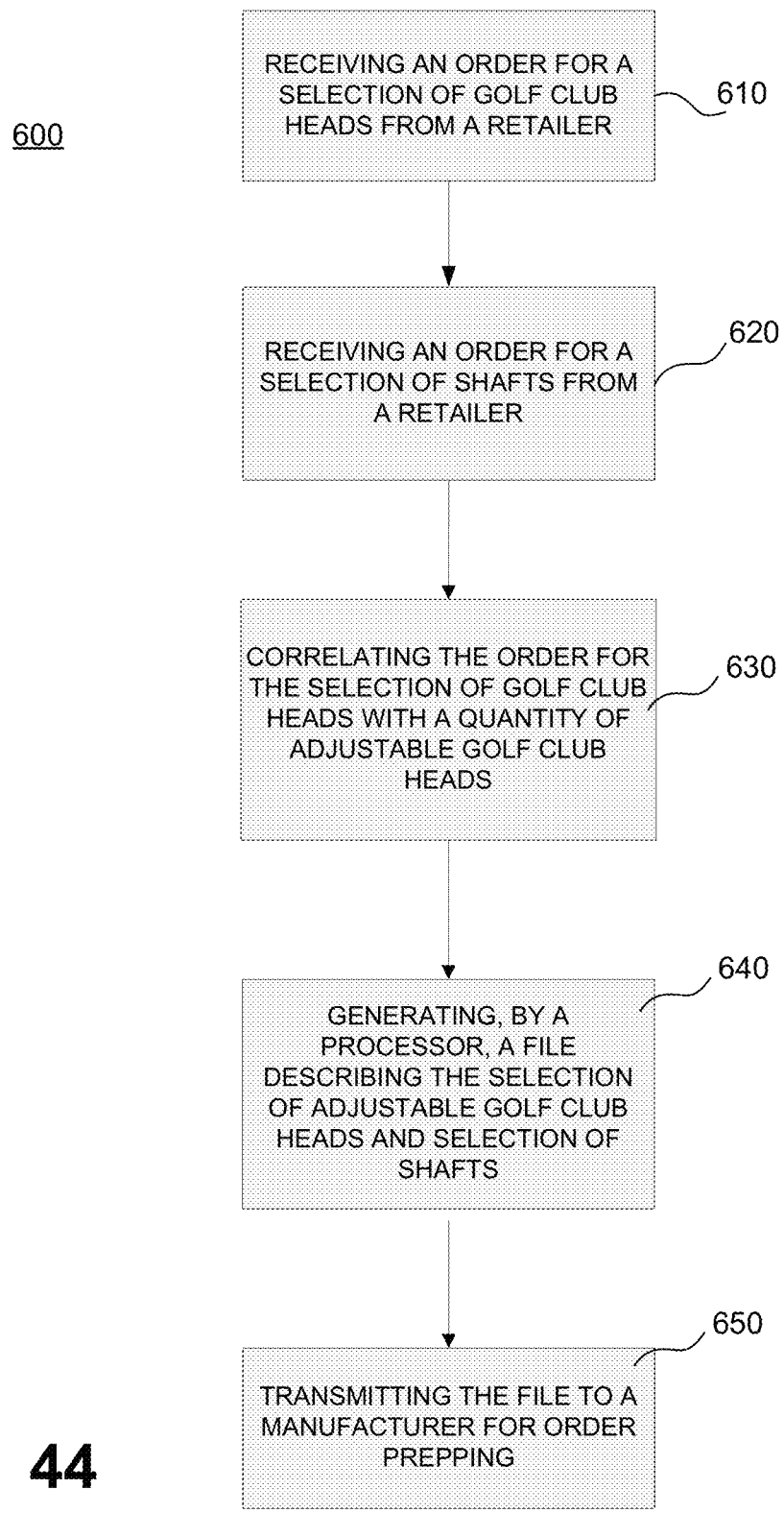
FIG. 44 illustrates a flowchart for another example method according to this invention.

FIG. 44 illustrates another flow chart 600 for a method of providing golf clubs to a seller of golf clubs, such as a retail seller, and processing an order for such golf clubs in accordance with an aspect of the invention. As illustrated in FIG. 44, the method may generally include one or more of the following steps: 1) receiving an order for a selection of golf club heads 610; 2) receiving an order for a selection of shafts 620; 3) correlating the order for the selection of golf club heads with a quantity of reconfigurable/adjustable golf club heads 630; 4) generating, at a processor, a file describing the selection of reconfigurable/adjustable golf club heads and shafts 640; and 5) transmitting the file to a manufacturer for further order processing and fulfillment 650.

Regarding the step of ordering golf club heads, a retail seller, for example, may send an order for a selection of golf club heads to a manufacturer. The order typically specifies pluralities of golf club heads of different configurations. In one exemplary embodiment, driver-type golf club heads having different loft angles are specified. The order specifies a quantity of drivers having an 8.5 degree loft angle, a quantity of drivers having a 9.5 degree loft angle, a quantity of drivers having a 10.5 degree loft angle, a quantity of drivers having an 11.5 degree loft angle, and a quantity of drivers having a 12.5 degree loft angle. It is understood that more or less loft angle configurations could be specified in the order. Regarding the step of ordering shafts, the order may specify shafts that include senior (A) flex shafts, regular (R) flex shafts, stiff (S) flex shafts, or extra stiff (X) flex shafts.

The order specifying the club heads is correlated with respect to the adjustable golf club head as described herein. A total quantity is determined from the individual quantities of the various lofted club heads ordered. The order is then further processed by specifying a number of adjustable golf club heads that corresponds to the total quantity determined. An identical number of adjustment members are also specified and it is understood that the adjustment members may be considered a part of the golf club head or a separate item of the order. A file is generated at a processor describing the selections of the order wherein the total quantity of adjustable golf club heads having adjustment members and shafts are specified. The file is transmitted to the manufacturer for further order processing and fulfillment of the order.

Thus, the seller may order a selection of golf clubs specifying individual lofted golf club heads. Instead of the order being filled with the individual lofted golf club heads specified, the order is filled with a quantity of adjustable golf club heads and adjustment members. The individual lofted golf club heads may each have a unique SKU, while the adjustable golf club head is assigned a single, universal SKU. Because of the adjustability and structures of the golf club heads, each desired quantity of lofted golf club heads is met by setting the adjustment member accordingly. It is understood that the methods described herein are applicable to other types of club heads including fairway woods, hybrids and irons. Thus, orders for specific configurations of club heads, e.g., a 3-wood, 5-wood or hybrids, can be ordered and the order fulfilled with adjustable golf club heads as described herein. It is further understood that the order may initially specify an overall total quantity of adjustable golf club heads with the understanding that the club heads can be adjusted accordingly for specific sales. Orders may also specify quantities of golf club heads specifying other parameters such as a plurality of different face angles. The adjustable golf club head could also be used to fulfill such order consistent with the description above and structures provided herein.

The method as illustrated in FIG. 44 may also include one or more manufacturers of the components or parts of the golf club head shipping the components or parts to an assembly location. Furthermore, the method illustrated in FIG. 44 may also include the assembly location then shipping the finished adjustable club heads to the retail component for further sales and distribution.

In the previous description of the various embodiments, reference is made to the accompanying drawings, systems, processors, and computers, which form a part hereof, and in which is shown by way of illustration, various embodiments of the disclosure that may be practiced. It is to be understood that other embodiments may be utilized.

Figure 45A:
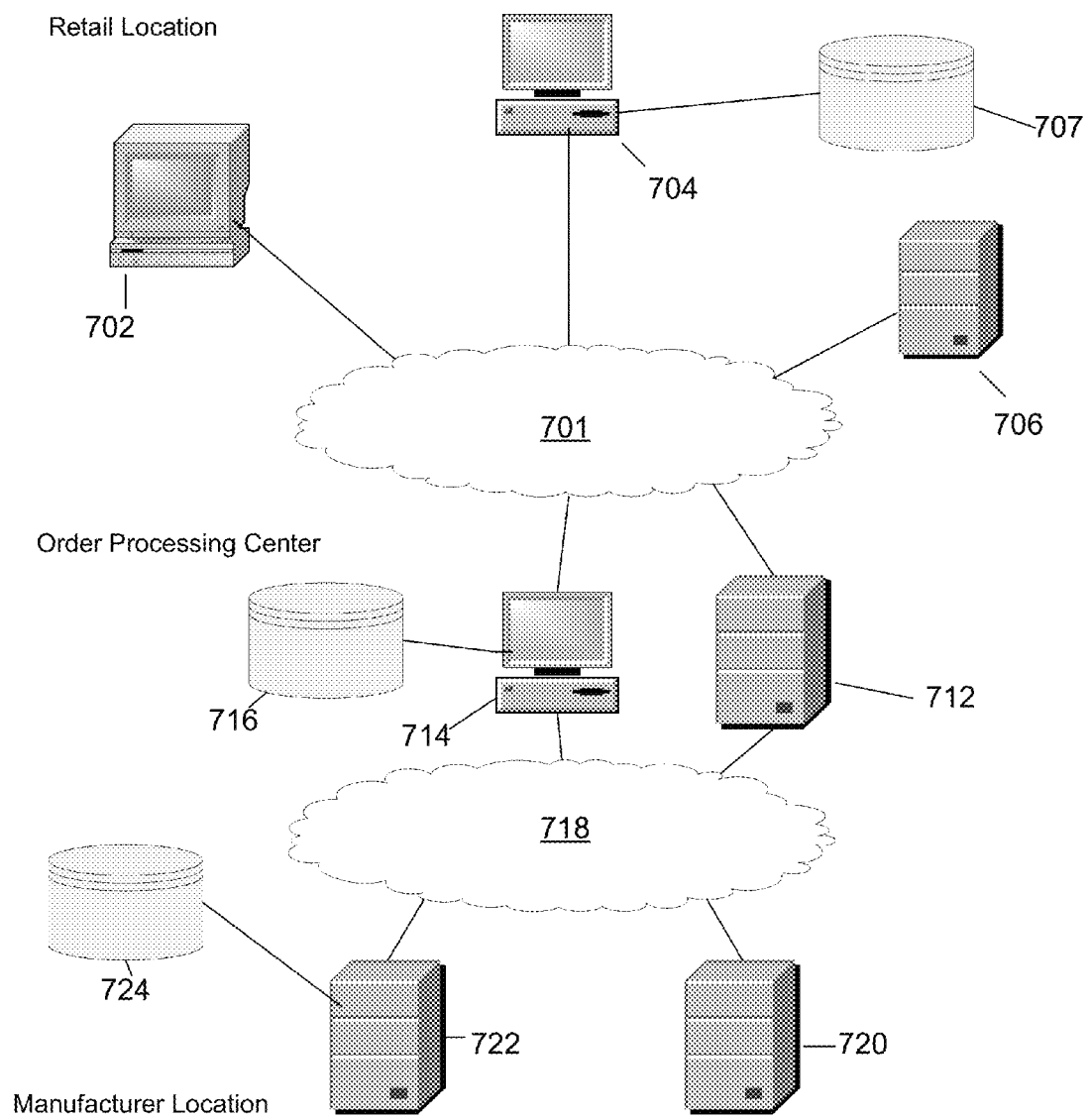
FIGS. 45A and 45B illustrate example network architecture and components according to this invention.

FIG. 45A illustrates one example of a network architecture that may be used to implement one or more illustrative aspects of the disclosure for the various methods described above. Various network nodes 702, 704, and 706 may be interconnected via a wide area network (WAN) 701, such as the Internet. In addition, various databases may be connected to each of the nodes such as database 707 operatively connected to node 704. Other networks may also or alternatively be used, including private intranets, corporate networks, LANs, wireless networks, cellular networks, personal networks (PAN), and the like. Network 701 is for illustration purposes and may be replaced with fewer or additional computer networks. A local area network (LAN) may have one or more of any known LAN topologies and may use one or more of a variety of different protocols, such as Ethernet. Network nodes may also be devices that may be connected to one or more of the networks via twisted pair wires, coaxial cable, fiber optics, radio waves or other communication media.

The term "network" as used herein and depicted in the drawings refers not only to systems in which remote storage devices are coupled together via one or more communication paths, but also to stand-alone devices that may be coupled, from time to time, to such systems that have storage capability. Consequently, the term "network" includes not only a "physical network" but also a "content network," which is comprised of the data—attributable to a single entity—which resides across all physical networks.

Device or components which may be attached to nodes 702, 704 and 706 include computers, servers, databases, cellular telephones, personal digital assistants, and user computers. Cellular telephones and personal digital assistants may be connected to WAN 701 via a cellular network (not shown). Those skilled in the art will realize that other network-enabled devices, such as a mobile terminal, personal video recorder, portable or fixed television, personal computer, digital camera, digital camcorder, portable audio device, portable or fixed analog or digital radio, or combinations thereof may also be connected to WAN 701 and utilized with various aspects of the disclosure.

Nodes 702, 704, and 706 may be nodes found at a retail location such as a sporting goods store. The various devices connected to nodes 702, 704, and 706 may allow for order entry by employees or customers of the retail location. In addition, nodes 702, 704, and 706 may allow store employees to order additional inventory or merchandise from manufacturers.

Nodes 712, 714, and 716 may represent nodes of an order processing center or location. The ordering processing center may receive orders from the numerous retails locations and process such orders in bulk for various retail chains or stores. Device or components which may be attached to nodes 712, 714, and 716 may include computers, servers, or databases. These devices may combine orders for similar merchandise together and communicate with various manufactures via network 718 for the delivery of the merchandise. Additionally, custom products may be processed at the order processing center and forwarded directly to a particular manufacturer for order fulfillment. FIG. 45A illustrates one manufacturer location but those skilled in the art will realize that numerous manufacturer locations may be connected to the order processing center via network 718. As illustrated in FIG. 45A, each manufacturer location may include numerous nodes such as nodes 720, 722, and 724 having various computing devices attached including computers, servers, and databases.

Figure 45B:
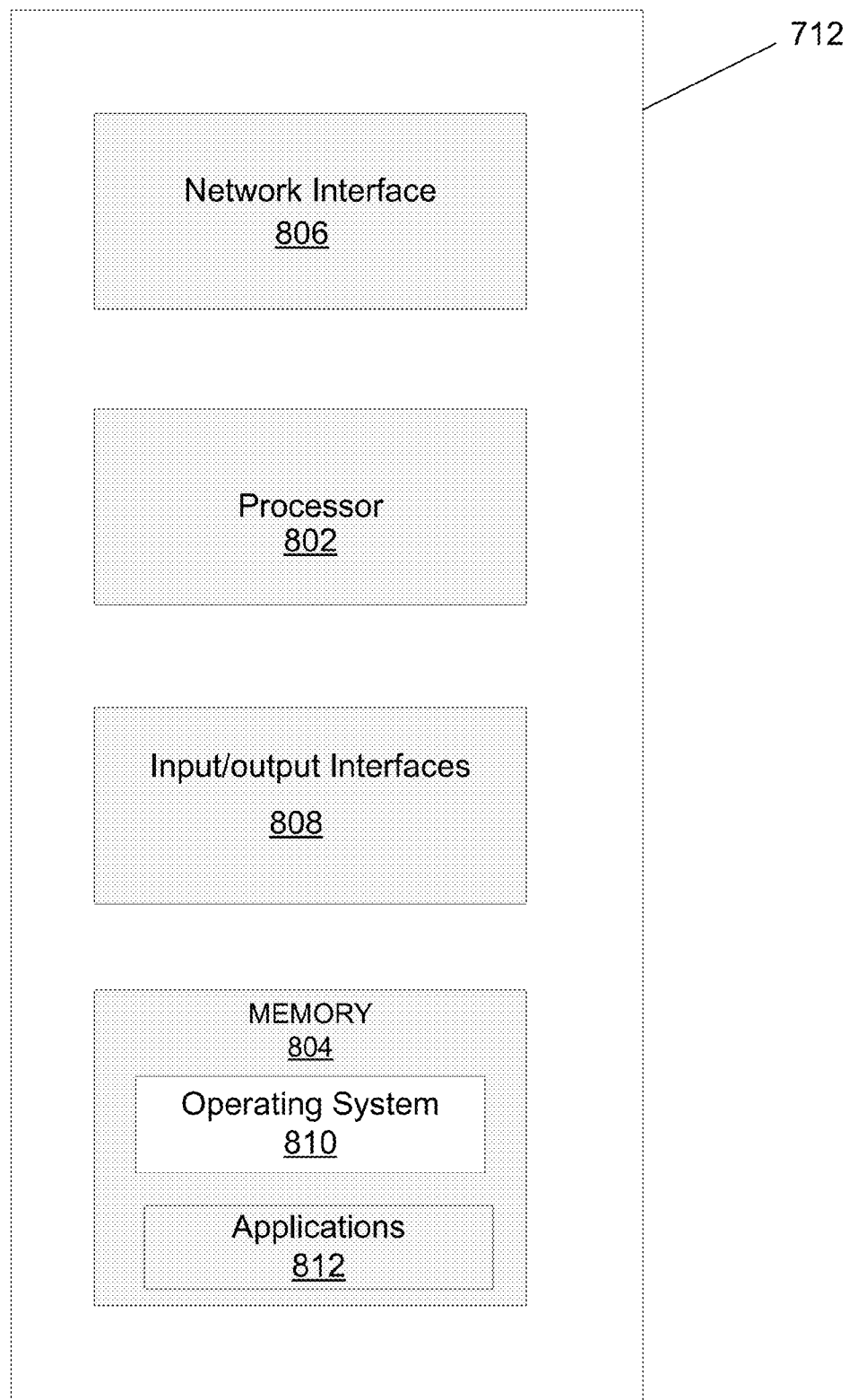

FIG. 45B is illustrative of various components that may be found in the computers, servers and/or databases of the devices connected to the retail locations nodes, order processing center nodes and/or manufacturer location nodes. For example, a server connected to order process center node 712 may include a processor 802 for controlling overall operation of the order processing server. The order processing server may further include memory 804, a network interface 806, and input/output interfaces 808 (e.g., keyboard, mouse, display, printer, etc.). Input/output interfaces 808 may include a variety of interface units and drives for reading, writing, displaying, and/or printing data or files. Memory 804 may further include operating system software 810 for controlling overall operation of the order processing server and other application software 812 providing secondary support, and/or other functionality which may or may not be used in conjunction with aspects of the present disclosure.

One or more aspects of the disclosure may be embodied in computer-usable or readable data and/or computer-executable instructions, such as in one or more program modules, executed by one or more computers or other devices as described herein. Generally, program modules include routines, programs, objects, components, data structures, etc. that perform particular tasks or implement particular abstract data types when executed by a processor in a computer or other device. The modules may be written in a source code programming language that is subsequently compiled for execution, or may be written in a scripting language such as (but not limited to) HTML or XML. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various embodiments.

The steps described previously may be implemented by one or more of the components in FIGS. 45A and 45B and/or other components, including other computing devices.

Further aspects of the invention relate to marketing, selling, manufacturing, or utilizing one or more components of the golf club as a kit. The kit, including at least an adjustment member, may be associated with instructions for constructing a golf club by choosing between one or more heads, and one or more shafts, and one or more adjustment members. Furthermore, the shaft, club head, and/or the adjustment members may be constructed as to allow adjustment of the angle or position of the shaft with respect to the club head (e.g., with respect to its ball striking face), thereby allowing for the adjustment of a loft angle (or any other parameter) while other specified parameters remain substantially constant over a specified range of 3 or more lofts. The loft angle may be adjusted by rotating, translating, or replacing golf club components. The loft angle may be adjusted by rotating golf club components about an axis that is oriented at least 45 degrees from a horizontal plane with the club head or club oriented in a reference position. Instructions for performing the adjustments and/or information detailing the characteristics of the club in relation to the adjustments may also be provided as part of one or more kits in accordance with embodiments of the invention. The selection of individual components available for each kit may enable an end user to select one shaft and one model of club head from a selection of "n" number of shafts and "x" number of models of club heads whereby the user would have at least 3*n*x different club configurations available, where the only difference between each configuration is loft angle, shaft type, and head type, while all other club and/or club head variables remain substantially unchanged in accordance with the principles taught above.

Benefits

Embodiments of this invention present many benefits to the golf industry and the different participants in the golf industry. Golf manufacturers as well as golf distributors and retail sellers of golf equipment will realize the many benefits described herein. In addition, golfers will experience benefits not previously provided by current golf equipment, systems and methods. It is understood that certain benefits will be experienced by participants across the golf industry while certain benefits may be specific to the certain participants in the golf industry.

First, manufacturers, distributors, and/or retailers of golf clubs will see enhanced inventory management and control with embodiments of this invention. As discussed above, embodiments of the invention describe a golf club wherein the golf club has an adjustable reference parameter, such as loft angle, that can be adjusted over an adjustment range without changing any other specified parameters of the golf club. Because of such properties of the golf club head, for example, manufacturers, distributors, and/or retailers may maintain an inventory of just one golf club head of the present invention capable of adjusting the loft angle as compared with needing multiple (as many as 5 or more) conventional golf club heads with individually different, designed-in loft angles. This reduction in inventory will drastically improve and enhance the inventory management and control systems with less inventory on hand, reduced storage space requirements, and a significant reduction in overhead costs associated with inventory management. Because only one golf club head may be required and capable of replacing multiple conventional golf club heads, the inventory management and control systems will be enhanced and improved for golf club manufacturers, distributors, and retailers.

Tied to the benefit of enhancing inventory management and control system, embodiments of this invention will also help to reduce the number of stock-keeping units, or SKUs. By having the need for only one golf club head with an adjustable loft angle, wherein no other characteristics or parameters of the golf club head are changed, the number of SKUs for golf club heads will be greatly decreased. For example, when using conventional golf club heads, there is a need for golf club heads with multiple loft angles, such as 8.5 degree loft, 9.5 degree loft, 10.5 degree loft, 11.5 degree loft, and 12.5 degree loft. Each club head with a different designed-in loft angle value will typically be assigned a different SKU. Conventional golf club head manufacturers, distributors, and/or retailers may need five different golf club heads for loft angle, while golf club head manufacturers, distributors, and/or retailers utilizing the embodiments of this invention may only need one golf club head with an adjustable loft angle. Utilizing a golf club head with an adjustable loft angle as is described in embodiments of the current invention may reduce the number of SKUs by approximately or at least five times. Reducing the number of SKUs due to the reduction of individual, distinct golf club heads allows for more efficient management of inventory.

Additionally, golf club manufacturers utilizing embodiments of this invention will realize the benefit of cost savings on club head tooling. With embodiments of this invention, golf club manufacturers no longer need separate tools for each lofted club, for example, an 8.5 degree club head tool, 9.5 degree club head tool, 10.5 degree club head etc. Utilizing a golf club head according to embodiments of this invention, one tool is only required for a base reference club head. For example, the golf club manufacturer may only need one tool for a 10.5 degree club head such as if the 10.5 degree loft was selected as a base or reference loft club. Using the golf club head having the reference loft and the adjustment member provides the other necessary lofted clubs for a full club selection of the various configurations while eliminating the need for tools for such other lofted clubs.

Embodiments of the present invention further enhance several aspects of the overall manufacturer research and design process. For example, golf club designers have a reduced number of individual golf club heads to separately design. For example, a single adjustable golf club head can be designed having a reference loft. Similarly for other types of clubs, a single adjustable golf club head fairway wood can be designed having a reference loft as well as a single adjustable golf club head hybrid can be designed having a reference loft. Design efforts can be more focused on the reduced number of golf club heads, e.g., a single driver, a single fairway wood and a single hybrid. This also requires a reduced amount of computer-aided design time from designers, which provides cost savings. As discussed, this also requires a reduced number of tools wherein machining time is reduced providing further cost savings.

As discussed, embodiments of the present invention provide for a single adjustable golf club head to replace a plurality of golf club heads having individually designed-in configurations, such as a plurality of club heads having different designed-in loft angles. Such features provides for various other benefits. For example, golf club manufacturers can more easily offer a full selection of left-handed golf clubs. Because of reduced demand for left-handed golf clubs, selection is typically limited. With the present invention, a full selection of left-handed golf clubs, including drivers fairway woods and hybrids, all having the various configurations, can now be offered. As discussed, the principles of the present invention also apply to golf club irons. Designing and providing full sets of golf club irons can now be completed with a reduced number of golf club iron heads. In addition, designing full golf club sets, e.g. woods and irons, becomes easier as a reduced number of individual head designs is required.

These features further lead to greater efficiencies in the sales process between golf club manufacturers and sellers of golf club equipment. Orders no longer require specific quantities of all the different golf club heads having the various individual designed-in configurations such as various different loft angles. Instead, a single adjustable golf club head at a certain quantity can be ordered that will cover all of the various different configurations. This also allows the golf club manufacturer to better forecast orders from customers.

Golf club manufacturers also provide golf club samples and related equipment for various types of golf club fittings for golfers. Mobile equipment vehicles often are used to fit tour professionals with custom-fitted golf clubs. Such vehicles can now be equipped with reduced amounts of equipment while providing the same amount of selection. In addition, "demo golf bags" having golf club samples are often provided to retailers for use in selling product to consumers. The demo golf bags can also be provided with a reduced amount of sample clubs while not sacrificing club selection.

Golf distributors and/or retailers of golf equipment also experience many benefits from the various embodiments of the present invention. As discussed with respect to golf manufacturers, retailers can also manage inventory more efficiently because multiple golf club heads are replaced with a reduced number of golf club heads capable of being adjusted as described herein. Retailers also experience a reduction of SKUs in their respective systems. This can also lead to less errors in shipping the correct models, types, configurations and overall quantities of the golf clubs. Furthermore, the ordering process becomes easier as there are lesser numbers of individual, distinct club heads that need to be part of an order and deciding the quantity for each club head be ordered becomes easier. A larger quantity of a single club head can be ordered as the club head can be adjusted to meet the different configurations for the various different types of clubs such as drivers, fairway woods, hybrids, irons and putters. This also leads to the benefit that the retailer has a reduced chance of running out of inventory for various club configurations as the single adjustable club head can fulfill the various configurations. As a result, there is a reduced chance of having significant amounts of inventory left over after a main sales season. Such leftover inventory is typically sold as clearance items at significantly reduced prices.

Retailers may also offer custom golf club fitting services. More flexibility is achieved by fitters using the various embodiments of the present invention. Because different types of club heads all can be adjustable, fittings can be more finely tuned to the particular golfer. Gap fitting is one particular area that can be improved using the principles of the present invention. If a golfer is seeking to replace low iron clubs (e.g., 1-4 irons), an adjustable fairway wood or adjustable hybrid as described herein can be selected based on how far the golfer hits the particular club. The golfer can hit the type of club at various lofts to fine tune or dial-in the particular distance desired.

Retailers also have various product displays at their locations for customers to peruse in making purchasing decisions. As described herein, because multiple golf club heads are capable of being replaced by a single golf club head, product displays are less cluttered and more visually appealing to consumers. Such displays require a smaller footprint allowing retailers to use their typically limited floor space for additional products from manufacturers.

Additionally, users of the golf club and golf club head in accordance with embodiments of this invention may find the added benefit of enhanced club head adjustment. For example, with a conventional golf club and golf club head, a user may purchase a 10.5 degree loft club with no other possibilities for changing the loft of the golf club, except for purchasing another golf club with a different loft angle. With a golf club with an adjustable loft angle, the user may be able to change the loft of the golf club after the user purchases the club head, allowing the user the ability to have enhanced club head adjustment. The ability to further independently adjust a second parameter such as face angle or lie angle further enhances user experience and inventory management. Such systems provide instant gratification to golfers as adjustments are easily made. Golfers also benefit from golf club fittings that can be more finely tuned for each individual golfer. The performance of the golf club head in any setting or configuration will not be compromised or negatively affected as a result of the above established consistency in performance or specified parameters.

Further, embodiments of the golf club system of the present invention provide a more focused and easier environment for golfers in making a golf club selection. A single base golf club head and adjustment member are initially selected while then selecting a particular shaft and grip that best suits the game of the particular golfer. Golfers need not experience any hesitation in selecting a particular lofted club since adjustments can easily be made without affecting other performance parameters of the golf club head.

CONCLUSION

While the invention has been described in detail in terms of specific examples including presently preferred modes of carrying out the invention, those skilled in the art will appreciate that there are numerous variations and permutations of the above described systems and methods. Thus, the spirit and scope of the invention should be construed broadly as set forth in the appended claims.

We claim:

1. A method of assembling a golf club comprising the steps of:
providing a golf club head including a striking face rigidly connected to the golf club head;
providing an adjustment member, wherein the golf club head and adjustment member are structured as a shaft-club head connection system such that the adjustment member adjusts a first parameter associated with the club head among a plurality of positions and wherein in response to the adjustment of the first parameter, a second parameter associated with the golf club head remains constant within a predetermined tolerance, wherein the first parameter is a loft angle and adjusting the loft angle is effectively independent of the adjustment of a face angle, and adjusting the face angle is effectively independent of the adjustment of the loft angle;
providing a shaft and engaging the shaft with the golf club head; and
providing a grip and assembling the grip to the shaft.

2. The method of claim 1, wherein the loft angle is adjusted among a plurality of positions in 1 degree increments.

3. The method of claim 2, wherein the loft angle is adjustable from 8.5 degrees to 12.5 degrees.

4. The method of claim 1, wherein the second parameter is one of lie angle, face center location, center of gravity location, moment of inertia, bulge curvature, roll curvature and sole contact location.

5. The method of claim 1, wherein the golf club head and adjustment member are structured such that the adjustment member adjusts a third parameter associated with the club head among a plurality of positions and wherein in response to the adjustment of the third parameter, the second parameter associated with the golf club head remains constant within a predetermined tolerance.

6. The method of claim 5, further comprising, via the adjustment member, adjusting the first parameter independently of the third parameter.

7. The method of claim 6, wherein the third parameter is a lie angle.

8. The method of claim 1, wherein the shaft is provided from one of a senior flex shaft, a regular flex shaft, a stiff flex shaft and an extra stiff flex shaft.

9. The method of claim 1, wherein in response to assembling the golf club head, the step of replacing in a golf club inventory, each golf club having a designed-in first parameter value corresponding to one of the plurality of positions, with the assembled golf club head.

10. A method of assembling a golf club comprising the steps of:
   providing a golf club head including a striking face rigidly connected to the golf club head, the golf club head having a base loft angle;
   providing an adjustment member as a shaft-club head connection system;
   engaging the adjustment member with the golf club head, wherein the adjustment member is capable of adjusting the golf club head to a plurality of loft angles different from the base loft angle to form a reconfigurable golf club head, wherein adjusting the loft angle is effectively independent of the adjustment of a face angle, and adjusting the face angle is effectively independent of the adjustment of the loft angle;
   providing a shaft and engaging the shaft with the golf club head; and
   providing a grip and assembling the grip to the shaft,
   wherein the golf club is capable of replacing a plurality of golf club heads each having respective designed in loft angle corresponding to one of the plurality of loft angles.

11. The method of claim 10, wherein the golf club head and adjustment member are structured such that in response to the adjustment of the loft angle, a second parameter associated with the golf club head remains constant within a predetermined tolerance.

12. A method of designing a golf club head, the method comprising the steps of:
   selecting a base loft angle of the golf club head, wherein the golf club head includes a striking face rigidly connected to the golf club head;
   providing an adjustment member operably engaged with the golf club head and a shaft, wherein the golf club head is adjustable to a loft angle different from the base loft angle, wherein adjusting the loft angle is effectively independent of the adjustment of a face angle, and adjusting the face angle is effectively independent of the adjustment of the loft angle; and
   selecting a first parameter associated with the golf club head and structuring the golf club head such that in response to adjusting the loft angle from the base loft angle, the first parameter remains constant within a predetermined tolerance.

13. The method of claim 12, wherein the loft angle is adjusted among a plurality of positions in 1 degree increments.

14. The method of claim 13, wherein the loft angle is adjustable from 8.5 degrees to 12.5 degrees.

15. The method of claim 12, wherein the first parameter is one of lie angle, face center location, center of gravity location, moment of inertia, bulge curvature, roll curvature and sole contact location.

16. The method of claim 15, further comprising, via the adjustment member, adjusting the second parameter independently of the loft angle.

17. The method of claim 16, wherein the second parameter is a lie angle.

18. The method of claim 12, wherein the golf club head and adjustment member are structured such that the adjustment member adjusts a second parameter associated with the club head among a plurality of positions and wherein in response to the adjustment of the second parameter, the first parameter associated with the golf club head remains constant within a predetermined tolerance.

* * * * *